(12) United States Patent
Suzuki et al.

(10) Patent No.: US 9,762,182 B2
(45) Date of Patent: Sep. 12, 2017

(54) MAGNETORESISTIVE EFFECT OSCILLATOR

(71) Applicant: TDK CORPORATION, Tokyo (JP)

(72) Inventors: Tsuyoshi Suzuki, Tokyo (JP); Eiji Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/098,617

(22) Filed: Apr. 14, 2016

(65) Prior Publication Data

US 2016/0322937 A1 Nov. 3, 2016

(30) Foreign Application Priority Data

Apr. 15, 2015 (JP) .................. 2015-083004

(51) Int. Cl.
*H03B 15/00* (2006.01)
*H03B 5/12* (2006.01)
(Continued)

(52) U.S. Cl.
CPC ........... *H03B 15/006* (2013.01); *H01F 10/26* (2013.01); *H01F 10/324* (2013.01);
(Continued)

(58) Field of Classification Search
CPC ... H01F 10/26; H01F 10/3286; H03B 15/006; H03B 5/1206; H03B 15/00
(Continued)

(56) References Cited

U.S. PATENT DOCUMENTS

| | | | |
|---|---|---|---|
| 8,063,709 B2 | 11/2011 | Firastrau et al. | |
| 2010/0039181 A1 | 2/2010 | Firastrau et al. | |
| 2015/0109063 A1* | 4/2015 | Suzuki ............... | H03B 15/006 |
| | | | 331/107 R |

FOREIGN PATENT DOCUMENTS

| | | |
|---|---|---|
| JP | 2010-519760 A | 6/2010 |
| WO | 2008/101545 A1 | 8/2008 |

OTHER PUBLICATIONS

Franchin et al., "Current-Driven Dynamics of Domain Walls Constrained in Ferromagnetic Nanopillars," Physical Review B, 2008, vol. 78, pp. 1-8.

* cited by examiner

*Primary Examiner* — Arnold Kinkead
(74) *Attorney, Agent, or Firm* — Oliff PLC

(57) ABSTRACT

A magnetoresistive effect oscillator executes a first step of applying a current, which has a first current density larger than a critical current density $J_O$ for oscillation, to a magnetoresistive effect element for a time $T_P$, and then executes a second step of applying a current, which has a second current density $J_S$ smaller than the first current density and not smaller than the critical current density $J_O$ for oscillation, to the magnetoresistive effect element. The following formulae (1), (2) and (3), or the following formulae (1) and (4) are satisfied on an assumption that an average value of the first current density during the time $T_P$ in the first step is $J_P$, a critical current density for magnetization reversal of the magnetoresistive effect element is $J_R$, and a magnetization reversal time of the magnetoresistive effect element is $T_R$:

$$\frac{0.1 \times T_R(J_R - J_O)}{J_P - J_S} < T_P < 0.9 \times T_R \frac{J_R - J_O}{J_S - J_O} \quad (1)$$

$$T_P < \frac{T_R(J_R - J_O)}{J_P - J_O} \quad (2)$$

$$J_R \leq J_P \quad (3)$$

$$J_P < J_R. \quad (4)$$

5 Claims, 46 Drawing Sheets

(51) Int. Cl.
 *H01F 10/26* (2006.01)
 *H01F 10/32* (2006.01)

(52) U.S. Cl.
 CPC ....... *H01F 10/3286* (2013.01); *H03B 5/1206* (2013.01); *H03B 15/00* (2013.01)

(58) Field of Classification Search
 USPC .................................................. 331/154, 96
 See application file for complete search history.

MAGNETORESISTIVE EFFECT OSCILLATOR

BACKGROUND OF THE INVENTION

1. Field of the Invention

The present invention relates to a magnetoresistive effect oscillator.

2. Description of the Related Art

A magnetoresistive effect oscillator is an oscillator utilizing precession of magnetization in a magnetic layer of a magnetoresistive effect element, the precession being generated upon application of a current to the magnetoresistive effect element. In such an oscillator, a resistance value of the magnetoresistive effect element is changed at a high frequency due to the precession of magnetization in the magnetic layer of the magnetoresistive effect element, thereby causing the magnetoresistive effect element to oscillate. In recent years, studies on the magnetoresistive effect oscillator have been conducted intensively. Japanese Unexamined Patent Application Publication (Translation of PCT Application) No. 2010-519760 discloses an operation method of operating a magnetoresistive effect oscillator at a low current density not higher than the critical current density for oscillation.

SUMMARY OF THE INVENTION

However, the above proposed operation method has a problem that the oscillation caused in the magnetoresistive effect element takes a time to rise. If the oscillation caused in the magnetoresistive effect element takes a time to rise, a problem arises in that the magnetoresistive effect element cannot be applied to high-speed communications, for example. Furthermore, in the field of, e.g., magnetic recording, application of the magnetoresistive effect oscillator to Microwave Assisted Magnetic Recording is under studies. However, another problem arises in that the magnetic recording cannot be performed at a high speed, if the oscillation caused in the magnetoresistive effect element takes a time to rise.

In view of the above-described situations, an object of the present invention is to provide a magnetoresistive effect oscillator in which oscillation is able to rise in a magnetoresistive effect element at a higher speed.

To achieve the above object, the magnetoresistive effect oscillator according to the present invention includes a magnetoresistive effect element including a first magnetic layer, a second magnetic layer, and a spacer layer sandwiched between the first magnetic layer and the second magnetic layer, and a current applying unit that applies a current to the magnetoresistive effect element, wherein the current applying unit executes a first step of applying a current, which has a first current density larger than a critical current density $J_O$ for oscillation of the magnetoresistive effect element, to the magnetoresistive effect element for a time $T_P$, the current applying unit executes, after the first step, a second step of applying a current, which has a second current density $J_S$ smaller than the first current density and not smaller than the critical current density $J_O$ for oscillation, to the magnetoresistive effect element such that the magnetoresistive effect element oscillates at a predetermined frequency, and the following formulae (1), (2) and (3), or the following formulae (1) and (4) are satisfied on an assumption that an average value of the first current density during the time $T_P$ in the first step is $J_P$, a critical current density for magnetization reversal of the magnetoresistive effect element is $J_R$, and a magnetization reversal time of the magnetoresistive effect element is $T_R$:

$$\frac{0.1 \times T_R (J_R - J_O)}{J_P - J_S} < T_P < 0.9 \times T_R \frac{J_R - J_O}{J_S - J_O} \quad (1)$$

$$T_P < \frac{T_R (J_R - J_O)}{J_P - J_O} \quad (2)$$

$$J_R \leq J_P \quad (3)$$

$$J_P < J_R \quad (4)$$

In the above formulae (1) to (4), $J_P$, $J_R$, and $J_S$ are each a magnitude of the current density (i.e., an absolute value of the current density).

According to the magnetoresistive effect oscillator described above, when the current applying unit applies the current having the current density not smaller than the critical current density $J_O$ for oscillation to the magnetoresistive effect element, spin transfer torque acts on magnetization in the magnetic layer of the magnetoresistive effect element, thus causing precession of the magnetization and oscillation in the magnetoresistive effect element. Regarding the current (also called the "pulse current" hereinafter) having the first current density and applied for the time $T_P$ in the first step, a quantity corresponding to energy of the pulse current in excess of the energy necessary for oscillation at the predetermined frequency is expressed by $T_P(J_P - J_S)$. As a value of the above quantity increases, the oscillation in the magnetoresistive effect element rises at a higher speed. Furthermore, a quantity corresponding to energy necessary for reversal of the magnetization in the magnetic layer of the magnetoresistive effect element is expressed by $T_R(J_R - J_O)$. When $T_P$ is within the range expressed by the formula (1), a rise time can be shortened at a rate not less than a certain level in comparison with the case of omitting the first step and executing only the second step. If $T_P$ is not more than a lower limit, the energy of the pulse current is small, and hence a shortening rate of the rise time is reduced. If $T_P$ is not less than an upper limit, the influence of $T_P$, i.e., the time during which the current having the first current density is applied, is increased, and a time until reaching the oscillation at the predetermined frequency corresponding to the second current density $J_S$ is prolonged. Hence the shortening rate of the rise time is reduced. Moreover, if $T_P$ exceeds an upper limit of $T_P$ expressed by the formula (2) when $J_P$ satisfies the formula (3) indicating that $J_P$ is not smaller than the critical current density $J_R$ for magnetization reversal, the energy of the pulse current exceeds the energy necessary for the reversal of the magnetization in the magnetic layer of the magnetoresistive effect element, and the magnetization reversal of the magnetoresistive effect element occurs. This results in a state where the precession of the magnetization is not generated, or a state where the rise time of the oscillation in the magnetoresistive effect element is prolonged. When the formulae (3) and (2) are satisfied, or when the formula (4) indicating that $J_P$ is smaller than the critical current density $J_R$ for magnetization reversal is satisfied, the magnetization reversal of the magnetoresistive effect element does not occur. Thus, according to the present invention, the rise time of the oscillation in the magnetoresistive effect element can be shortened in comparison with the case of omitting the first step and executing only the second step.

In the magnetoresistive effect oscillator of the present invention, preferably, the following formula (5) is satisfied. According to the magnetoresistive effect oscillator satisfying the formula (5), the rise time of the oscillation in the magnetoresistive effect element can be further shortened in comparison with the case of omitting the first step and executing only the second step.

$$\frac{0.25 \times T_R(J_R - J_O)}{J_P - J_S} < T_P < 0.75 \times T_R \frac{J_R - J_O}{J_S - J_O} \quad (5)$$

In the magnetoresistive effect oscillator of the present invention, preferably, the following formula (6) is satisfied. According to the magnetoresistive effect oscillator satisfying the formula (6), the rise time of the oscillation in the magnetoresistive effect element can be even further shortened in comparison with the case of omitting the first step and executing only the second step.

$$\frac{0.5 \times T_R(J_R - J_O)}{J_P - J_S} < T_P < 0.5 \times T_R \frac{J_R - J_O}{J_S - J_O} \quad (6)$$

In the magnetoresistive effect oscillator of the present invention, preferably, the following formula (7) is satisfied. According to the magnetoresistive effect oscillator satisfying the formula (7), the rise time of the oscillation in the magnetoresistive effect element can be even further shortened in comparison with the case of omitting the first step and executing only the second step.

$$\frac{0.75 \times T_R(J_R - J_O)}{J_P - J_S} < T_P < 0.25 \times T_R \frac{J_R - J_O}{J_S - J_O} \quad (7)$$

In the magnetoresistive effect oscillator of the present invention, preferably, the following formula (8) is satisfied. According to the magnetoresistive effect oscillator satisfying the formula (8), the rise time of the oscillation in the magnetoresistive effect element can be significantly shortened because $T_P$ is within the range expressed by the formula (8).

$$\frac{0.96 \times T_R(J_R - J_O)}{(J_P - 0.96 J_S)} \leq T_P \leq \frac{0.98 \times T_R(J_R - J_O)}{(J_P - 0.98 J_S)} \quad (8)$$

The present invention can provide the magnetoresistive effect oscillator in which the oscillation is able to rise in the magnetoresistive effect element at a higher speed.

DESCRIPTION OF THE PREFERRED EMBODIMENTS

Embodiments for carrying out the present invention will be described below with reference to the drawings. The following description discloses some of embodiments of the present invention by way of example, and the present invention is not limited to the embodiments described below. Insofar as embodiments involve features realizing the technical concept of the present invention, those embodiments also fall within the scope of the present invention. Individual components, combinations of those components, etc. in the following embodiments are merely illustrative, and addition, omission, replacement, and other alterations of the components are allowed within a scope not departing from the gist of the present invention.

First Embodiment

Figure 1:
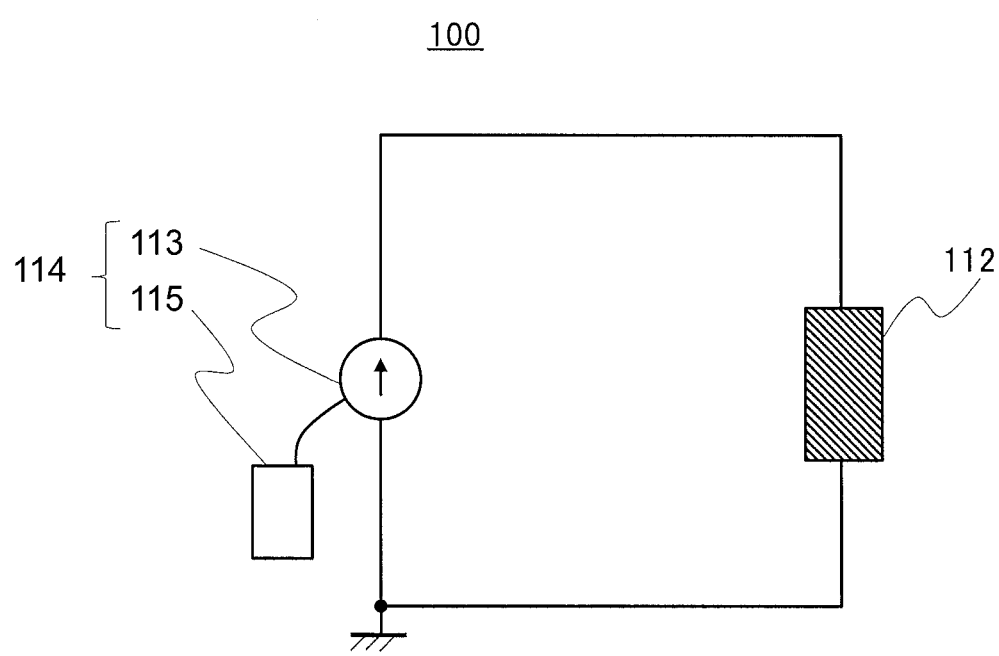
FIG. 1 is a circuit diagram of a magnetoresistive effect oscillator according to each of first and second embodiments.
Figure 2:
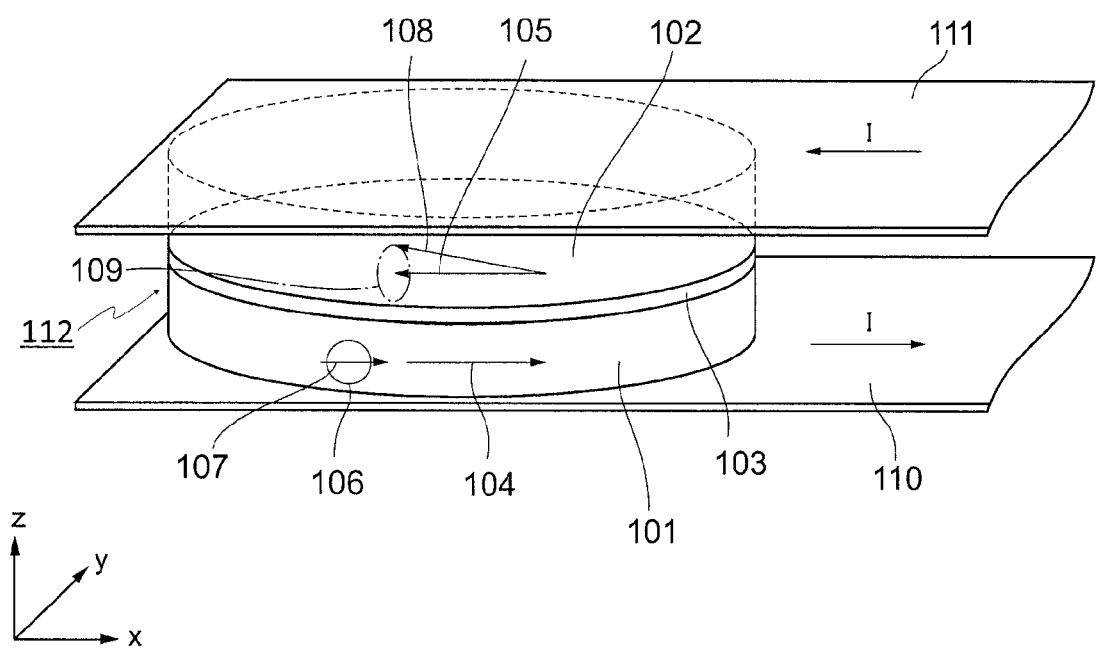
FIG. 2 is a schematic view of a magnetoresistive effect element according to the first embodiment.

FIG. 1 is a circuit diagram of a magnetoresistive effect oscillator 100. The magnetoresistive effect oscillator 100 includes a magnetoresistive effect element 112 and a current applying unit 114 for applying a current to the magnetoresistive effect element 112. The current applying unit 114 includes a current source 113 and a control unit 115. The current source 113 is connected to be able to supply the current to the magnetoresistive effect element 112. The control unit 115 controls the operation of the current source 113. FIG. 2 illustrates an example of configuration of the magnetoresistive effect element 112. The magnetoresistive effect element 112 includes a first magnetic layer 101, a second magnetic layer 102, and a spacer layer 103 arranged between them. The first magnetic layer 101 is electrically connected to a first electrode 110, and the second magnetic layer 102 is electrically connected a second electrode 111, respectively. The current source 113 is connected to the first electrode 110 and the second electrode 111. The first magnetic layer 101 and the second magnetic layer 102 are each an in-plane magnetized film having an easy magnetization axis in a planar direction of the film. A magnetization direction 104 of the first magnetic layer 101 is fixed. Magnetization in the second magnetic layer 102 is oriented in a direction of an effective magnetic field in the second magnetic layer 102 in a state before application of the current to the magnetoresistive effect element 112, and the direction of the effective magnetic field is denoted by an arrow 105. The effective magnetic field is given as the sum of an anisotropic magnetic field, an exchange magnetic field, a demagnetizing field, and an external magnetic field in the second magnetic layer 102. While the magnetization direction of the first magnetic layer 101 and the direction of the effective magnetic field in the second magnetic layer 102 are opposite to each other in FIG. 2, those directions are not limited to the illustrated orientations insofar as they are different from each other.

Each magnetic layer can be made of, e.g., Fe, Co, Ni, an alloy of Ni and Fe, an alloy of Fe and Co, or an alloy of Fe, Co and B.

The magnetoresistive effect element 112 can be formed of, though not being limited to particular one, e.g., a giant magnetoresistive effect (GMR) element, a tunnel magnetoresistive effect (TMR) element, or a Current-Confined-Path giant magnetoresistive effect (CCP-GMR) element in which a plurality of current-confined-paths are present in an insulating layer constituting the spacer layer 103.

In the case of the GMR element, the spacer layer 103 can be made of a nonmagnetic conductive material, such as Cu, Ag, Au or Ru.

In the case of the TMR element, the spacer layer 103 can be made of a nonmagnetic insulating material, such as MgO or $AlO_x$.

In the case of the CCP-GMR element, the spacer layer 103 is constituted by the insulating layer and the plurality of current-confined-paths. The insulating layer is made of, e.g., $AlO_x$ or MgO, and the current-confined-paths can be each made of a nonmagnetic conductive material, such as Cu, Ag, Au or Ru.

The magnetoresistive effect element 112 may include a first intermediate layer. For example, a nonmagnetic metal layer, a magnetic layer, or an insulating layer may be interposed as the first intermediate layer between the first magnetic layer 101 and the spacer layer 103 or between the spacer layer 103 and the second magnetic layer 102.

Furthermore, to fix the magnetization direction 104 of the first magnetic layer 101, the magnetoresistive effect element 112 may additionally include an antiferromagnetic layer in contact with the first magnetic layer 101, or may additionally include a second intermediate layer, a third magnetic layer, an antiferromagnetic layer, etc. in contact with the first magnetic layer 101. Alternatively, the magnetization direction 104 may be fixed by utilizing, e.g., magnetic anisotropy attributable to the crystal structure or the shape of the first magnetic layer 101, for example.

The antiferromagnetic layer can be made of, e.g., FeO, CoO, NiO, $CuFeS_2$, IrMn, FeMn, PtMn, Cr, or Mn.

Moreover, a cap layer, a seed layer, or a buffer layer, for example, may be included between each electrode and each magnetic layer. Those layers can be made of, e.g., Ru, Ta, Cu, or Cr.

In addition to the current source 113, a voltage source, for example, may also be included in the current applying unit 114 and connected to the first and second electrodes.

In this specification, a current direction is defined as follows. A positive direction is defined as a direction toward the first magnetic layer 101 from the second magnetic layer 102, and a negative direction is defined as a direction toward the second magnetic layer 102 from the first magnetic layer 101.

Oscillation in the magnetoresistive effect element 112 according to the first embodiment is described below. Here, the term "oscillation" implies a phenomenon that electrical vibration is induced by a not-vibrational direct current.

The oscillation in the magnetoresistive effect element 112 is generated by dynamics of magnetization in the magnetic layer of the magnetoresistive effect element 112. The dynamics of the magnetization can be expressed by the following LLG (Landau-Lifshitz-Gilbert) equation (9).

$$\frac{\partial v}{\partial t} = -|\gamma|(v \times H_{eff}) + \alpha\left(v \times \frac{\partial v}{\partial t}\right) + \frac{\mu_B g(\theta) J}{de M_S} v \times (p \times v) \quad (9)$$

Here, v denotes a unit vector of the magnetization in the second magnetic layer 102, γ denotes a gyromagnetic ratio, $H_{eff}$ denotes an effective magnetic field in the second magnetic layer 102, p denotes a unit vector of the magnetization in the first magnetic layer 101, α denotes a Gilbert damping constant of the second magnetic layer 102, $\mu_B$ denotes a Bohr magneton, J denotes a current density of a current flowing through the magnetoresistive effect element 112, e denotes an elementary charge, $M_S$ denotes saturation magnetization of the second magnetic layer 102, d denotes a thickness of the second magnetic layer 102, and t denotes time. In the equation (9), the current density has a positive value when the current direction is positive, and has a negative value when the current direction is negative. The first term on the right side is a precession term, the second term is a damping term, and the third term is a spin-transfer torque term.

Moreover, g(θ) denotes spin-transfer efficiency, which is expressed by the following equation (10) when the magnetoresistive effect element 112 is a GMR element, and by the following equation (11) when it is a TMR element.

$$g(\theta) = \left[-4 + \left(P^{1/2} + P^{-(1/2)}\right)^3 \frac{(3 + \cos\theta)}{4}\right]^{-1} \quad (10)$$

$$g(\theta) = \frac{P}{1 + P^2 \cos\theta} \quad (11)$$

Here, P denotes spin polarization efficiency of the first magnetic layer 101, and θ is an angle formed between the magnetization direction of the first magnetic layer 101 and the magnetization direction of the second magnetic layer 102.

When the second magnetic layer 102 can take substantially a single domain structure, a motion of the magnetization in the second magnetic layer 102 can be calculated through approximation to a macro magnetization vector. In such a case, the dynamics of the magnetization can be calculated by solving the equation (9).

When a current I in the positive direction is applied to flow in a direction perpendicular to a film surface of the magnetoresistive effect element 112, a conduction electron 106 flows in a direction opposite to the direction of the current I, i.e., in a direction toward the second magnetic layer 102 from the first magnetic layer 101 through the spacer layer 103. In the first magnetic layer 101 magnetized in the magnetization direction 104, a spin of the conduction electron 106 is polarized in the same direction as the magnetization direction 104. An arrow 107 represents a spin direction of the conduction electron 106. The electron 106 having the polarized spin flows into the second magnetic layer 102 through the spacer layer 103, whereby transfer of angular momentum is performed with respect to the magnetization in the second magnetic layer 102. This develops an action (expressed by the third term on the right side of the equation (9)) to change the magnetization direction of the second magnetic layer 102 from a direction of the arrow 105 that represents the direction of the effective magnetic field. On the other hand, a damping action (expressed by the second term on the right side of the equation (9)) is also developed so as to stabilize the magnetization direction of the second magnetic layer 102 in the direction of the arrow 105 that represents the direction of the effective magnetic field. Accordingly, those two actions are balanced, thus causing the magnetization in the second magnetic layer 102 to start precession around the direction of the effective magnetic field. The precession is illustrated as a motion of an arrow 108, which represents the magnetization direction of the second magnetic layer 102, around the arrow 105 representing the direction of the effective magnetic field. A locus of the precession of the arrow 108 is denoted by a one-dot-chain line 109 in FIG. 2. Because the magnetization direction of the second magnetic layer 102 is changed relative to the magnetization direction 104 of the first magnetic layer 101 at a high frequency, a resistance value of the magnetoresistive effect element 112 is also changed at the high frequency due to the magnetoresistive effect that resistance is changed depending on a relative angle between the magnetization direction of the second magnetic layer 102 and the magnetization direction 104 of the first magnetic layer 101. Because the resistance value is changed at the high frequency with respect to the current I, there occurs a voltage vibrating in a high-frequency range of about 100 MHz to several tens THz. Here, the magnetization direction 104 of the first magnetic layer may have an arbitrary direction, such as a direction horizontally extending in a surface of the magnetoresistive effect element or a direction perpendicular to the surface thereof. Furthermore, the direction of the effective magnetic field in the second magnetic layer 102 is not limited to the direction opposite to the magnetization direction 104 of the first magnetic layer 101. However, a relative angle between the direction of the effective magnetic field in the second magnetic layer 102 and the magnetization direction 104 of the first magnetic layer is preferably larger than 90 degrees.

By applying a direct current having a certain current density in a state where neither an external magnetic field nor a current is applied to the magnetoresistive effect element 112, or in a state where an external magnetic field having a certain magnitude is applied as the occasion requires, the magnetization in the second magnetic layer 102 starts the precession, and the magnetoresistive effect element 112 causes oscillation. A minimum current density at that time is called a critical current density $J_O$ for oscillation of the magnetoresistive effect element 112, and it is known as being about $10^7$ A/cm$^2$. The critical current density $J_O$ for oscillation of the magnetoresistive effect element 112 varies depending on the intensity and the direction of the external magnetic field.

When a current having a very large current density is applied to the magnetoresistive effect element 112, the spin-transfer torque effect causes magnetization reversal that the magnetization in the second magnetic layer 102 is greatly deviated from the locus causing the precession and is oriented to a direction different from the direction before the application of the current (e.g., substantially in the same direction as the magnetization in the first magnetic layer 101). Such a phenomenon is called "magnetization reversal". With the occurrence of the magnetization reversal, the magnetoresistive effect element 112 comes into a state not generating oscillation, or a state where a rise time of the oscillation is prolonged. A minimum current density at which the magnetization reversal occurs is called a critical current density $J_R$ for magnetization reversal of the second magnetic layer 102. Furthermore, a minimum application time of the critical current density $j_R$ for magnetization reversal, at which the magnetization reversal occurs, is a magnetization reversal time $T_R$ of the second magnetic layer 102. The critical current density $J_R$ for magnetization reversal and the magnetization reversal time $T_R$ vary depending on the intensity and the direction of the external magnetic field.

The following relational formula (12) holds in an Auto-Oscillation model that is obtained by modeling a stable oscillating condition of a general nonlinear oscillation element.

$$\frac{1}{P_{out}} \propto 1 - \frac{J}{J_O} \qquad (12)$$

Here, $P_{out}$ denotes an oscillation output of the magnetoresistive effect element 112.

A method of measuring the critical current density $J_O$ for oscillation under application of a certain external magnetic field (including the case where the external magnetic field is zero) is described below. First, the oscillation output $P_{out}$ of the magnetoresistive effect element 112 in a steady state is measured while the current density applied to the magnetoresistive effect element 112 is changed. The measurement can be performed by utilizing, e.g., a spectrum analyzer or an oscilloscope. Then, the measured result is plotted on a graph in which the vertical axis denotes $1/P_{out}$ and the horizontal axis denotes the current density J applied to the magnetoresistive effect element 112. The critical current density $J_O$ for oscillation can be obtained by determining the current density J applied to the magnetoresistive effect element 112, at which $1/P_{out}=0$ is satisfied, through extrapolation.

A method of measuring the critical current density $J_R$ for magnetization reversal and the magnetization reversal time $T_R$ under application of a certain external magnetic field (including the case where the external magnetic field is zero) is described below. A constant current in the positive direction is applied to the magnetoresistive effect element 112 from an initial state where no current is applied to the magnetoresistive effect element 112, and a time-dependent change of a resistance value of the magnetoresistive effect element 112 is measured by an oscilloscope, for example, starting from the current application time. On that occasion, when vibration occurs in the resistance value of the magnetoresistive effect element 112 and the vibration of the resistance value disappears thereafter, this implies that the magnetization of the magnetoresistive effect element 112 has reversed. A minimum current density at which the magnetization reversal has occurred is the critical current density $J_R$ for magnetization reversal. The critical current density $J_R$ for magnetization reversal can be determined by repeating the above-described measurement while the current applied to the magnetoresistive effect element 112 is gradually increased. A period from the time at which the current having the critical current density $J_R$ for magnetization reversal has been applied to the magnetoresistive effect element 112, to the time at which the vibration of the resistance value of the magnetoresistive effect element 112 has disappeared is the magnetization reversal time $T_R$.

A method of simply measuring the critical current density $J_R$ for magnetization reversal is described below in connection with the case where, after the lapse of a sufficient time from stopping the current application to the magnetoresistive effect element after the magnetization reversal, the magnetization in the second magnetic layer 102 is stabilized in a direction different from the direction before the magnetization reversal. A constant current in the positive direction is applied to the magnetoresistive effect element 112 from an initial state where no current is applied to the magnetoresistive effect element 112. After the lapse of a sufficient time, the current application is stopped. A resistance value of the magnetoresistive effect element 112 is then measured after the lapse of another sufficient time. On that occasion, if the resistance value of the magnetoresistive effect element 112 is different from the resistance value in the initial state by a significant difference, this implies that the magnetization of the magnetoresistive effect element 112 has reversed. The critical current density $J_R$ for magnetization reversal can be determined by repeating measurement in a similar manner to that described above while the current applied to the magnetoresistive effect element 112 is gradually increased. A method of measuring the magnetization reversal time $T_R$ in the above case is described below. A current having the critical current density $J_R$ for magnetization reversal is applied to the magnetoresistive effect element 112 for a time T. A resistance value of the magnetoresistive effect element 112 is then measured after the lapse of a sufficient time. On that occasion, if the resistance value of the magnetoresistive effect element 112 is different from the resistance value in the initial state by a significant difference, this implies that the magnetization of the magnetoresistive effect element 112 has reversed. A minimum value of T at which the magnetization reversal has occurred represents the magnetization reversal time $T_R$. The magnetization reversal time $T_R$ can be determined by repeating the above-described measurement while the time during which the pulse current is applied to the magnetoresistive effect element 112 is gradually prolonged.

The operation of the current source 113 controlled by the control unit 115 in the first embodiment is described below. In a first step, from a state where the magnetoresistive effect element 112 is not oscillated, the current source 113 applies a current flowing in the positive direction and having a first current density, which is larger than the critical current density $J_O$ for oscillation, to the magnetoresistive effect element 112 for a time $T_P$. An average value of the first current density during the time $T_P$ in the first step is assumed to be $J_P$. Then, in a second step, the current source 113 applies, to the magnetoresistive effect element 112, a current flowing in the positive direction and having a second current density $J_S$, which is smaller than the first current density and not smaller than the critical current density $J_O$ for oscillation, such that the magnetoresistive effect element 112 oscillates at a predetermined frequency. In addition, the second current density $J_S$ is smaller than the critical current density $J_R$ for magnetization reversal.

Figure 3:
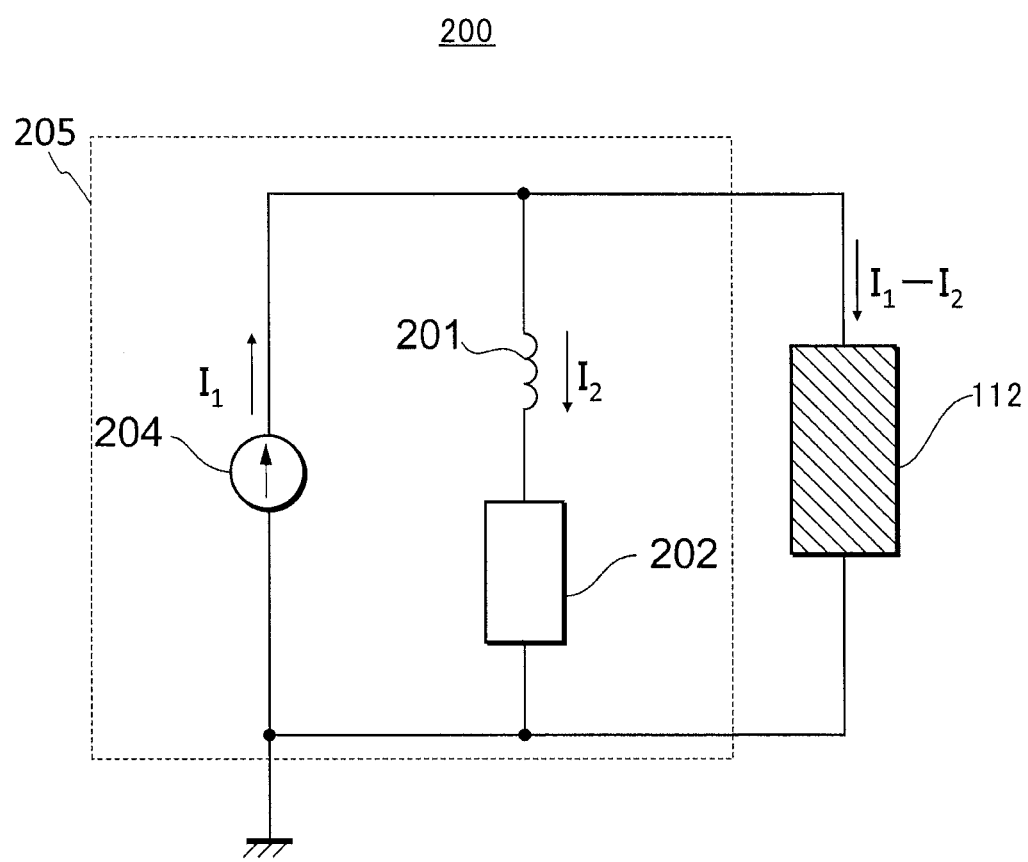
FIG. 3 is a circuit diagram of the magnetoresistive effect oscillator according to each of the first and second embodiments.

An example of utilizing a peripheral circuit as a means for implementing the above-described current applying steps, instead of the method of controlling the current source 113, is described below. FIG. 3 is a circuit diagram of a magnetoresistive effect oscillator 200. The magnetoresistive effect oscillator 200 includes a magnetoresistive effect element 112 and a current applying unit 205. The current applying unit 205 includes an inductor 201, a resistance 202, and a current source 204. The magnetoresistive effect element 112 and the inductor 201 are connected in parallel, and the inductor 201 and the resistance 202 are connected in series. Those components arranged in such a layout are connected to the current source 204.

When the current source 204 generates a current $I_1$ having the first current density, an electromotive force is generated in the inductor 201 so as to cancel a change of magnetic flux. Accordingly, the current substantially does not flow through the resistance 202, and almost all of the current $I_1$ flows through the magnetoresistive effect element 112. Thereafter, when time-varying fluctuations in the current $I_1$ are settled, the electromotive force disappears and a current $I_2$ flows through the resistance 202 whereas a constant current $I_1-I_2$ flows through the magnetoresistive effect element 112. Here, respective values of the inductor 201 and the resistance 202 are adjusted such that $I_1-I_2$ becomes a current having the second current density $J_S$. Thus, the magnetoresistive effect oscillator 200 can generate the drive currents in the first embodiment.

A means for performing the measurements in the above-described current applying steps is described below. By holding probes in contact with the electrodes 110 and 111 and measuring a voltage between the electrodes in time domain by an oscilloscope, for example, it is possible to estimate a time-dependent change of the current that is applied to the magnetoresistive effect element 112, and to experimentally determine, e.g., the magnitude and time of the current pulse.

The current applying unit 114 executes the first step and the second step such that the following formulae (1), (2) and (3), or the following formulae (1) and (4) are satisfied.

$$\frac{0.1 \times T_R(J_R - J_O)}{J_P - J_S} < T_P < 0.9 \times T_R \frac{J_R - J_O}{J_S - J_O} \tag{1}$$

$$T_P < \frac{T_R(J_R - J_O)}{J_P - J_O} \tag{2}$$

$$J_R \leq J_P \tag{3}$$

$$J_P < J_R \tag{4}$$

In the above formulae (1) to (4), $J_P$, $J_R$, and $J_S$ are each a magnitude of the current density (i.e., an absolute value of the current density).

Regarding the pulse current having the first current density and applied for the time $T_P$ in the first step, a quantity corresponding to energy of the pulse current in excess of the energy necessary for oscillation at the predetermined frequency is expressed by $T_P(J_P-J_S)$. As a value of the above quantity increases, the oscillation in the magnetoresistive effect element 112 rises at a higher speed. Furthermore, a quantity corresponding to energy necessary for reversal of the magnetization in the second magnetic layer 102 is expressed by $T_R(J_R-J_O)$. When $T_P$ is within the range expressed by the formula (1), a rise time can be shortened at a rate not less than a certain level in comparison with the case of omitting the first step and executing only the second step. If $T_P$ is not more than a lower limit, the energy of the pulse current is small, and hence a shortening rate of the rise time is reduced. If $T_P$ is not less than an upper limit, the influence of $T_P$, i.e., the time during which the current having the first current density is applied, is increased, and a time until reaching the oscillation at the predetermined frequency corresponding to the second current density $J_S$ is prolonged. Hence the shortening rate of the rise time is reduced.

Moreover, if $T_P$ exceeds an upper limit of $T_P$ expressed by the formula (2) when $J_P$ satisfies the formula (3) indicating that $J_P$ is not smaller than the critical current density $J_R$ for magnetization reversal, the energy of the pulse current exceeds the energy necessary for the reversal of the magnetization in the second magnetic layer 102, and the magnetization reversal of the magnetoresistive effect element 112 occurs. This results in a state where the precession of the magnetization is not generated, or a state where the rise time of the oscillation in the magnetoresistive effect element 112 is prolonged. When the formulae (3) and (2) are satisfied, or when the formula (4) indicating that $J_P$ is smaller than the critical current density $J_R$ for magnetization reversal of the magnetoresistive effect element 112 is satisfied, the magnetoresistive effect element 112 does not cause the magnetization reversal.

The formula (2) is described below. The formula (2) represents conditions of the pulse current (having the average current density $J_P$ and the time $T_P$) under which the magnetization reversal does not occur in the magnetoresistive effect element 112 when the pulse current having the average current density $J_P$ not smaller than the critical current density $J_R$ for magnetization reversal is applied to the magnetoresistive effect element 112. If $J_P$ is not smaller than the critical current density $J_R$ for magnetization reversal and the energy of the pulse current exceeds the energy necessary for the magnetization reversal in the magnetoresistive effect element 112, the magnetization reversal occurs in the magnetoresistive effect element 112. When the current having the current density not smaller than the critical current density $J_O$ for oscillation is applied to the magnetoresistive effect element 112, the magnetization in the second magnetic layer 102 overcomes the damping action and changes its direction. Therefore, a quantity corresponding to energy effective to change the magnetization direction of the second magnetic layer 102 can be expressed by the product $T(J-J_O)$ of a difference $(J-J_O)$ between the current density J applied to the magnetoresistive effect element 112 and the critical current density $J_O$ for oscillation and the time T during which the current is applied to the magnetoresistive effect element 112. Accordingly, the quantity corresponding to the energy necessary to cause the magnetization reversal in the magnetoresistive effect element 112 is expressed by $T_R(J_R-J_O)$. On the other hand, a quantity corresponding to energy of the pulse current effective to change the magnetization direction of the second magnetic layer 102 can be expressed by $T_P(J_P-J_O)$. Thus, if $T_P(J_P-J_O)$ becomes not less than $T_R(J_R-J_O)$ when $J_P$ is not smaller than the critical current density $J_R$ for magnetization reversal, the magnetoresistive effect element 112 causes the magnetization reversal. If the formula (2) is satisfied, the magnetoresistive effect element 112 does not cause the magnetization reversal.

Figure 4:
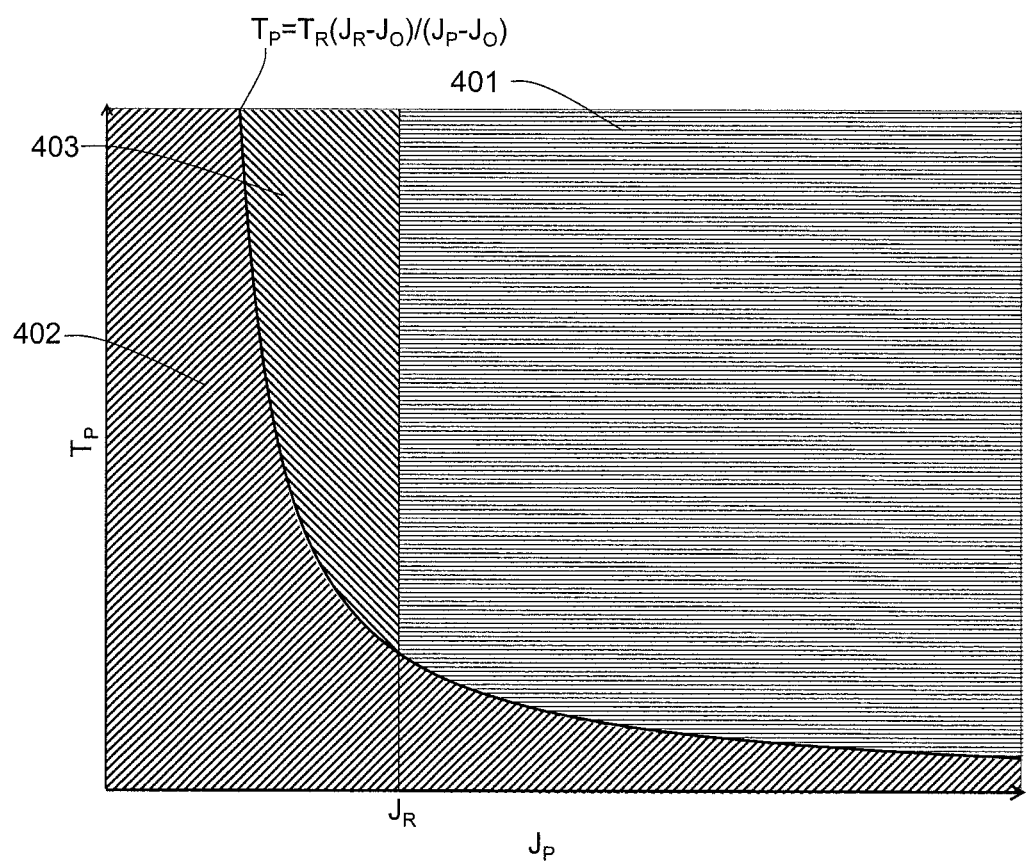
FIG. 4 is a chart depicting a state of magnetization when a pulse current is applied to the magnetoresistive effect element according to each of the first and second embodiments.

FIG. 4 is a chart depicting a state of the magnetization in the second magnetic layer 102 when a pulse current $(J_P, T_P)$ is applied to the magnetoresistive effect element 112. A first region 401 represents a region where the magnetoresistive effect element 112 causes the magnetization reversal. A second region 402 represents a region where the formula (2) is satisfied, and where the magnetization in the second magnetic layer 102 of the magnetoresistive effect element 112 is not reversed because the energy of the pulse current is smaller than the energy necessary for the reversal of the magnetization in the second magnetic layer 102 of the magnetoresistive effect element 112. A third region 403 represents a region where the formula (2) is not satisfied, but the magnetization in the second magnetic layer 102 of the magnetoresistive effect element 112 is not reversed because $J_P$ is smaller than the critical current density for the magnetization reversal of the magnetoresistive effect element 112.

Preferably, the current applying unit 114 executes the first step and the second step such that the following formula (8) and the above formulae (2) and (3), or the following formula (8) and the above formula (4) are satisfied. When $T_P$ is within a range expressed by the formula (8), the rise time of the oscillation in the magnetoresistive effect element 112 can be shortened significantly.

$$\frac{0.96 \times T_R(J_R - J_O)}{(J_P - 0.96 J_S)} \le T_P \le \frac{0.98 \times T_R(J_R - J_O)}{(J_P - 0.98 J_S)} \qquad (8)$$

In the second step, the current source 113 continuously applies the current having the second current density $J_S$ to the magnetoresistive effect element 112, and sustains the oscillation in the magnetoresistive effect element 112 at a frequency corresponding to the second current density $J_S$.

In the first step, the first current density may be a constant value, or may be changed during the time $T_P$.

Second Embodiment

Figure 5:
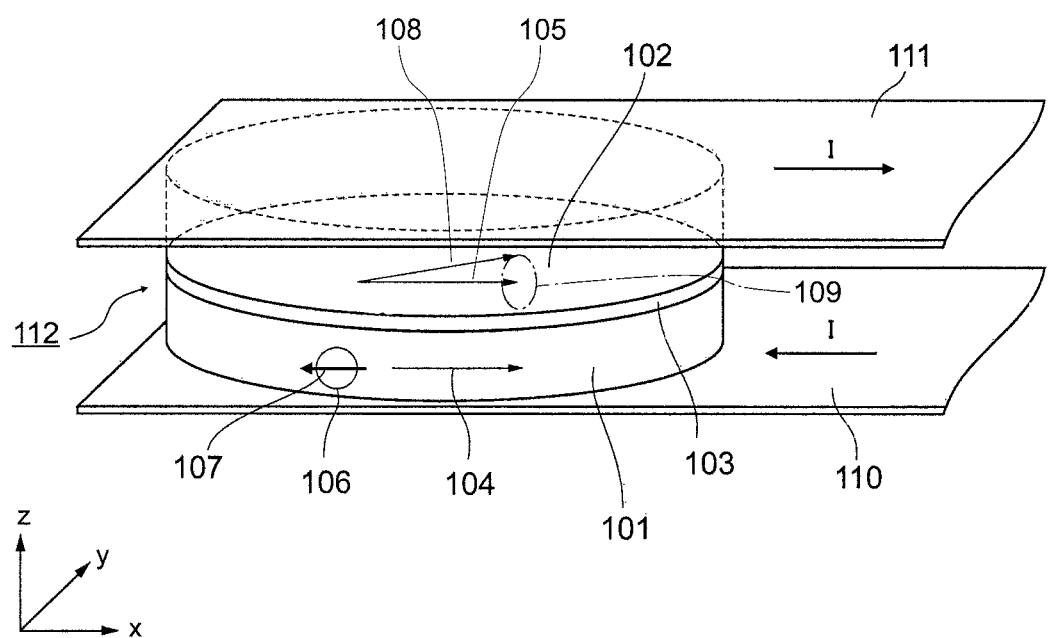
FIG. 5 is a schematic view of the magnetoresistive effect element according to the second embodiment.

FIG. 5 is a schematic view of a magnetoresistive effect element 112 according to a second embodiment. The second embodiment is similar to the first embodiment except for the magnetization direction of a second magnetic layer 102 before the application of the current to the magnetoresistive effect element 112, i.e., the direction of the effective magnetic field in the second magnetic layer 102, and for the direction of the current applied to the magnetoresistive effect element 112. The direction of the effective magnetic field in the second magnetic layer 102 is substantially the same as the magnetization direction of a first magnetic layer 101. Furthermore, a current I in the negative direction is applied to flow in a direction perpendicular to a film surface of the magnetoresistive effect element 112. When such a current is applied, a conduction electron 106 flows in a direction opposite to the direction of the current I, i.e., in a direction toward the first magnetic layer 101 from the second magnetic layer 102 through a spacer layer 103. In the first magnetic layer 101 magnetized in a magnetization direction 104, a spin of the conduction electron 106 is polarized in the same direction as the magnetization direction 104, and it flows into an electrode 110. On the other hand, among spins of the conduction electrons 106, the spin having a direction opposite to the magnetization direction 104 does not flow into the electrode 110, but it is reflected by the electrode 110 and flows into the second magnetic layer 102 through the spacer layer 103. An arrow 107 represents a spin direction of the conduction electron 106 that has been reflected due to the spin polarization. The conduction electron 106 reflected due to the spin polarization performs transfer of angular momentum with respect to the magnetization in the second magnetic layer 102. This develops an action (expressed by the third term on the right side of the equation (9)) to change the magnetization direction of the second magnetic layer 102 from a direction of an arrow 105 that represents the direction of the effective magnetic field. On the other hand, a damping action (expressed by the second term on the right side of the equation (9)) is also developed so as to stabilize the magnetization direction of the second magnetic layer 102 in the direction of the arrow 105 that represents the direction of the effective magnetic field. Accordingly, those two actions are balanced, thus causing the magnetization in the second magnetic layer 102 to start precession around the direction of the effective magnetic field. The precession is illustrated as a motion of an arrow 108, which represents the magnetization direction of the second magnetic layer 102, around the arrow 105 representing the direction of the effective magnetic field. A locus of the precession of the arrow 108 is denoted by a one-dot-chain line 109 in FIG. 5. The direction of the effective magnetic field in the second magnetic layer 102 is not limited to the same direction as the magnetization direction 104 of the first magnetic layer 101. However, a relative angle between the direction of the effective magnetic field in the second magnetic layer 102 and the magnetization direction 104 of the first magnetic layer is preferably smaller than 90 degrees.

Methods for measuring the critical current density $J_O$ for oscillation, the critical current density $J_R$ for magnetization reversal, and the magnetization reversal time $T_R$ in the second embodiment are the same as those in the first embodiment except for that the direction of the applied current is the negative direction.

While, in the first and second embodiments, the first magnetic layer 101 and the second magnetic layer 102 are each an in-plane magnetized film having an easy magnetization axis in a planar direction of the film, those layers may be each a perpendicularly magnetized film having an easy magnetization axis in a direction perpendicular to the film surface.

The above-described formulae (1) and (8) will be described below with reference to Simulation Examples.

Simulation Example 1

For the magnetoresistive effect oscillator 100 of the first embodiment, a simulation was performed on the basis of the equation (9), and the rise time of the oscillation in the magnetoresistive effect element 112 was calculated. The second magnetic layer 102 had an elliptic shape with a major axis of 135×a minor axis of 65×a thickness of 2.5 nm³. It is here assumed that an x-axis direction is defined as the direction of the major axis, a y-axis direction is defined as the direction of the minor axis, and a z-axis direction is defined as the direction of the thickness. The material of the first magnetic layer 101 was FeCo, and the material of the second magnetic layer 102 was Ni$_{80}$Fe$_{20}$. The magnetization in the first magnetic layer 101 was fixed through exchange-coupling with respect to an antiferromagnetic material (not illustrated) that was positioned just under the first magnetic layer 101. The material of the spacer layer 103 was Cu, i.e., a nonmagnetic metal.

The second magnetic layer 102 had magnetic shape anisotropy in the x-axis direction, and an anisotropic magnetic field $H_K$ in the x-axis direction was set to 29.05×10³ A/m. Because a film thickness can be regarded as sufficiently thin, demagnetization factors were set to Nx=0, Ny=0, and Nz=1, and a demagnetizing field $H_d$ was determined from the following equation (13). In the equation (13), $(v_x, v_y, v_z)$ represents a unit vector in the magnetization direction of the second magnetic layer 102.

$$H_d = M_S \begin{pmatrix} -N_x \cdot v_x \\ -N_y \cdot v_y \\ -N_z \cdot v_z \end{pmatrix} \quad (13)$$

Assuming that the magnetization in the second magnetic layer 102 was uniform, an exchange magnetic field in the second magnetic layer 102 was set to 0.

In this Simulation Example 1, an external magnetic field was not applied to the magnetoresistive effect element 112. Accordingly, the effective magnetic field in the second magnetic layer 102 was given as the sum of the anisotropic magnetic field $H_K$ and the demagnetizing field $H_d$.

In the initial state before the application of the current to the magnetoresistive effect element 112, the magnetization direction of the second magnetic layer 102 was set to be antiparallel to the magnetization direction of the first magnetic layer 101.

Table 1 lists parameters used in this Simulation Example 1.

TABLE 1

| Symbol | Value | Unit |
| --- | --- | --- |
| γ | 2.2176 × 10⁵ | m/(A · sec) |
| α | 0.01 | — |
| $H_K$ | 29.05 × 10³ | A/m |
| $M_S$ | 8 × 10⁵ | A/m |
| P | 0.3 | — |

An element resistance value R of the magnetoresistive effect element 112 was changed depending on the angle θ formed between the magnetization direction of the first magnetic layer 101 and the magnetization direction of the second magnetic layer 102, and it was calculated from the following equation (14).

$$R = R_{min} + \frac{1 - \cos\theta}{2}(R_{max} - R_{min}) \quad (14)$$

Here, $R_{max}$ is a resistance value when the magnetization direction of the first magnetic layer 101 and the magnetization direction of the second magnetic layer 102 are antiparallel, and $R_{min}$ is a resistance value when the magnetization direction of the first magnetic layer 101 and the magnetization direction of the second magnetic layer 102 are parallel.

A dynamics MR ratio $MR_D$ was calculated from the following equation (15) on an assumption that a maximum value and a minimum value of the resistance value of the magnetoresistive effect element 112 were $R'_{max}$ and $R'_{min}$, respectively, in a state where a current was applied to the magnetoresistive effect element 112 and the magnetization direction of the second magnetic layer 102 was changed with the lapse of time.

$$MR_D = \frac{R'_{max} - R'_{min}}{R_{max} - R_{min}} \quad (15)$$

A condition in which the dynamics MR ratio was not less than 0.1% in a steady state was regarded as an oscillating condition.

The term "static condition" implies a condition in which the magnetization in the second magnetic layer 102 of the magnetoresistive effect element 112 is not vibrated with a significant difference. A condition in which the dynamics MR ratio was less than 0.1% in the steady state was regarded as the static condition.

The rise time of the oscillation in the magnetoresistive effect element 112 was defined as a time from a start time of the application of the current to the magnetoresistive effect element 112 until variations in oscillation frequency of the magnetoresistive effect element 112 were reduced down to 1% or below of the oscillation frequency thereof in the steady state. In this Simulation Example 1 and later-described Simulation Examples 2, 3 and 4 and EXAMPLES, the start time of the application of the current to the magnetoresistive effect element was set to 0 second.

Figure 6:
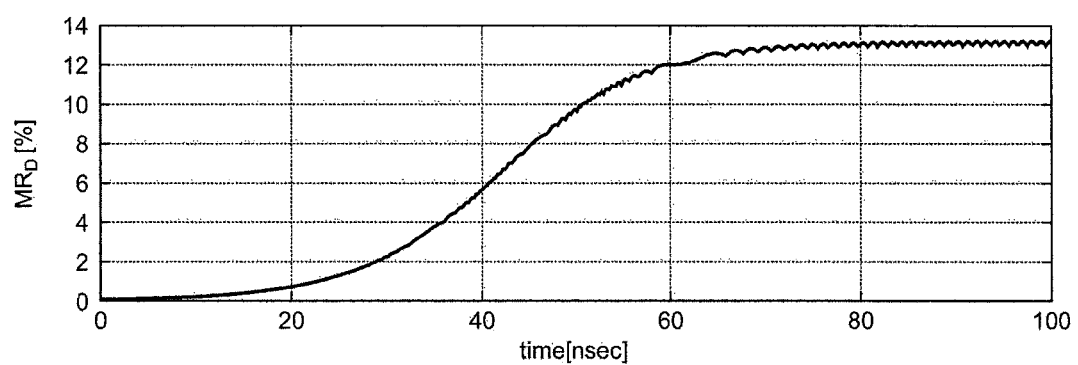
FIG. 6 is a graph depicting a simulation result with respect to a time-dependent change of a dynamics MR ratio of a magnetoresistive effect element according to Simulation Example 1.
Figure 7:
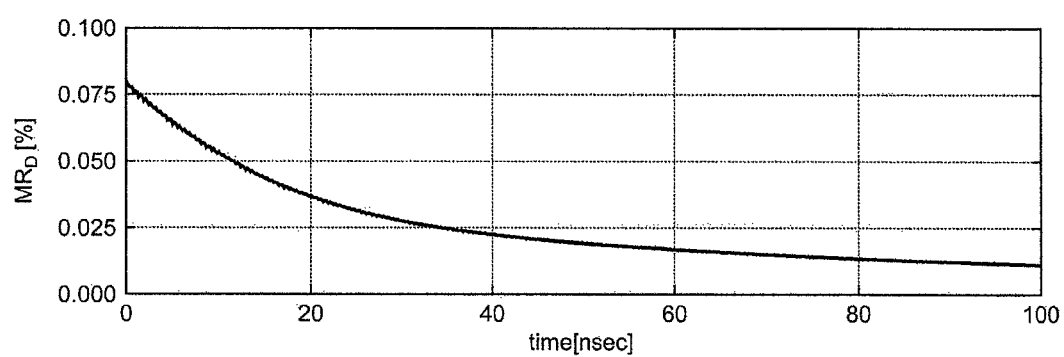
FIG. 7 is a graph depicting a simulation result with respect to a time-dependent change of a dynamics MR ratio of the magnetoresistive effect element according to Simulation Example 1.

The critical current density $J_O$ for oscillation was determined as follows. FIGS. 6 and 7 each depict a time-dependent change of the dynamics MR ratio $MR_D$ when a certain current in the positive direction was applied from a state where no current was applied to the magnetoresistive effect element 112 according to Simulation Example 1 and where the magnetization direction of the second magnetic layer 102 was antiparallel to the magnetization direction of the first magnetic layer 101. FIG. 6 represents a result when the current density was $1.1 \times 10^{11}$ A/m². In the case of FIG. 6, the magnitude of $MR_D$ was gradually increased, and the magnetoresistive effect element 112 was brought into the oscillating condition. On the other hand, FIG. 7 represents a result when the current density was $1.0 \times 10^{11}$ A/m². In the case of FIG. 7, the magnitude of $MR_D$ was gradually decreased, and the magnetoresistive effect element 112 was held in the static condition. Consequently, the critical current density $J_O$ for oscillation of the magnetoresistive effect element 112 was about $1.1 \times 10^{11}$ A/m².

The critical current density $J_R$ for magnetization reversal was determined as follows. Starting from the state where no current was applied to the magnetoresistive effect element 112 and where the magnetization direction of the second magnetic layer 102 was antiparallel to the magnetization direction of the first magnetic layer 101, a current having a current density J1 was continuously applied to the magnetoresistive effect element 112 for 1 msec, and the current applied to the magnetoresistive effect element 112 was then stopped. After 1 msec from the stop of the current, a relative angle formed between the magnetization direction of the first magnetic layer 101 and the magnetization direction of the second magnetic layer 102 was calculated. At $J1=1.32 \times 10^{11}$ [A/m²], the relative angle was 180 degrees, and the magnetization direction of the first magnetic layer 101 and the magnetization direction of the second magnetic layer 102 were antiparallel to each other. Thus, the magnetization direction of the second magnetic layer 102 was the same as that before the application of the current. On the other hand, at $J1=1.33 \times 10^{11}$ [A/m²], the relative angle was 0 degree, and the magnetization direction of the first magnetic layer 101 and the magnetization direction of the second magnetic layer 102 were parallel to each other. Thus, the magnetization direction of the second magnetic layer 102 was different from that before the application of the current, and the magnetization reversal occurred in the magnetoresistive effect element 112. Consequently, the critical current density $J_R$ for magnetization reversal was $1.33 \times 10^{11}$ A/m².

The magnetization reversal time $T_R$ was determined as follows. A current having the critical current density $J_R$ for magnetization reversal was applied to the magnetoresistive effect element 112 for a time $T_1$, and the application of the current was then stopped. After 1 msec from the stop of the current, a relative angle formed between the magnetization direction of the first magnetic layer 101 and the magnetization direction of the second magnetic layer 102 was calculated. At $T_1=31$ [nsec], the relative angle was 180 degrees. On the other hand, at $T_1=32$ [nsec], the relative angle was 0 degree, and the magnetization reversal occurred in the magnetoresistive effect element 112. Consequently, the magnetization reversal time $T_R$ was 32 nsec.

In the second step, a current flowing in the positive direction and having the current density $J_S=1.12 \times 10^{11}$ A/m² was applied.

The rise time of the oscillation in the magnetoresistive effect element 112 when the first step is omitted and only the second step is executed is assumed to be $T_{NORM}$. A ratio of a rise time $T'_{RISE}$ counting from the start time of the second step in the first embodiment to $T_{NORM}$ is assumed to be A'. As a result of determining, with a simulation, the rise time $T_{NORM}$ of the oscillation in the magnetoresistive effect element 112 when the current flowing in the positive direction and having the current density of $1.12 \times 10^{11}$ A/m² was applied to the magnetoresistive effect element 112, it was 276 nsec.

Figure 8:
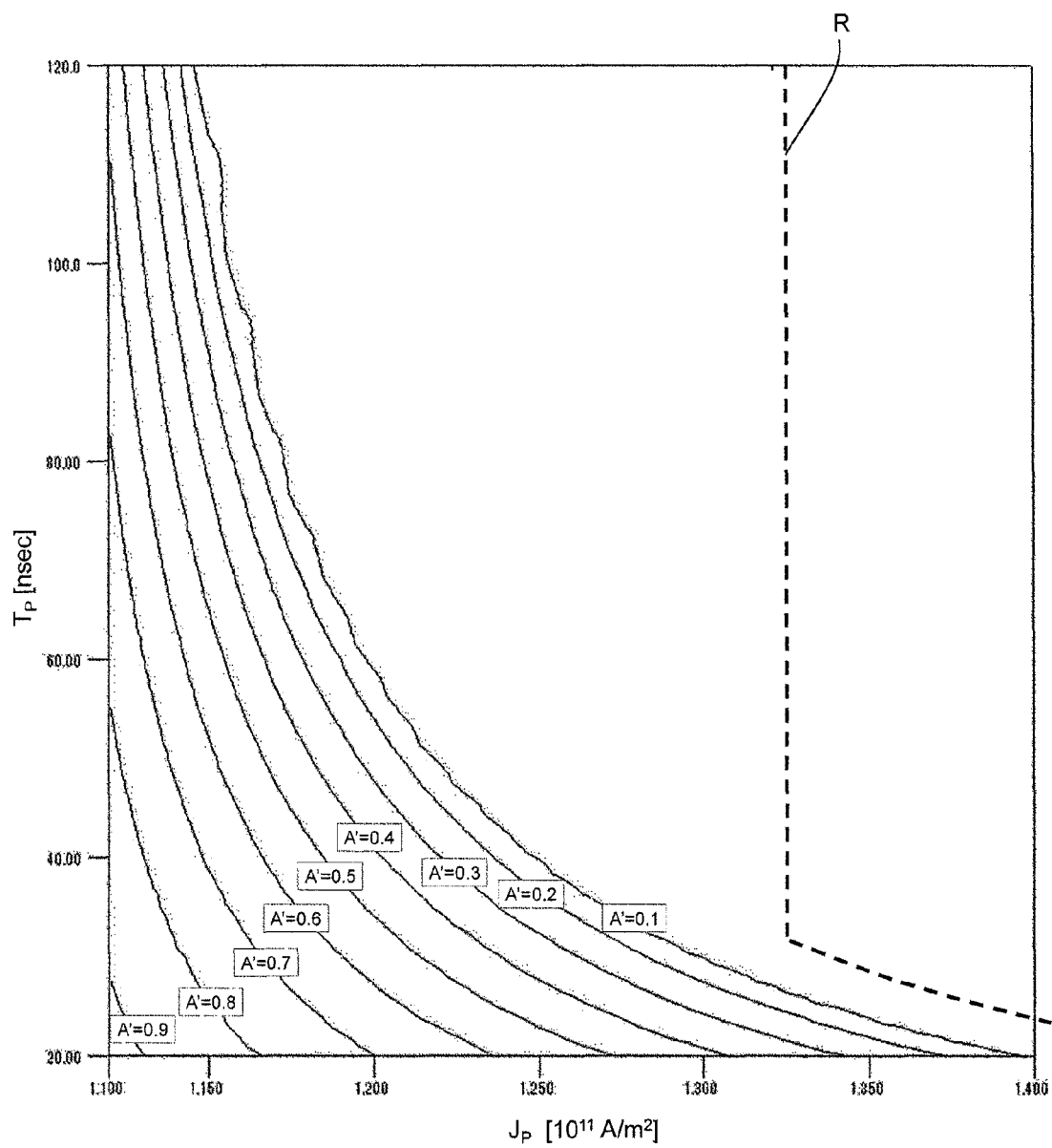
FIG. 8 is a graph depicting a simulation result with respect to a rise time of oscillation in the magnetoresistive effect element according to Simulation Example 1.

The first current density of the pulse current applied to the magnetoresistive effect element 112 in the first step was set to a constant value ($=J_P$). A' was determined by calculating the rise time of the oscillation while $J_P$ and $T_P$ were changed. FIG. 8 depicts a graph plotting a relation between $J_P$ and $T_P$, at which A' is kept constant, for each of nine different values of A' (A'=0.1 to 0.9). A dotted line R represents a boundary line denoting a boundary of the region where the magnetoresistive effect element 112 causes the magnetization reversal. As a result of fitting to the graph of FIG. 8, it was found that the following equation (16) is held.

$$\frac{T'_{RISE}}{T_{NORM}} = A' = 1 - \frac{T_P(J_P - J_O)}{T_R(J_R - J_O)} \tag{16}$$

Figure 9:
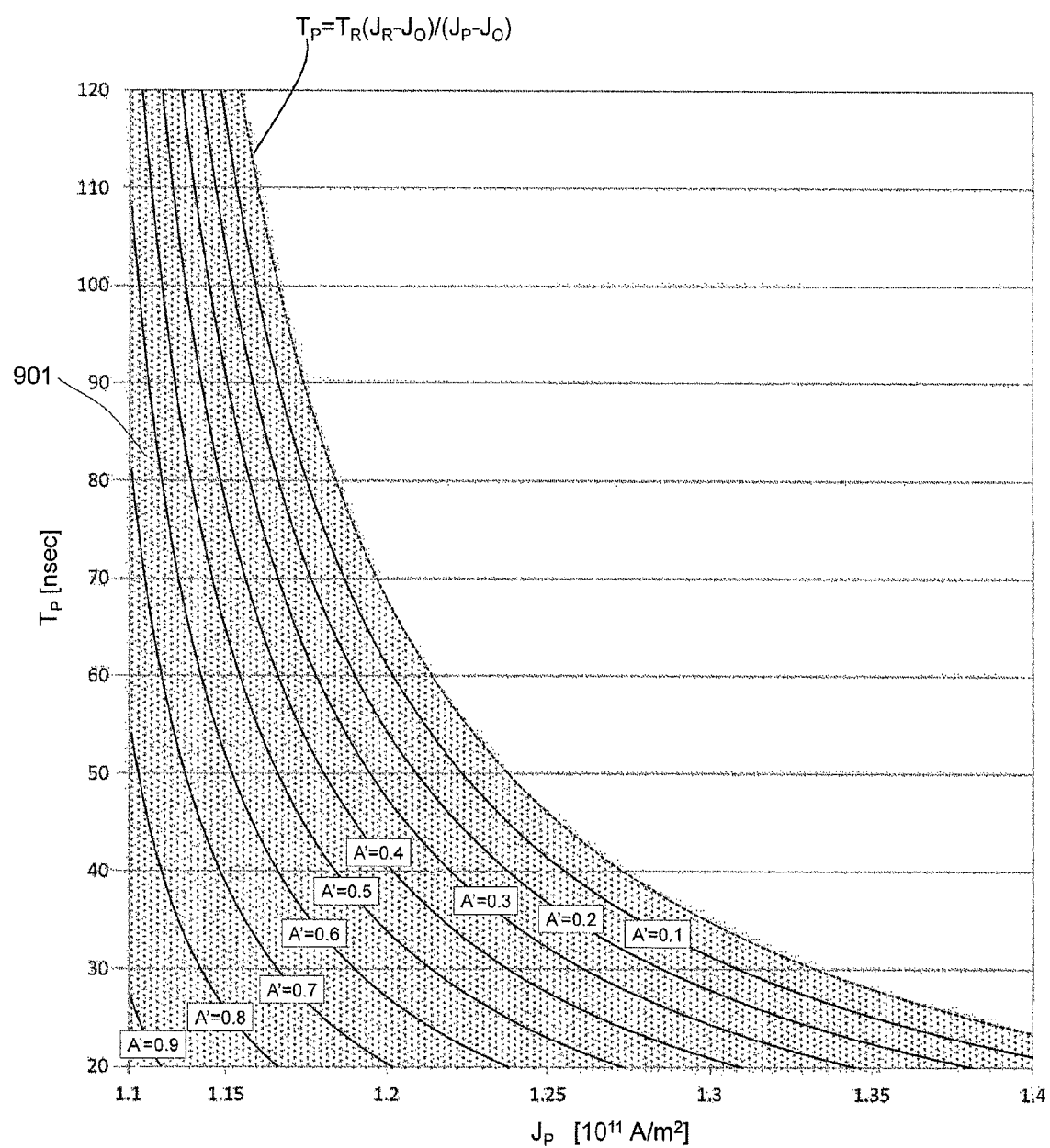
FIG. 9 is a graph representing an equation (16) with respect to the rise time of the oscillation in the magnetoresistive effect element according to Simulation Example 1.
Figure 10:
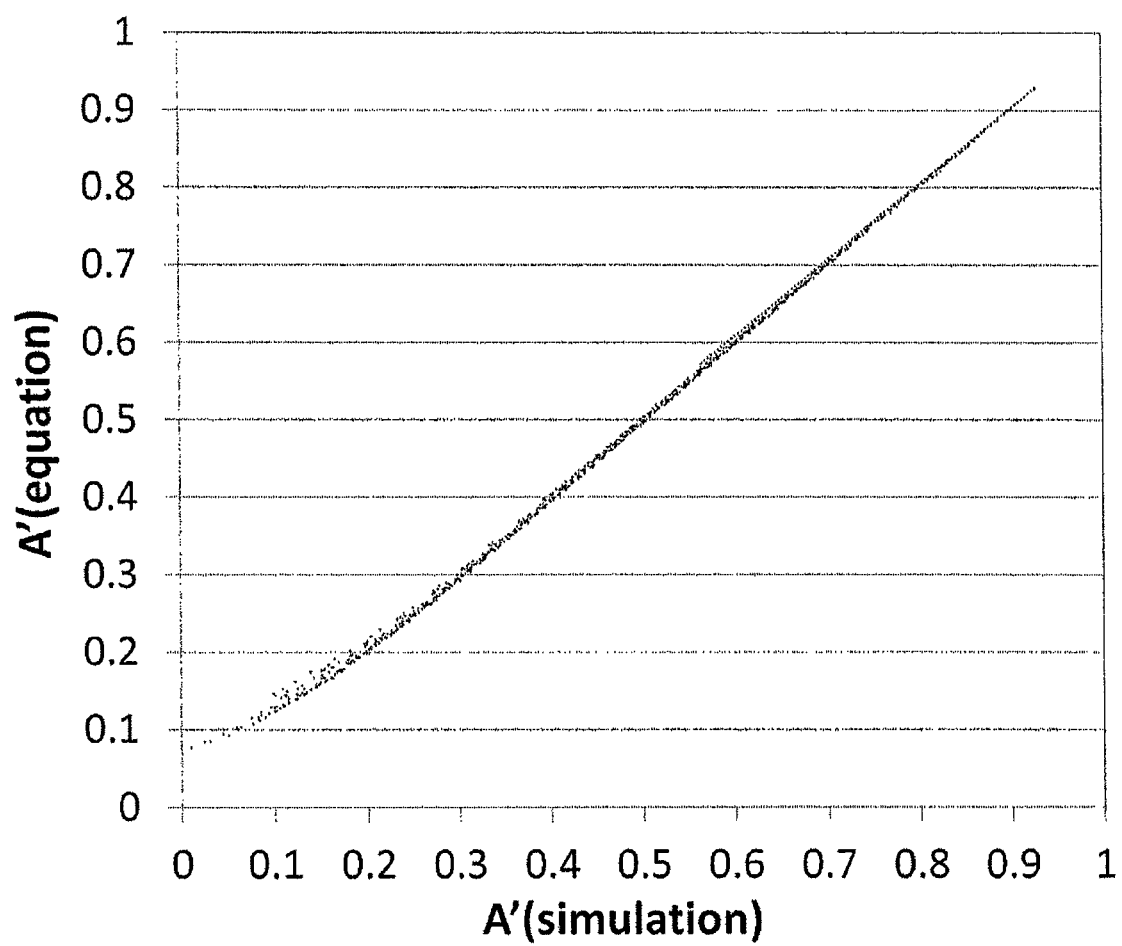
FIG. 10 is a graph depicting correlation between the simulation result and the equation (16) with respect to the rise time of the oscillation in the magnetoresistive effect element according to Simulation Example 1.

FIG. 9 is a graph representing the equation (16). FIGS. 8 and 9 are substantially identical in a region 901 on the left side of a dotted line $T_P=T_R(J_R-J_O)/(J_P-J_O)$ where the formula (2) is satisfied. FIG. 10 is a graph depicting correlation between A' determined with the simulation and A' determined from the equation (16). As seen from FIG. 10, a correlation factor is substantially 1.

Figure 11:
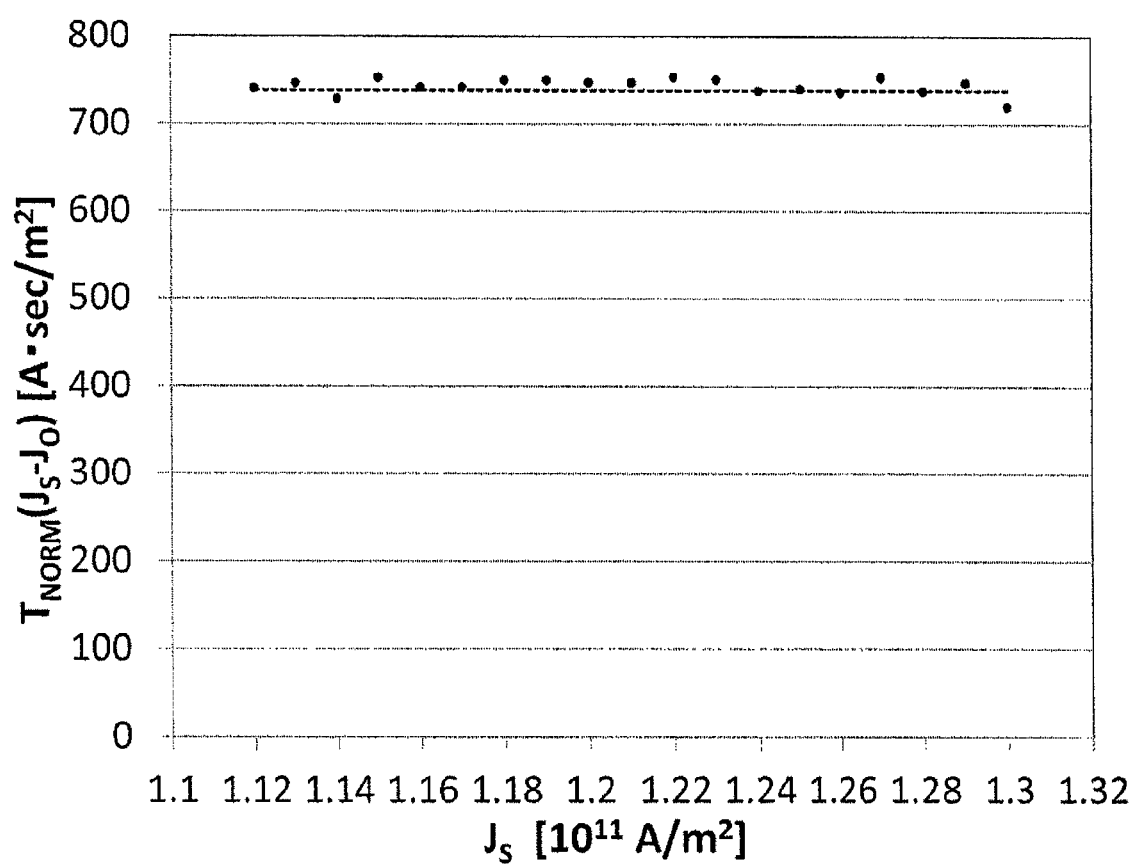
FIG. 11 is a graph depicting a quantity corresponding to energy with respect to the oscillation in the magnetoresistive effect element according to Simulation Example 1.

Furthermore, a simulation was performed on condition of omitting the first step and changing the current density $J_S$. FIG. 11 plots a quantity $T_{NORM}(J_S-J_O)$ corresponding to energy that is necessary to oscillate the magnetoresistive effect element 112 with the application of the current density $J_S$ to the magnetoresistive effect element 112. As a result of fitting to the graph of FIG. 11, it was found that the following equation (17) is held. A dotted line in FIG. 11 represents $T_R(J_R-J_O)$.

$$T_R(J_R-J_O) = T_{NORM}(J_S-J_O) \tag{17}$$

Next, a rise time $T_{RISE}$ of the oscillation in the magnetoresistive effect element 112 was determined in consideration of the time $T_P$ during which the pulse current was applied to the magnetoresistive effect element 112. $T_{RISE}$ is given as the sum of $T'_{RISE}$ and $T_P$. Assuming A to be a ratio of $T_{RISE}$ to $T_{NORM}$ is expressed by the following equation (18) based on the equation (16) when the formula (2) is satisfied.

$$\begin{aligned}\frac{T_{RISE}}{T_{NORM}} &= A \\ &= \frac{T'_{RISE} + T_P}{T_{NORM}} \\ &= 1 - \frac{T_P(J_P - J_O)}{T_R(J_R - J_O)} + \frac{T_P}{T_{NORM}}\end{aligned} \tag{18}$$

When $T_P$ is so large as not to satisfy the formula (2), the magnetoresistive effect element 112 oscillates without causing the magnetization reversal if the formula (4) is satisfied. In this case, the magnetoresistive effect element 112 reaches the oscillating condition at an oscillation frequency corresponding to the first current density in the time $T_P$ during which the pulse current is applied. When, in the above state, the current density applied to the magnetoresistive effect element 112 is changed from the first current density $J_P$ to the second current density $J_S$ (i.e., when the current application is shifted from the first step to the second step), the magnetoresistive effect element 112 is caused to transit from the oscillating condition at the oscillation frequency, which corresponds to the first current density $J_P$, to the oscillating condition at an oscillation frequency corresponding to the second current density $J_S$. A transition time on that occasion depends on the damping action. However, the transition time is so small as to be negligible because a in the equation (9) is generally 0.01 or more and the damping action is relatively strong. Accordingly, in this case, the rise time $T_{RISE}$ of the oscillation in the magnetoresistive effect element 112 is equal to $T_P$ and the following equation (19) is held.

$$A = \frac{T_{RISE}}{T_{NORM}} = \frac{T_P}{T_{NORM}} \qquad (19)$$

Using $J_P$ and $T_P$, the ratio A is expressed by the following equation (20) based on the equations (17) and (18) when the formula (2) is satisfied, and by the following equation (21) based on the equations (17) and (19) when the formula (2) is not satisfied.

$$A = 1 - \frac{T_P(J_P - J_S)}{T_R(J_R - J_O)} \qquad (20)$$

$$A = \frac{T_P(J_S - J_O)}{T_R(J_R - J_O)} \qquad (21)$$

Figure 12:
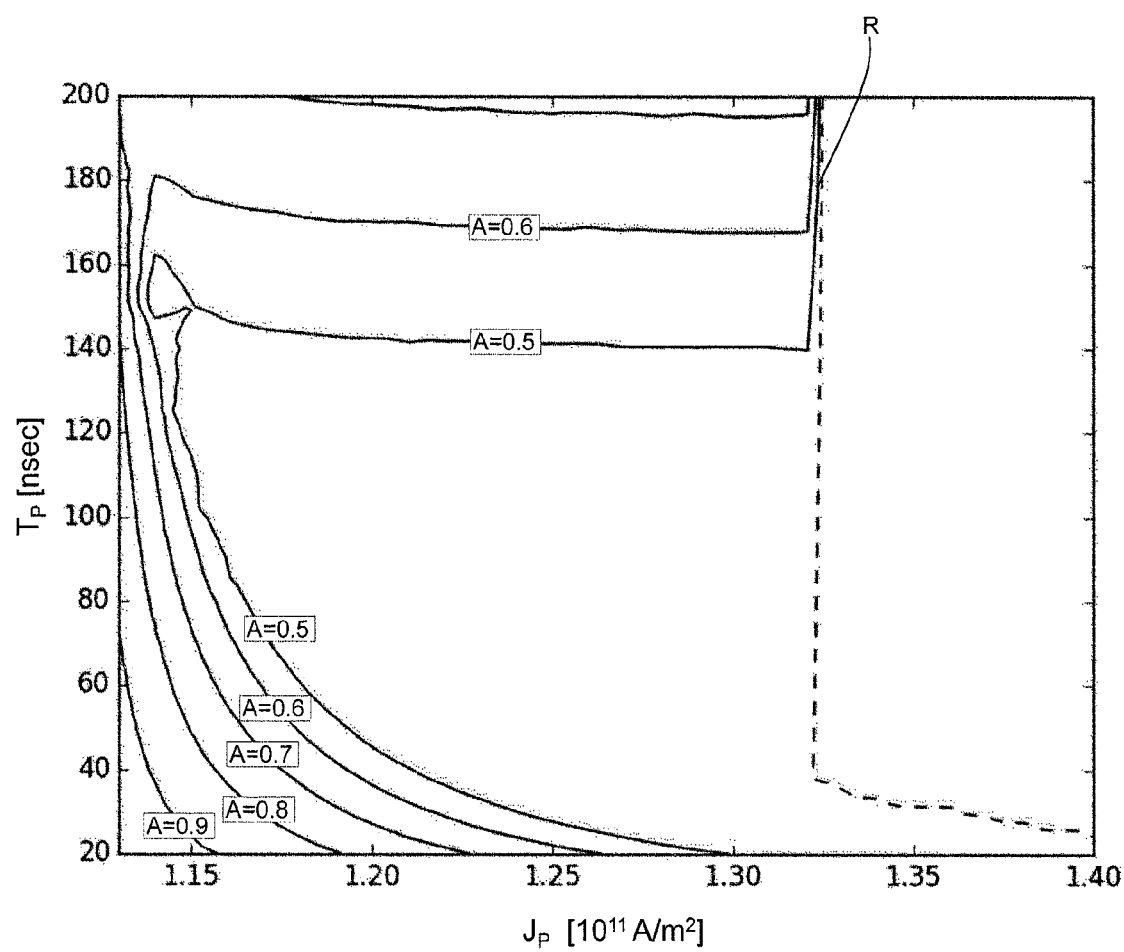
FIG. 12 is a graph depicting a simulation result with respect to the rise time of the oscillation in the magnetoresistive effect element according to Simulation Example 1.
Figure 13:
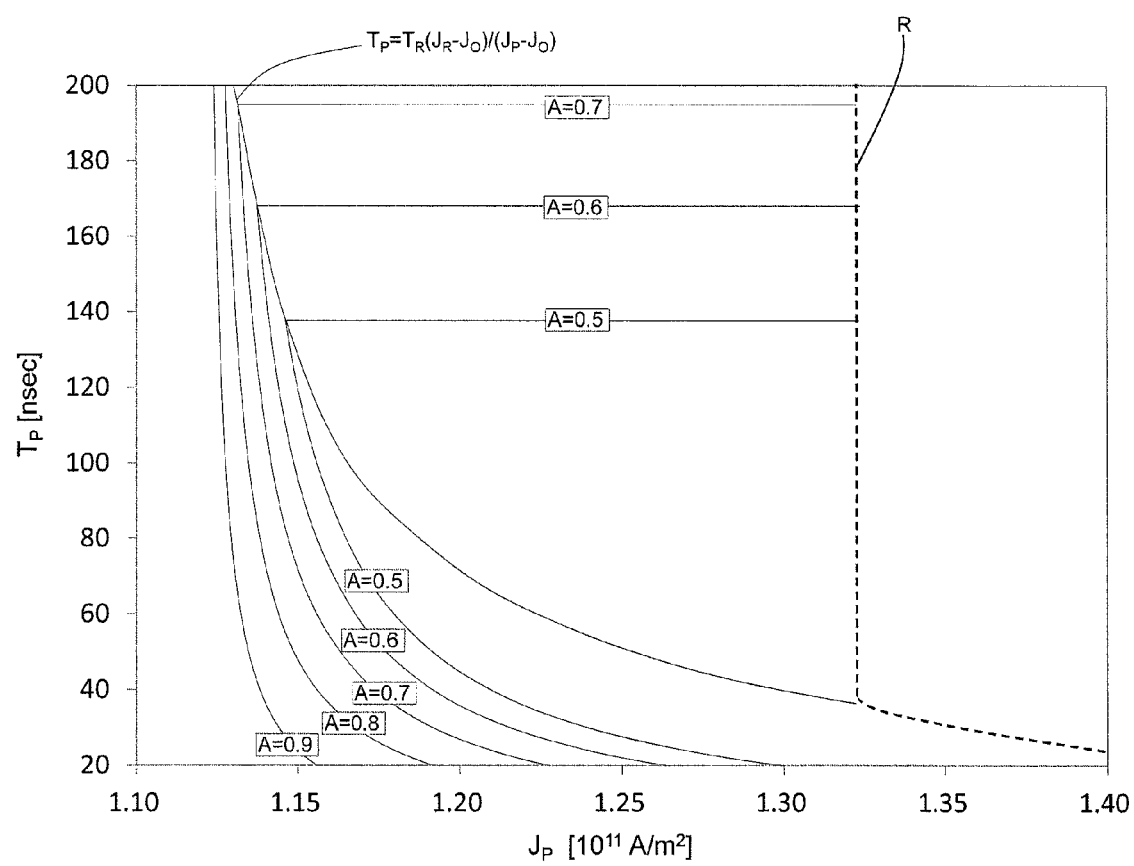
FIG. 13 is a graph representing formulae (20) and (21) with respect to the rise time of the oscillation in the magnetoresistive effect element according to Simulation Example 1.
Figure 14:
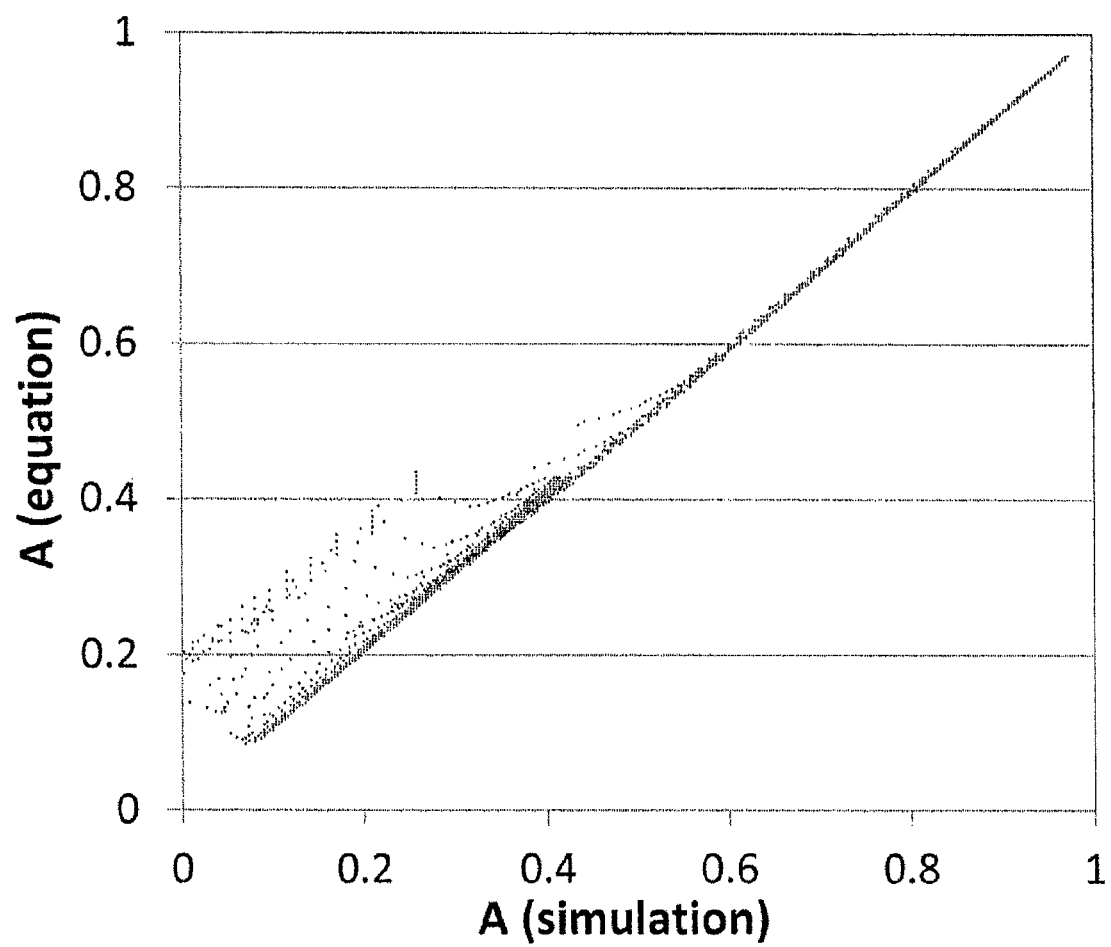
FIG. 14 is a graph depicting correlation between the simulation result and the formulae (20) and (21) with respect to the rise time of the oscillation in the magnetoresistive effect element according to Simulation Example 1.

A simulation was performed on the ratio A while the conditions of the pulse current ($J_P$, $T_P$) applied to the magnetoresistive effect element 112 were changed. FIG. 12 depicts a graph plotting a relation between $J_P$ and $T_P$, at which A is kept constant, for each of five different values of A (A=0.5 to 0.9). A region on the right side of a dotted line R is a region where the magnetoresistive effect element 112 causes the magnetization reversal with the pulse current. FIG. 13 is a graph representing the equations (20) and (21). Comparing FIGS. 12 and 13, both the graphs are substantially identical. FIG. 14 is a graph depicting correlation between A determined with the simulation and A determined from the equations (20) and (21). As seen from FIG. 14, a correlation factor is substantially 1.

From the equation (18), the condition of $T_P$ under which the ratio of the rise time of the oscillation in the magnetoresistive effect element 112 to Two is not more than A when the formula (2) is satisfied is expressed by the following formula (22).

$$T_P \geq \frac{(1-A)T_{NORM}T_R(J_R - J_O)}{T_{NORM}(J_P - J_O) - T_R(J_R - J_O)} \qquad (22)$$

Furthermore, from the equation (19), the condition of $T_P$ under which the ratio of the rise time of the oscillation in the magnetoresistive effect element 112 to $T_{NO}W$ is not more than A when the formula (2) is not satisfied is expressed by the following formula (23).

$$T_P \leq AT_{NORM} \qquad (23)$$

Thus, from the formulae (22) and (23), the condition of $T_P$ under which the ratio of the rise time of the oscillation in the magnetoresistive effect element 112 to $T_{NORM}$ is not more than A is expressed by the following formula (24).

$$\frac{(1-A)T_{NORM}T_R(J_R - J_O)}{T_{NORM}(J_P - J_O) - T_R(J_R - J_O)} \leq T_P \leq AT_{NORM} \qquad (24)$$

Moreover, the following formula (25) is obtained from the formulae (17) and (24).

$$\frac{(1-A)T_R(J_R - J_O)}{J_P - J_S} \leq T_P \leq \frac{AT_R(J_R - J_O)}{J_S - J_O} \qquad (25)$$

For example, by applying the pulse current ($J_P$, $T_P$) to the magnetoresistive effect element 112 so as to satisfy the range expressed by the formula (1) that is resulted from assigning 0.9 to A in the formula (25), the rise time of the oscillation in the magnetoresistive effect element 112 can be shortened to 90% or below of $T_{NORM}$.

As another example, by applying the pulse current ($J_P$, $T_P$) to the magnetoresistive effect element 112 so as to satisfy the range expressed by the following formula (5) that is resulted from assigning 0.75 to A in the formula (25), the rise time of the oscillation in the magnetoresistive effect element 112 can be shortened to 75% or below of $T_{NORM}$.

$$\frac{0.25 \times T_R(J_R - J_O)}{J_P - J_S} < T_P < 0.75 \times T_R \frac{J_R - J_O}{J_S - J_O} \qquad (5)$$

As still another example, by applying the pulse current ($J_P$, $T_P$) to the magnetoresistive effect element 112 so as to satisfy the range expressed by the following formula (6) that is resulted from assigning 0.5 to A in the formula (25), the rise time of the oscillation in the magnetoresistive effect element 112 can be shortened to 50% or below of $T_{NORM}$.

$$\frac{0.5 \times T_R(J_R - J_O)}{J_P - J_S} < T_P < 0.5 \times T_R \frac{J_R - J_O}{J_S - J_O} \qquad (6)$$

As still another example, by applying the pulse current ($J_P$, $T_P$) to the magnetoresistive effect element 112 so as to satisfy the range of the following formula (7) that is resulted from assigning 0.25 to A in the formula (25), the rise time of the oscillation in the magnetoresistive effect element 112 can be shortened to 25% or below of $T_{NORM}$.

$$\frac{0.75 \times T_R(J_R - J_O)}{J_P - J_S} < T_P < 0.25 \times T_R \frac{J_R - J_O}{J_S - J_O} \qquad (7)$$

Figure 15:
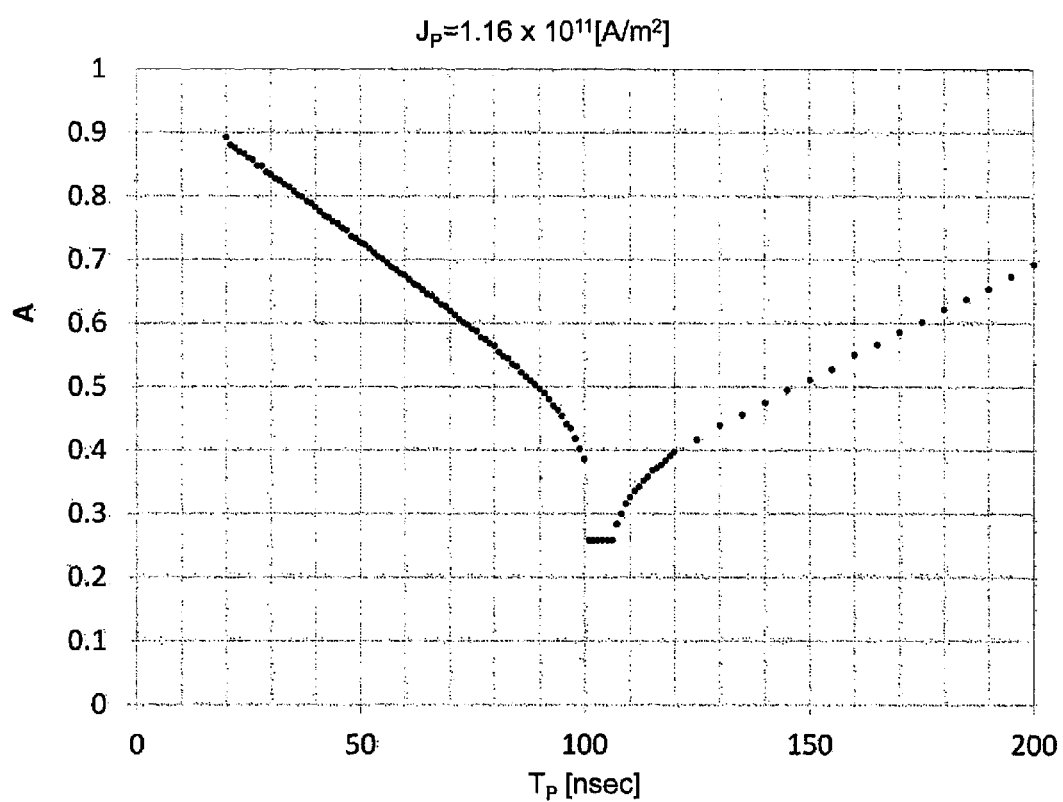
FIG. 15 is a graph depicting a simulation result with respect to the rise time of the oscillation in the magnetoresistive effect element according to Simulation Example 1.
Figure 16:
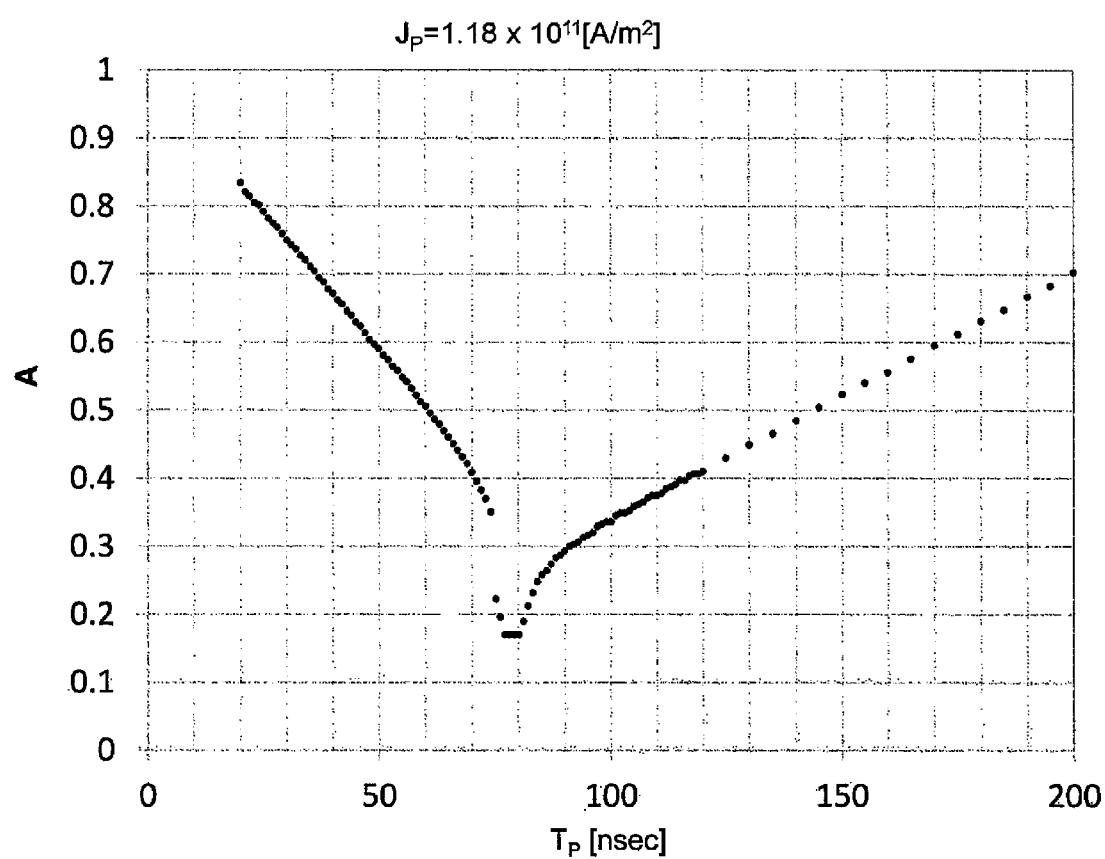
FIG. 16 is a graph depicting a simulation result with respect to the rise time of the oscillation in the magnetoresistive effect element according to Simulation Example 1.
Figure 17:
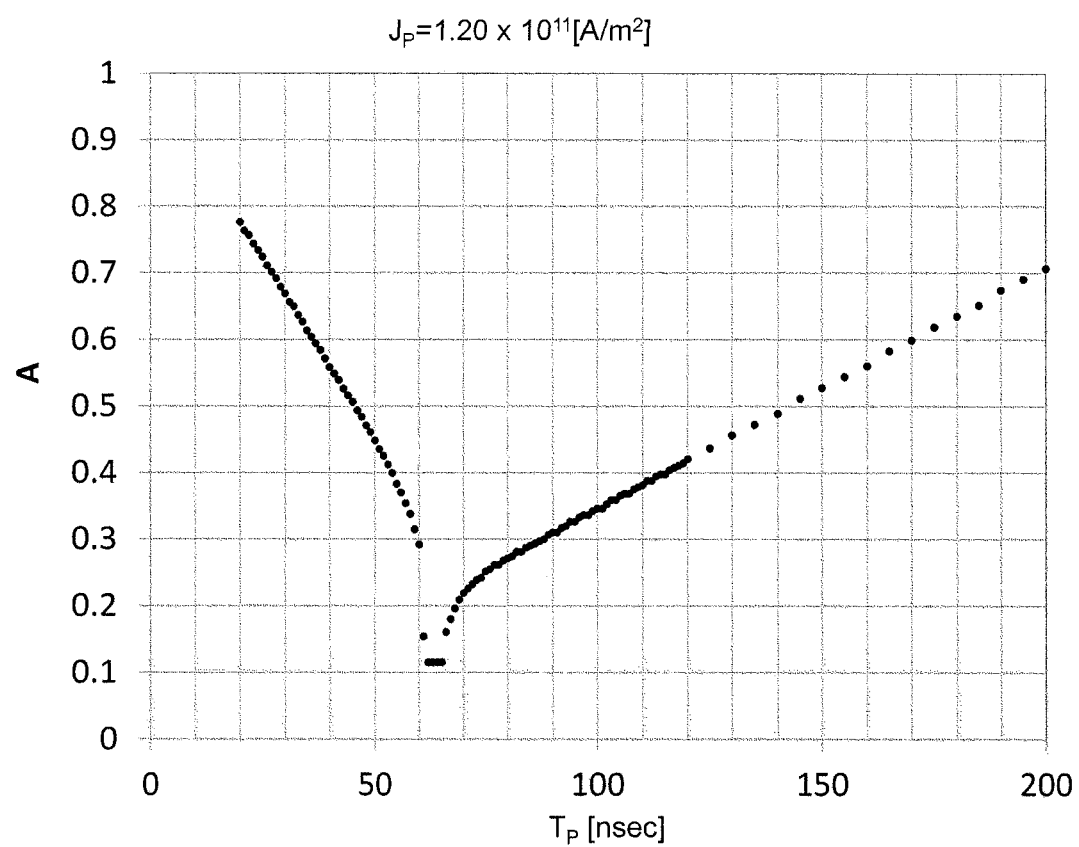
FIG. 17 is a graph depicting a simulation result with respect to the rise time of the oscillation in the magnetoresistive effect element according to Simulation Example 1.
Figure 18:
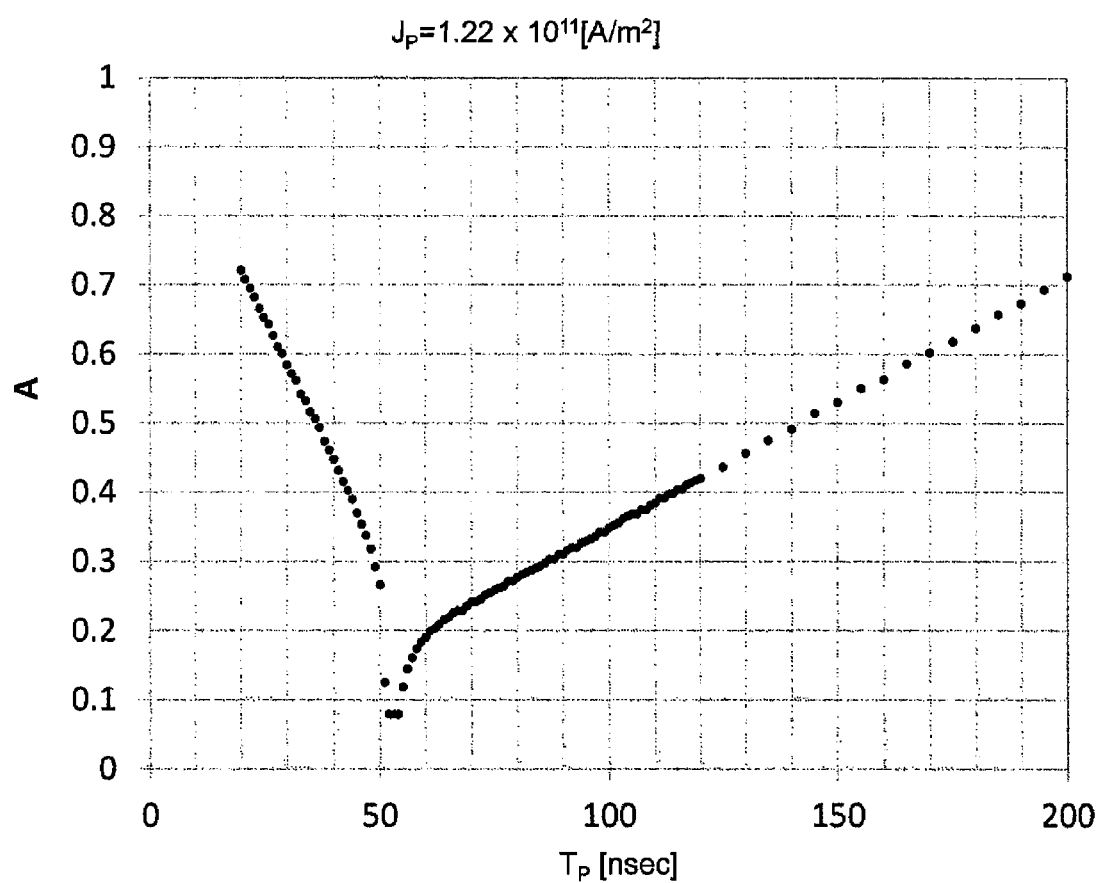
FIG. 18 is a graph depicting a simulation result with respect to the rise time of the oscillation in the magnetoresistive effect element according to Simulation Example 1.
Figure 19:
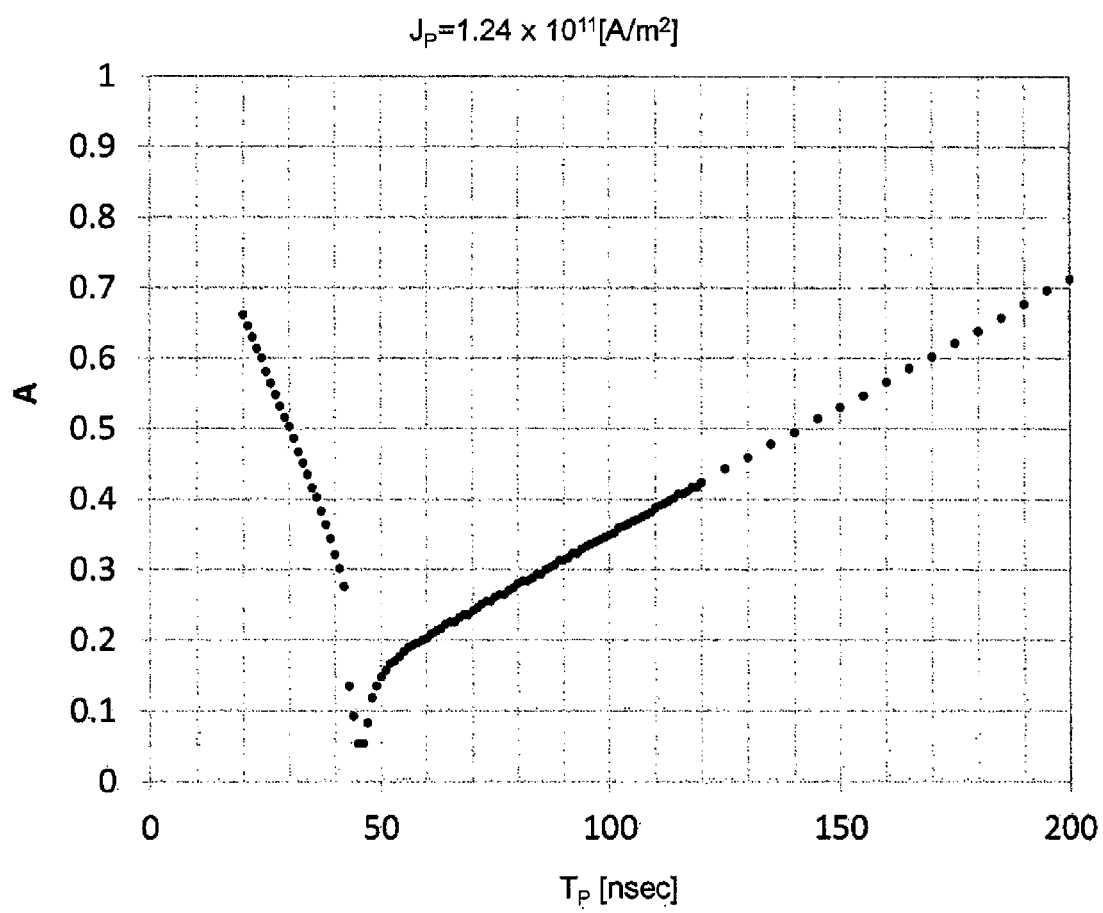
FIG. 19 is a graph depicting a simulation result with respect to the rise time of the oscillation in the magnetoresistive effect element according to Simulation Example 1.
Figure 20:
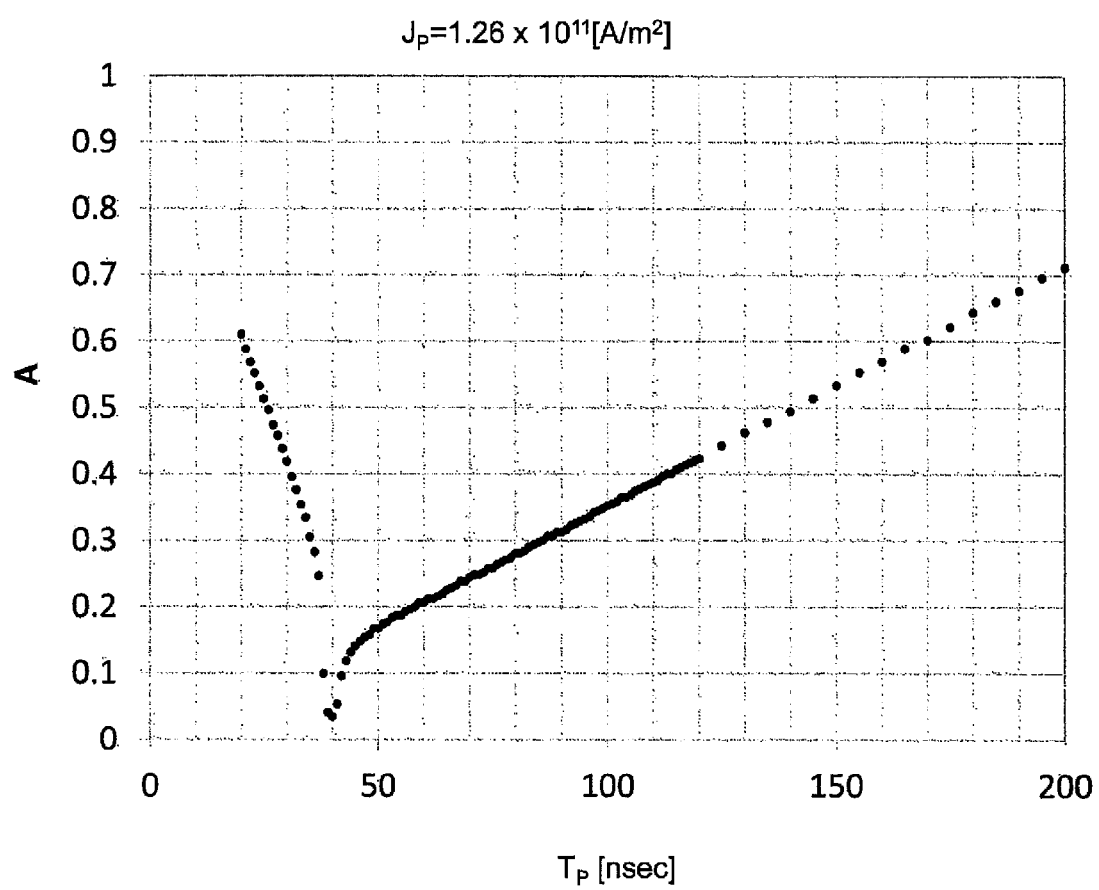
FIG. 20 is a graph depicting a simulation result with respect to the rise time of the oscillation in the magnetoresistive effect element according to Simulation Example 1.
Figure 21:
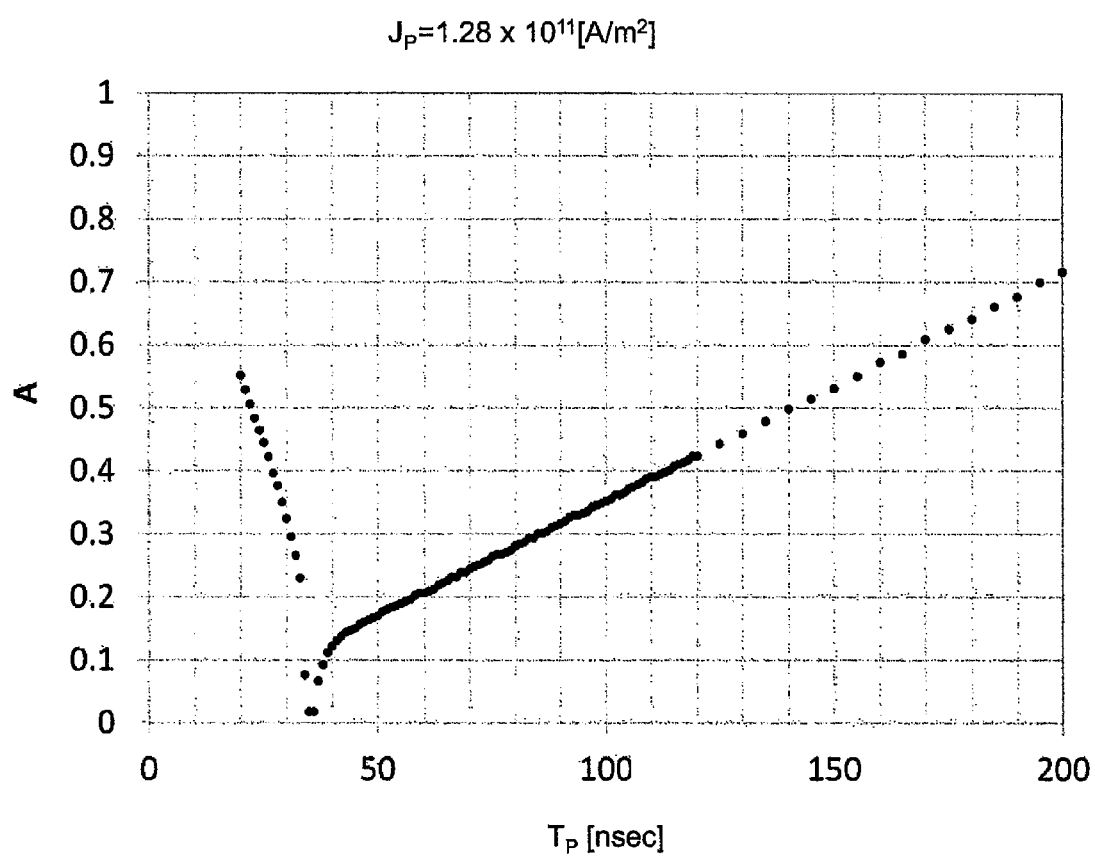
FIG. 21 is a graph depicting a simulation result with respect to the rise time of the oscillation in the magnetoresistive effect element according to Simulation Example 1.
Figure 22:
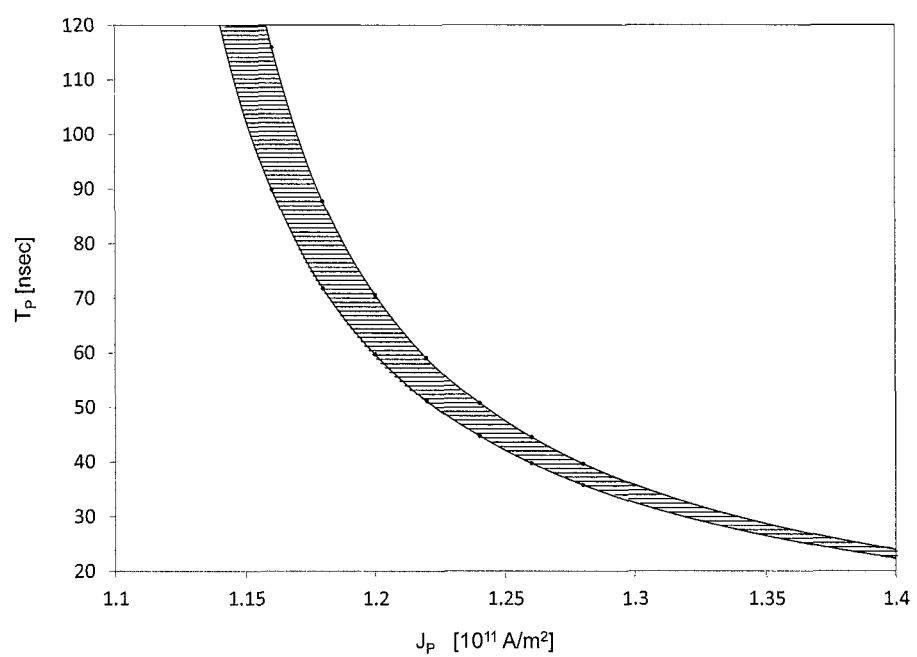
FIG. 22 is a graph depicting a range of a pulse current applied to the magnetoresistive effect element according to Simulation Example 1, the range being expressed by a formula (8).

In addition, as a result of studying in detail a region in FIG. 12 between a curve obtained by putting A=0.5 in the equation (20) and the region where the magnetoresistive effect element 112 causes the magnetization reversal, the inventors found that there exists a region where the shortening rate of the rise time of the oscillation is larger than a value estimated from the equation (20). A plurality of points plotted on the upper side of a linear line given by A (equation)=A (simulation) in FIG. 14 correspond to the above-mentioned region. FIG. 15 depicts a result of a simulation performed on the ratio A while $J_P$ is fixed to $J_P$=1.16×10$^{11}$ [A/m$^2$] and $T_P$ is changed. A is significantly reduced in a $T_P$ range of 90 nsec to 116 nsec. FIG. 16 depicts a result in the case of $J_P$=1.18×10$^{11}$ [A/m$^2$]. In FIG. 16, A is significantly reduced in a $T_P$ range of 70 nsec to 88 nsec. FIG. 17 depicts a result in the case of $J_P$=1.20×10$^{11}$ [A/m$^2$]. In FIG. 17, A is significantly reduced in a $T_P$ range of 60 nsec to 70 nsec. FIG. 18 depicts a result in the case of $J_P$=1.22×10$^{11}$ [A/m$^2$]. In FIG. 18, A is significantly reduced in a $T_P$ range of 52 nsec to 60 nsec. FIG. 19 depicts a result in the case of $J_P$=1.24×10$^{11}$ [A/m$^2$]. In FIG. 19, A is significantly reduced in a $T_P$ range of 44 nsec to 51 nsec. FIG. 20 depicts a result in the case of $J_P$=1.26×10$^{11}$ [A/m$^2$]. In FIG. 20, A is significantly reduced in a $T_P$ range of 40 nsec to 45 nsec. FIG. 21 depicts a result in the case of $J_P$=1.28×10$^{11}$ [A/m$^2$]. In FIG. 21, A is significantly reduced in a $T_P$ range of 36 nsec to 40 nsec. As a result of fitting to the above-mentioned $T_P$ ranges, it was found that a conditional formula for $T_P$ at which the ratio A is significantly reduced is expressed by the following formula (8). FIG. 22 is a graph representing the ranges of $T_P$ and $J_P$ given by the formula (8) together with plotting of the simulation results for upper and lower limits of the $T_P$ range.

$$\frac{0.96 \times T_R(J_R - J_O)}{(J_P - 0.96 J_S)} \le T_P \le \frac{0.98 \times T_R(J_R - J_O)}{(J_P - 0.98 J_S)} \qquad (8)$$

Thus, by applying the pulse current ($J_P$, $T_P$), which satisfies the formula (8), to the magnetoresistive effect element 112, the rise time of the oscillation in the magnetoresistive effect element 112 can be significantly shortened.

Simulation Example 2

In Simulation Example 2, the material of the second magnetic layer 102 in the magnetoresistive effect element 112 according to Simulation Example 1 was changed to Ni$_{90}$Fe$_{10}$ with saturated magnetization Ms=6.57×10$^5$ [A/m] and H$_K$=35.4×10$^3$ [A/m]. Moreover, a current flowing in the positive direction and having the current density $J_S$=7.8×10$^{10}$ [A/m$^2$] was applied in the second step. A simulation was performed under the same conditions as those in Simulation Example 1 except for the above-described points.

The critical current density $J_O$ for oscillation, the critical current density $J_R$ for magnetization reversal, and the magnetization reversal time $T_R$ of the magnetoresistive effect element 112 according to Simulation Example 2, as well as the rise time $T_{NORM}$ of the oscillation in the magnetoresistive effect element 112 according to Simulation Example 2 when only the second step was executed with omission of the first step were determined in the same manners as those in Simulation Example 1. Table 2 lists the simulation results.

TABLE 2

| Symbol | Value | Unit |
|---|---|---|
| $J_O$ | 7.7 × 10$^{10}$ | A/m$^2$ |
| $J_R$ | 9.0 × 10$^{10}$ | A/m$^2$ |
| $T_R$ | 54.6 | nsec |
| $T_{NORM}$ | 705 | nsec |

Figure 23:
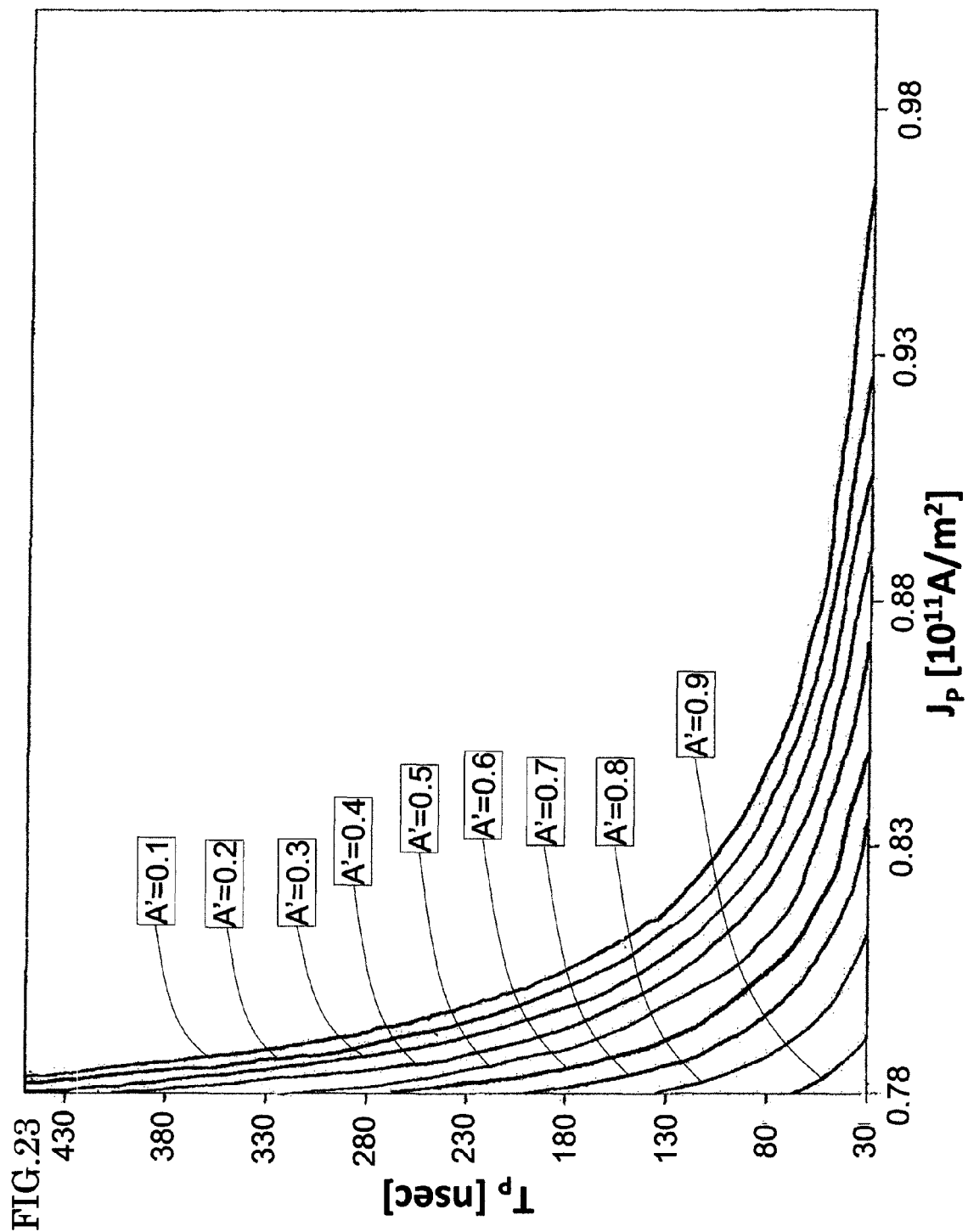
FIG. 23 is a graph depicting a simulation result with respect to a rise time of oscillation in a magnetoresistive effect element according to Simulation Example 2.

The ratio A' of the rise time T'$_{RISE}$ counting from the start time of the second step to $T_{NORM}$ was determined by calculating the rise time of the oscillation while $J_P$ and $T_P$ were changed. FIG. 23 depicts a graph plotting a relation between $J_P$ and $T_P$, at which A' is kept constant, for each of nine different values of A' (A'=0.1 to 0.9). As a result of fitting to the graph of FIG. 23, it was found that the equation (16) is held in Simulation Example 2 as well.

Figure 24:
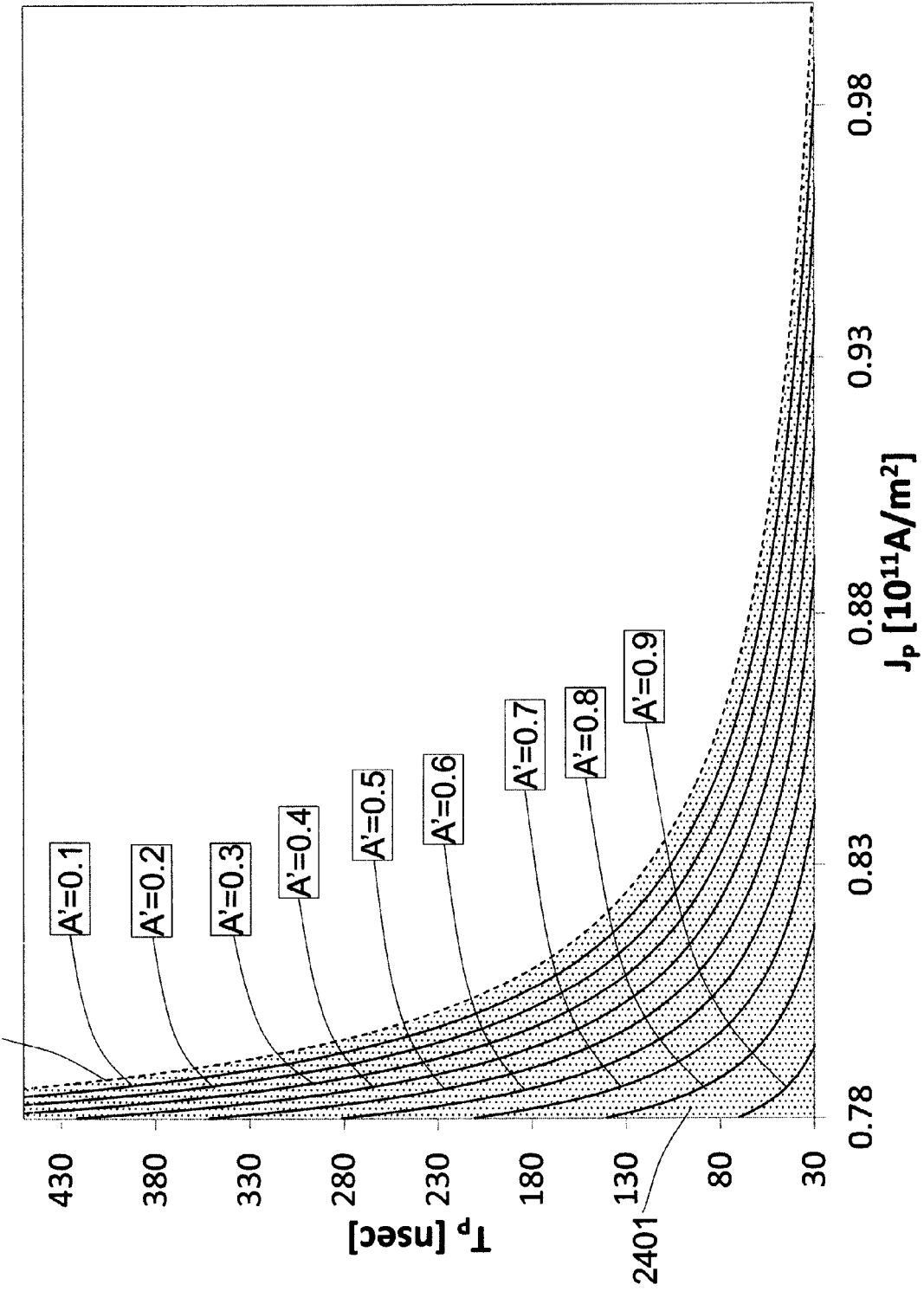
FIG. 24 is a graph representing the equation (16) with respect to the rise time of the oscillation in the magnetoresistive effect element according to Simulation Example 2.
Figure 25:
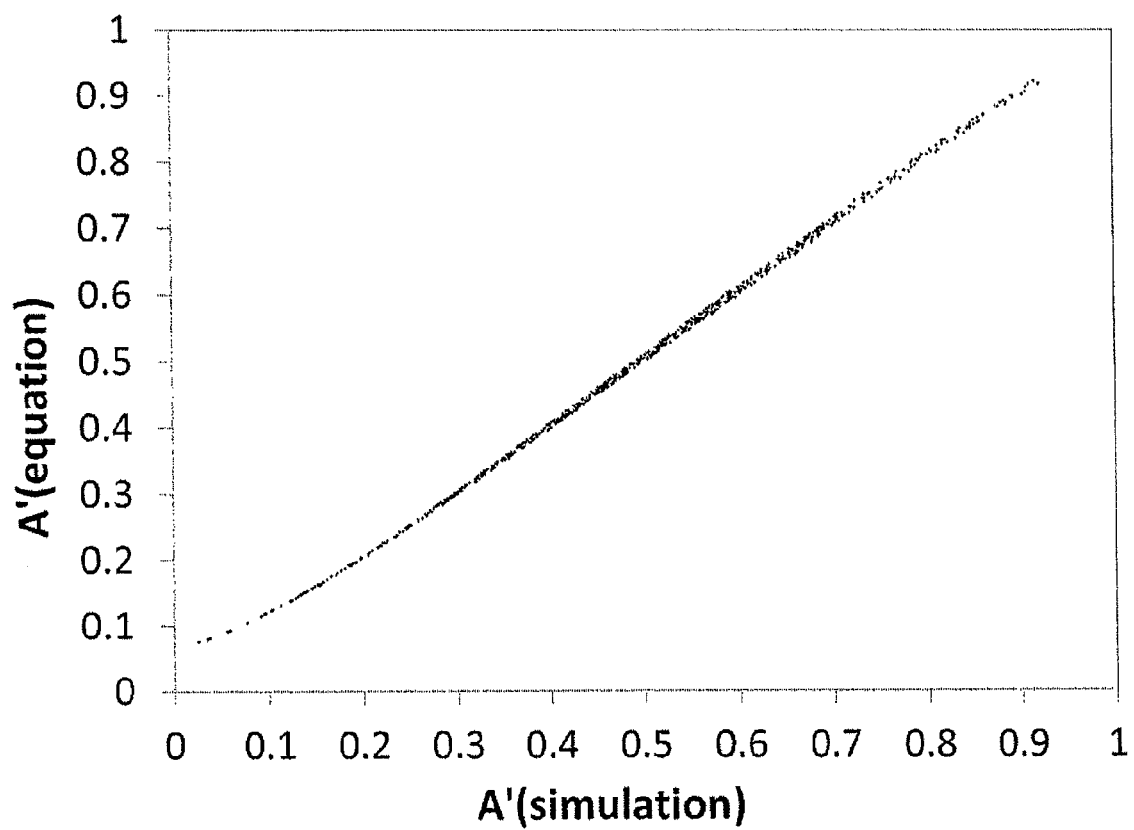
FIG. 25 is a graph depicting correlation between the simulation result and the equation (16) with respect to the rise time of the oscillation in the magnetoresistive effect element according to Simulation Example 2.

FIG. 24 is a graph representing the equation (16). FIGS. 23 and 24 are substantially identical in a region 2401 on the left side of a dotted line $T_P$=$T_R(J_R-J_O)/(J_P-J_O)$ where the formula (2) is satisfied. FIG. 25 is a graph depicting correlation between A' determined with the simulation and A' determined from the equation (16). As seen from FIG. 25, a correlation factor is substantially 1.

Figure 26:
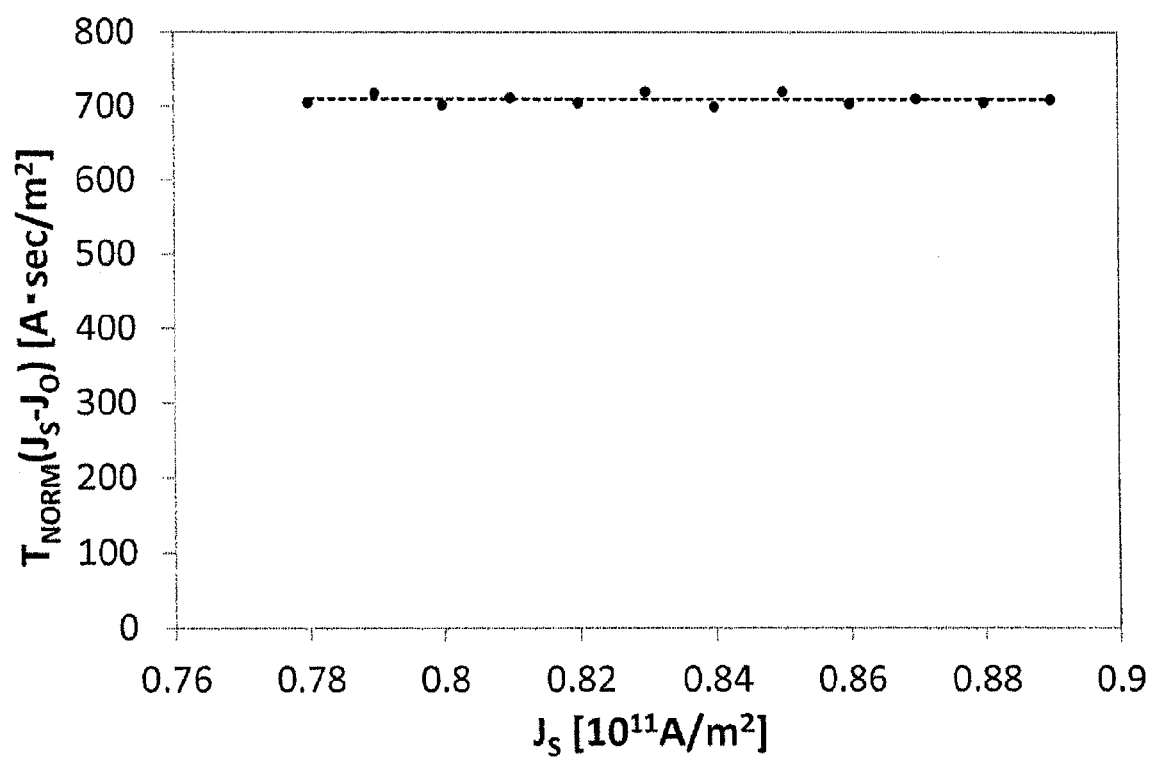
FIG. 26 is a graph depicting a quantity corresponding to energy with respect to the oscillation in the magnetoresistive effect element according to Simulation Example 2.

Furthermore, a simulation was performed on condition of omitting the first step and changing the current density $J_S$. FIG. 26 plots a quantity $T_{NORM}(J_S-J_O)$ corresponding to energy that is necessary to oscillate the magnetoresistive effect element 112 with the application of the current density $J_S$ to the magnetoresistive effect element 112. As a result of fitting to the graph of FIG. 26, it was found that the equation (17) is held in Simulation Example 2 as well. A dotted line in FIG. 26 represents $T_R(J_R-J_O)$.

Figure 27:
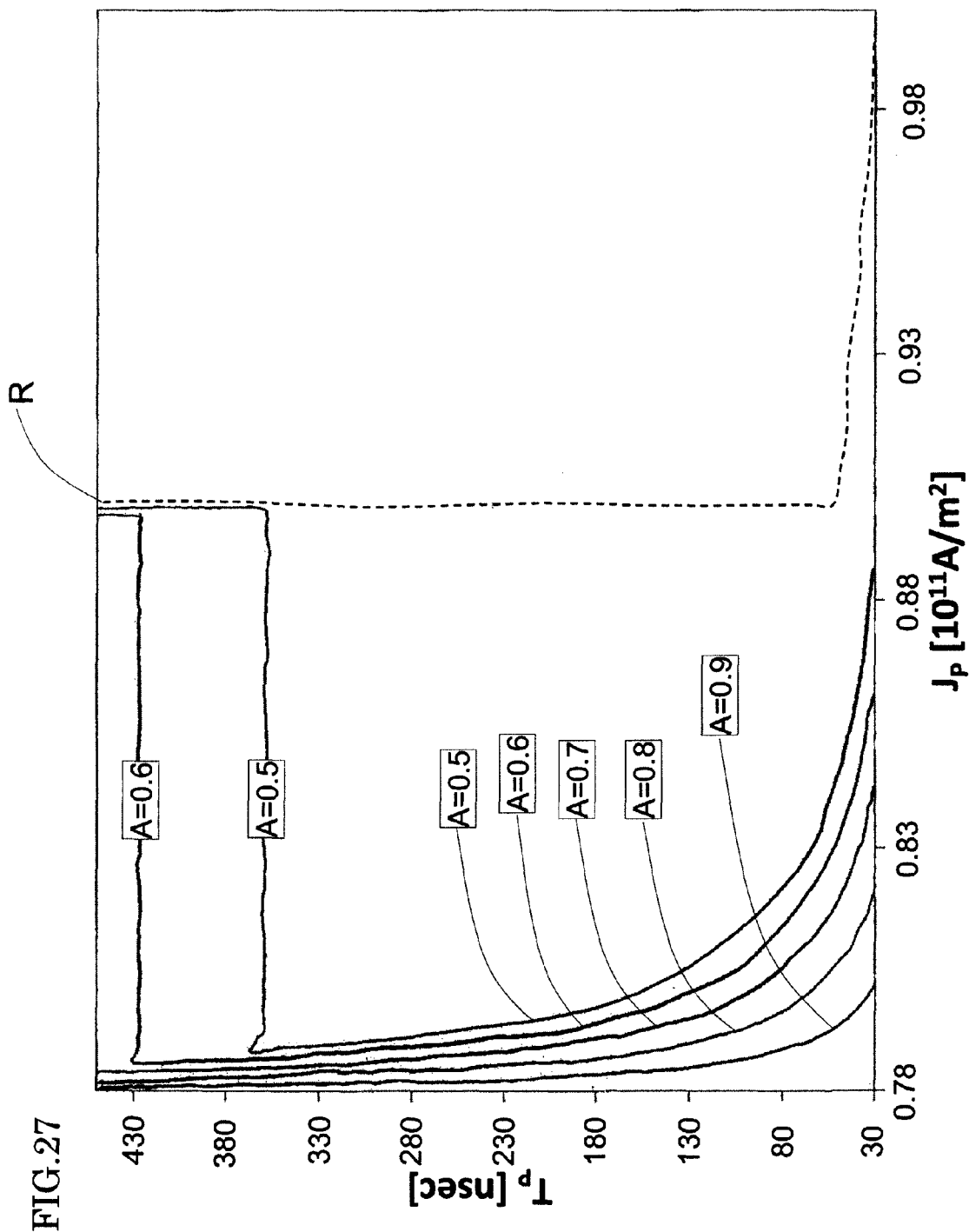
FIG. 27 is a graph depicting a simulation result with respect to the rise time of the oscillation in the magnetoresistive effect element according to Simulation Example 2.
Figure 28:
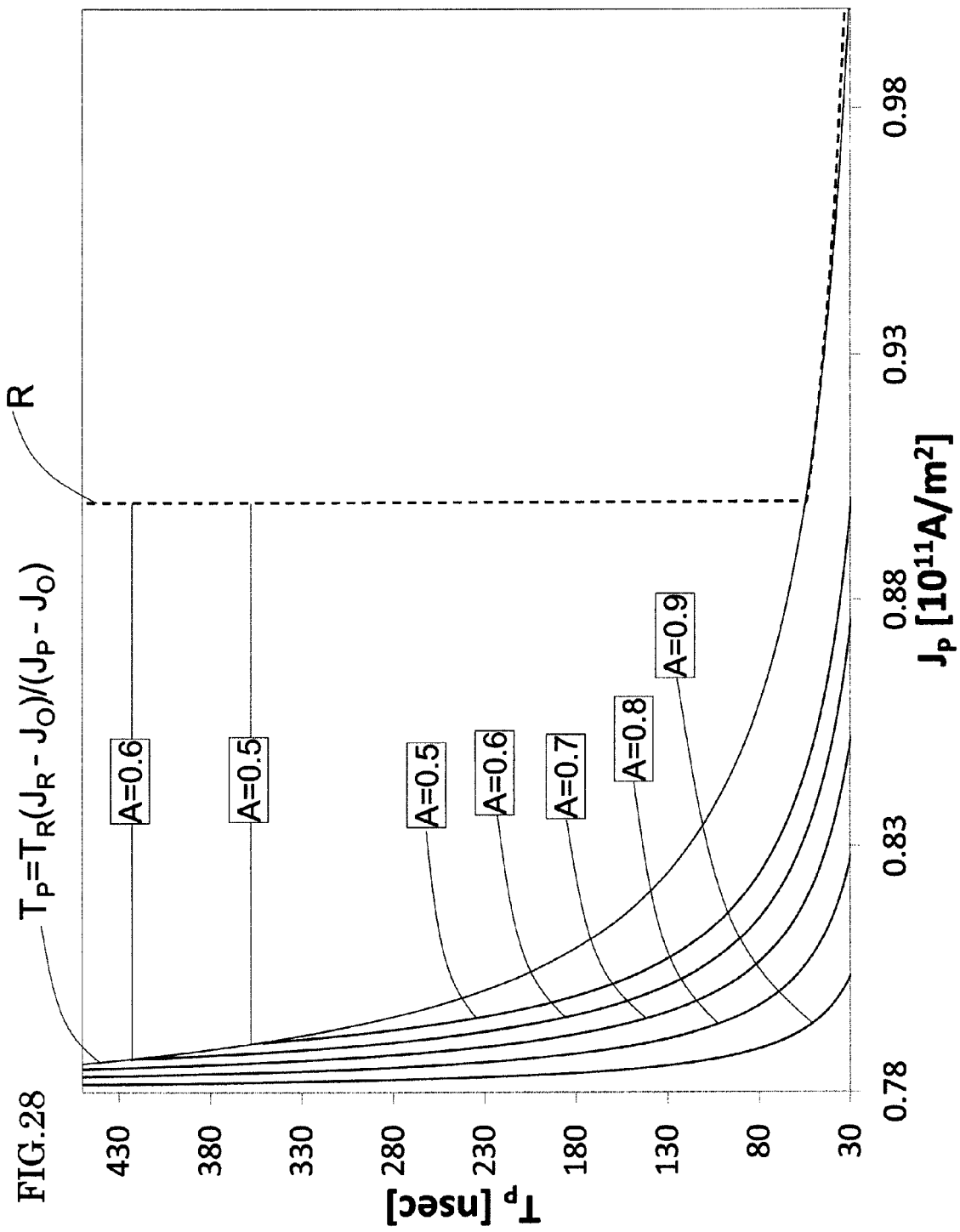
FIG. 28 is a graph representing the equations (20) and (21) with respect to the rise time of the oscillation in the magnetoresistive effect element according to Simulation Example 2.
Figure 29:
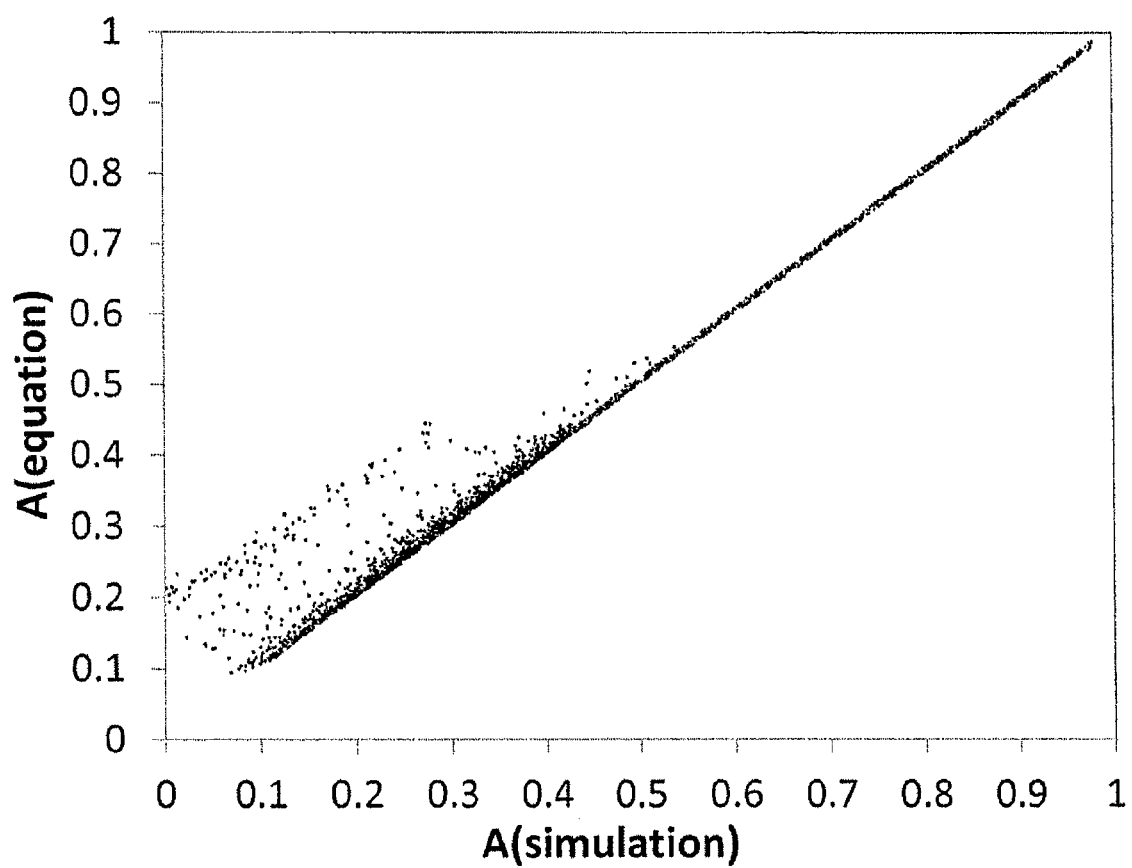
FIG. 29 is a graph depicting correlation between the simulation result and the equations (20) and (21) with respect to the rise time of the oscillation in the magnetoresistive effect element according to Simulation Example 2.

A simulation was further performed on the ratio A while the conditions of the pulse current ($J_P$, $T_P$) applied to the magnetoresistive effect element 112 were changed. FIG. 27 depicts a graph plotting a relation between $J_P$ and $T_P$, at which A is kept constant, for each of five different values of A (A=0.5 to 0.9). A region on the right side of a dotted line R is a region where the magnetoresistive effect element 112 causes the magnetization reversal with the pulse current. FIG. 28 is a graph representing the equations (20) and (21). Comparing FIGS. 27 and 28, both the graphs are substantially identical. FIG. 29 is a graph depicting correlation between A determined with the simulation and A determined from the equations (20) and (21). As seen from FIG. 29, a correlation factor is substantially 1.

Figure 30:
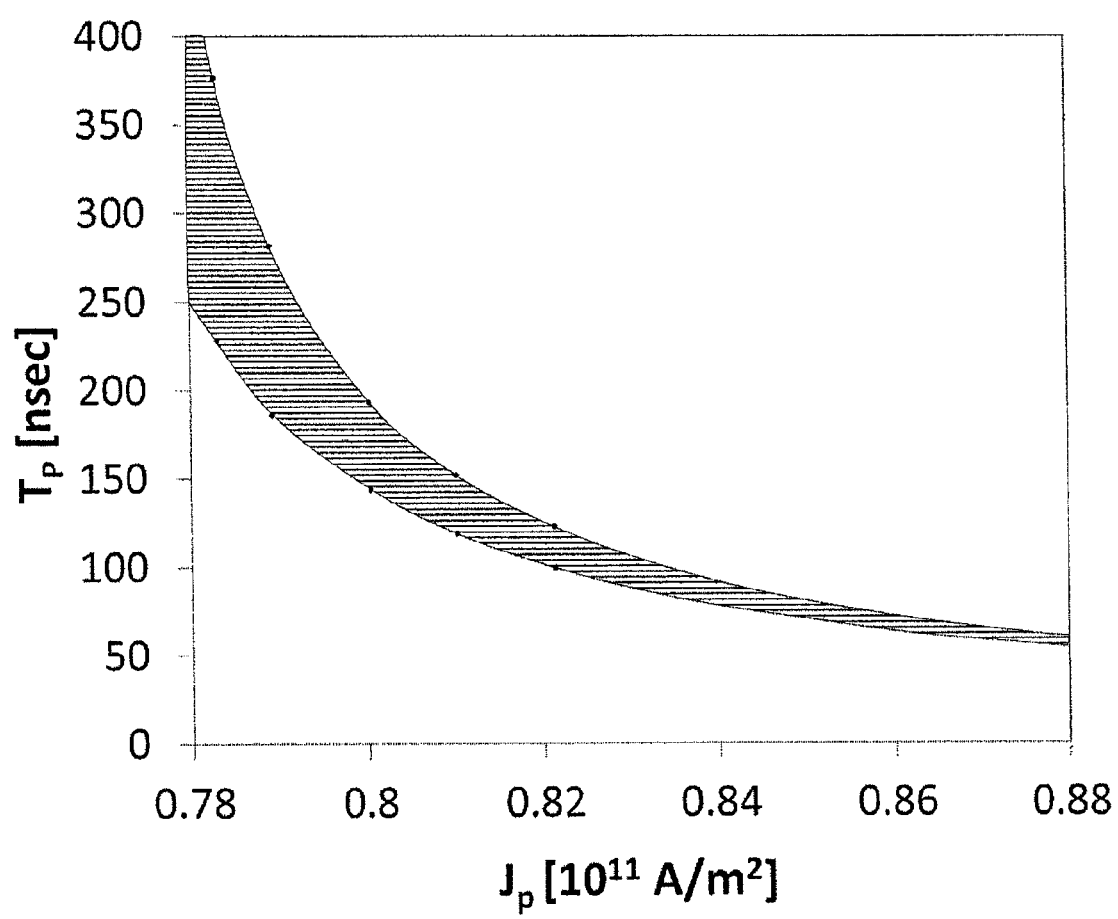
FIG. 30 is a graph depicting a range of a pulse current applied to the magnetoresistive effect element according to Simulation Example 2, the range being expressed by the formula (8).

In addition, as a result of studying in detail a region in FIG. 27 between a curve obtained by putting A=0.5 in the equation (20) and the region where the magnetoresistive effect element 112 causes the magnetization reversal, it was found that there exists, in Simulation Example 2 as well, a region where the shortening rate of the rise time of the oscillation is larger than a value estimated from the equation (20). A plurality of points plotted on the upper side of a linear line given by A (equation)=A (simulation) in FIG. 29 correspond to the above-mentioned region. As a result of determining a $T_P$ range where the ratio A is significantly reduced, and making fitting to the resulted range, it was found as in Simulation Example 1 that, also in Simulation Example 23, a conditional formula for $T_P$ at which the ratio A is significantly reduced is expressed by the formula (8). FIG. 30 is a graph representing the ranges of $T_P$ and $J_P$ given by the formula (8) together with plotting of the simulation results for upper and lower limits of the $T_P$ range where the ratio A is significantly reduced.

Simulation Example 3

In Simulation Example 3, conditions were the same as those in Simulation Example 1 except for the direction of the effective magnetic field in the second magnetic layer 102, and the direction of the current and the magnitude of the current density applied to the magnetoresistive effect element 112. The direction of the effective magnetic field in the second magnetic layer 102 was set to be the same as the magnetization direction of the first magnetic layer 101. Moreover, a current I in the negative direction was applied in the direction perpendicular to the film surface of the magnetoresistive effect element 112.

A current flowing in the negative direction and having the current density $J_S=24.0\times10^{10}$ [A/m$^2$] was applied in the second step.

The critical current density $J_O$ for oscillation, the critical current density $J_R$ for magnetization reversal, and the magnetization reversal time $T_R$ of the magnetoresistive effect element 112 according to Simulation Example 3, as well as the rise time $T_{NORM}$ of the oscillation in the magnetoresistive effect element 112 according to Simulation Example 3 when only the second step was executed with omission of the first step were determined in the same manners as those in Simulation Example 1. Table 3 lists the simulation results.

TABLE 3

| Symbol | Value | Unit |
| --- | --- | --- |
| $J_O$ | 23.8 × 10$^{10}$ | A/m$^2$ |
| $J_R$ | 28 × 10$^{10}$ | A/m$^2$ |
| $T_R$ | 40.5 | nsec |
| $T_{NORM}$ | 854 | nsec |

Figure 31:
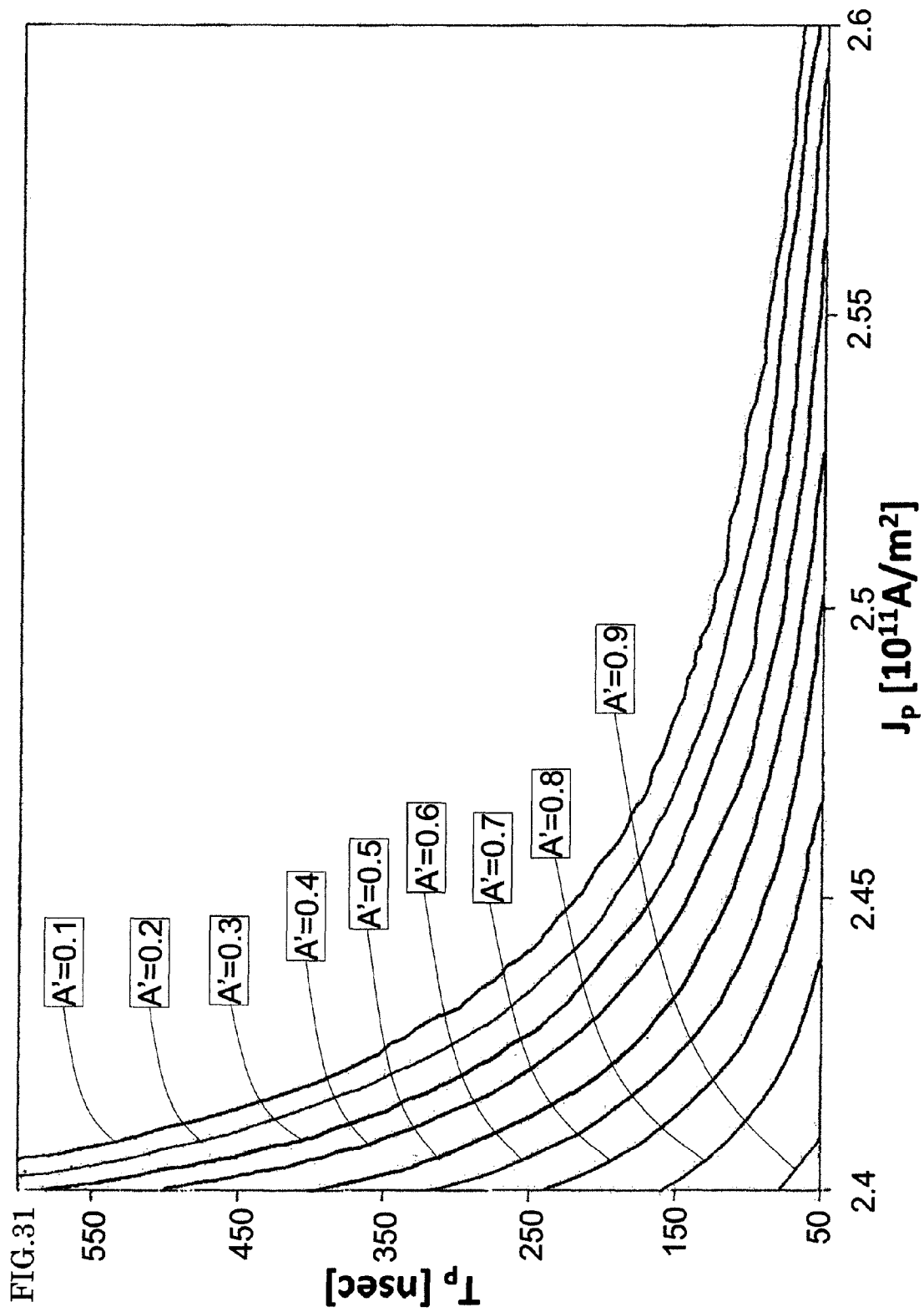
FIG. 31 is a graph depicting a simulation result with respect to a rise time of oscillation in a magnetoresistive effect element according to Simulation Example 3.

The ratio A' of the rise time $T'_{RISE}$ counting from the start time of the second step to $T_{NORM}$ was determined by calculating the rise time of the oscillation while $J_P$ and $T_P$ were changed. FIG. 31 depicts a graph plotting a relation between $J_P$ and $T_P$, at which A' is kept constant, for each of nine different values of A' (A'=0.1 to 0.9). As a result of fitting to the graph of FIG. 31, it was found that the equation (16) is held in Simulation Example 3 as well.

Figure 32:
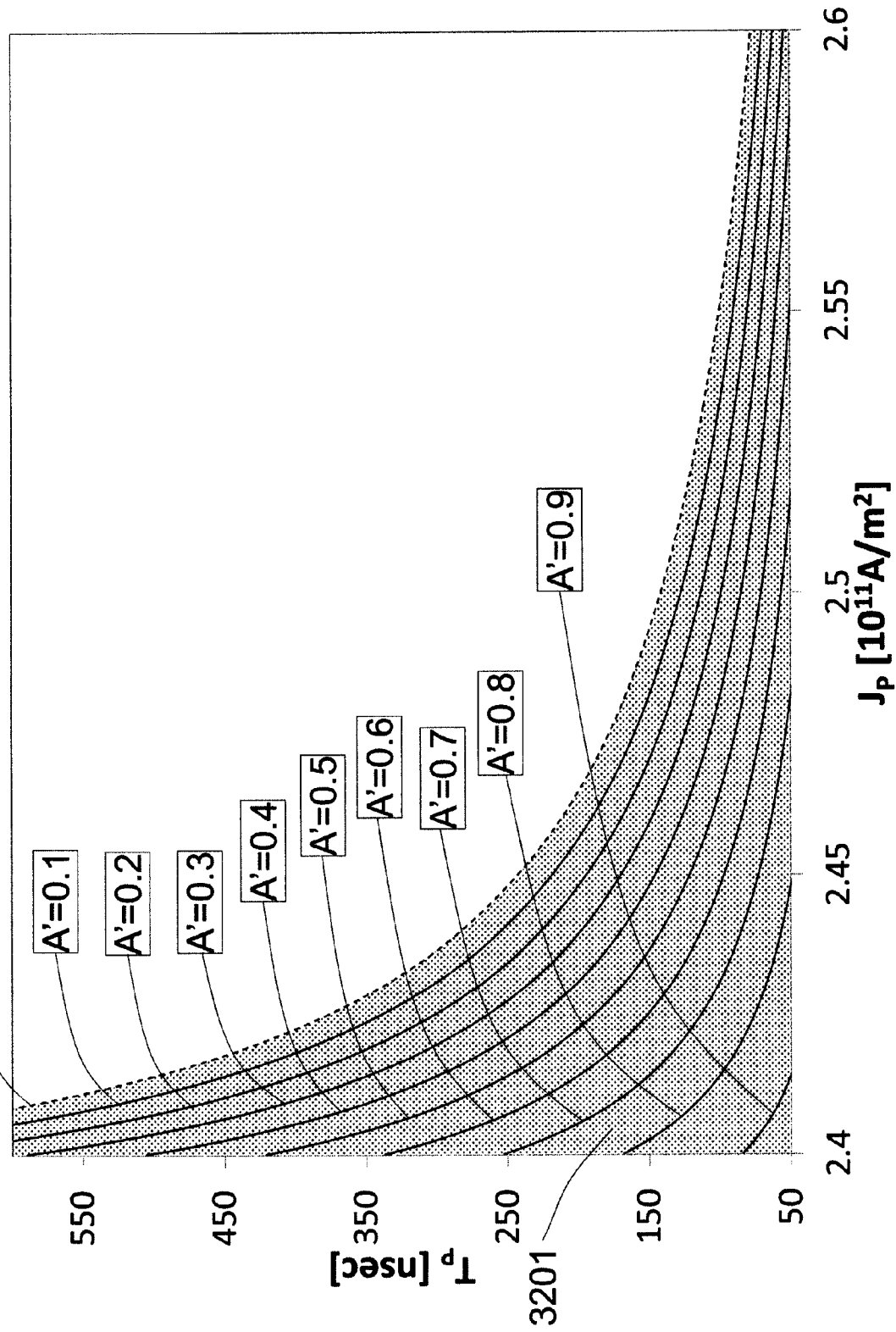
FIG. 32 is a graph representing the equation (16) with respect to the rise time of the oscillation in the magnetoresistive effect element according to Simulation Example 3.
Figure 33:
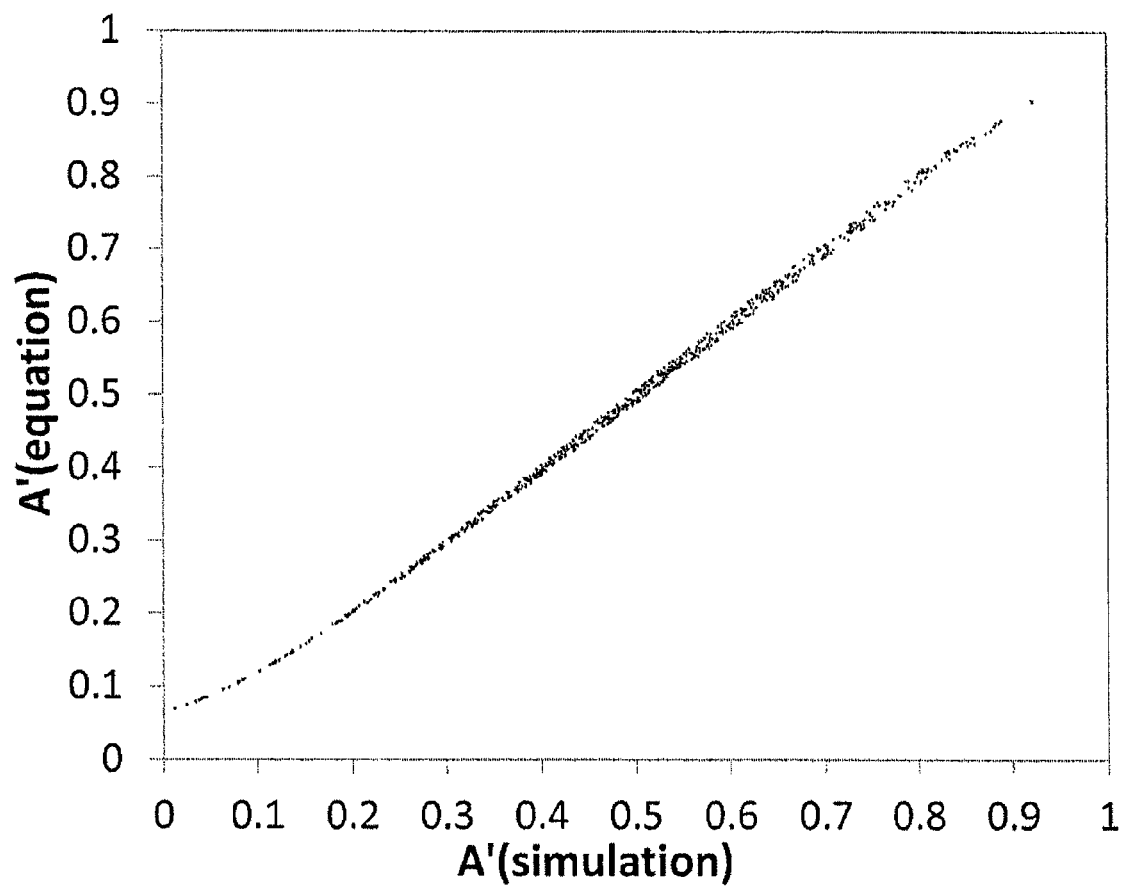
FIG. 33 is a graph depicting correlation between the simulation result and the equation (16) with respect to the rise time of the oscillation in the magnetoresistive effect element according to Simulation Example 3.

FIG. 32 is a graph representing the equation (16). FIGS. 31 and 32 are substantially identical in a region 3201 on the left side of a dotted line $T_P=T_R(J_R-J_O)/(J_P-J_O)$ where the formula (2) is satisfied. FIG. 33 is a graph depicting correlation between A' determined with the simulation and A' determined from the equation (16). As seen from FIG. 33, a correlation factor is substantially 1.

Figure 34:
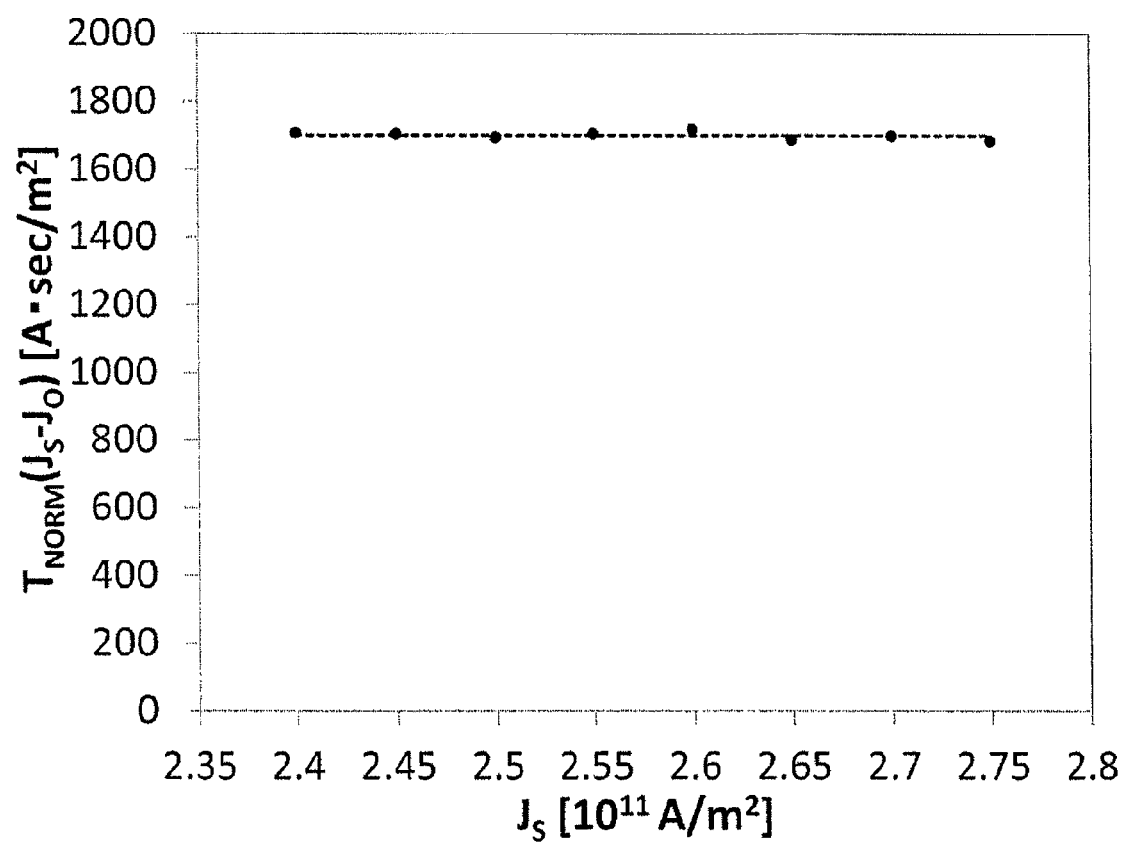
FIG. 34 is a graph depicting a quantity corresponding to energy with respect to the oscillation in the magnetoresistive effect element according to Simulation Example 3.

Furthermore, a simulation was performed on condition of omitting the first step and changing the current density $J_S$. FIG. 34 plots a quantity $T_{NORM}(J_S-J_O)$ corresponding to energy that is necessary to oscillate the magnetoresistive effect element 112 with the application of the current density $J_S$ to the magnetoresistive effect element 112. As a result of fitting to the graph of FIG. 34, it was found that the equation (17) is held in Simulation Example 3 as well. A dotted line in FIG. 34 represents $T_R(J_R-J_O)$.

Figure 35:
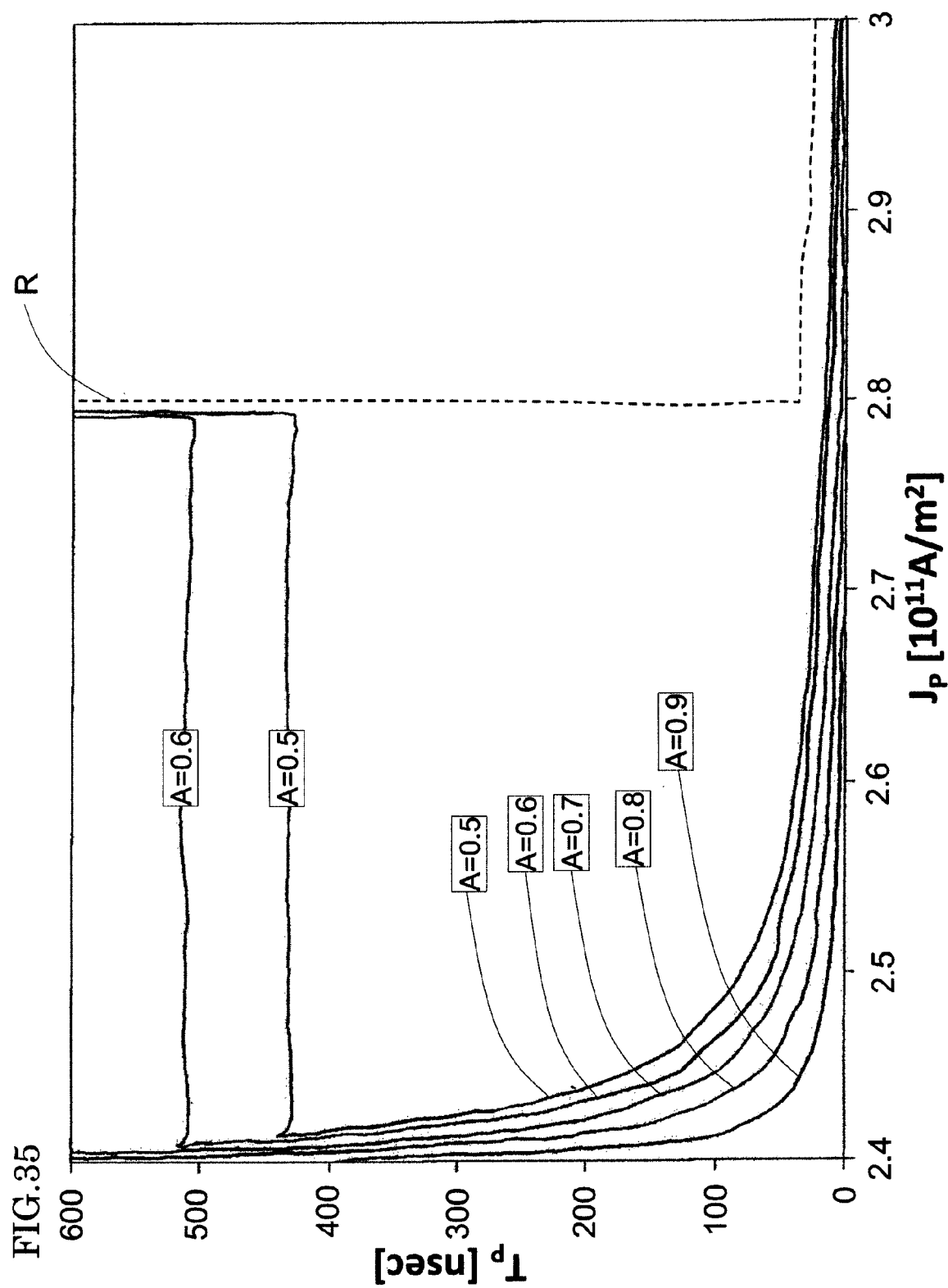
FIG. 35 is a graph depicting a simulation result with respect to the rise time of the oscillation in the magnetoresistive effect element according to Simulation Example 3.
Figure 36:
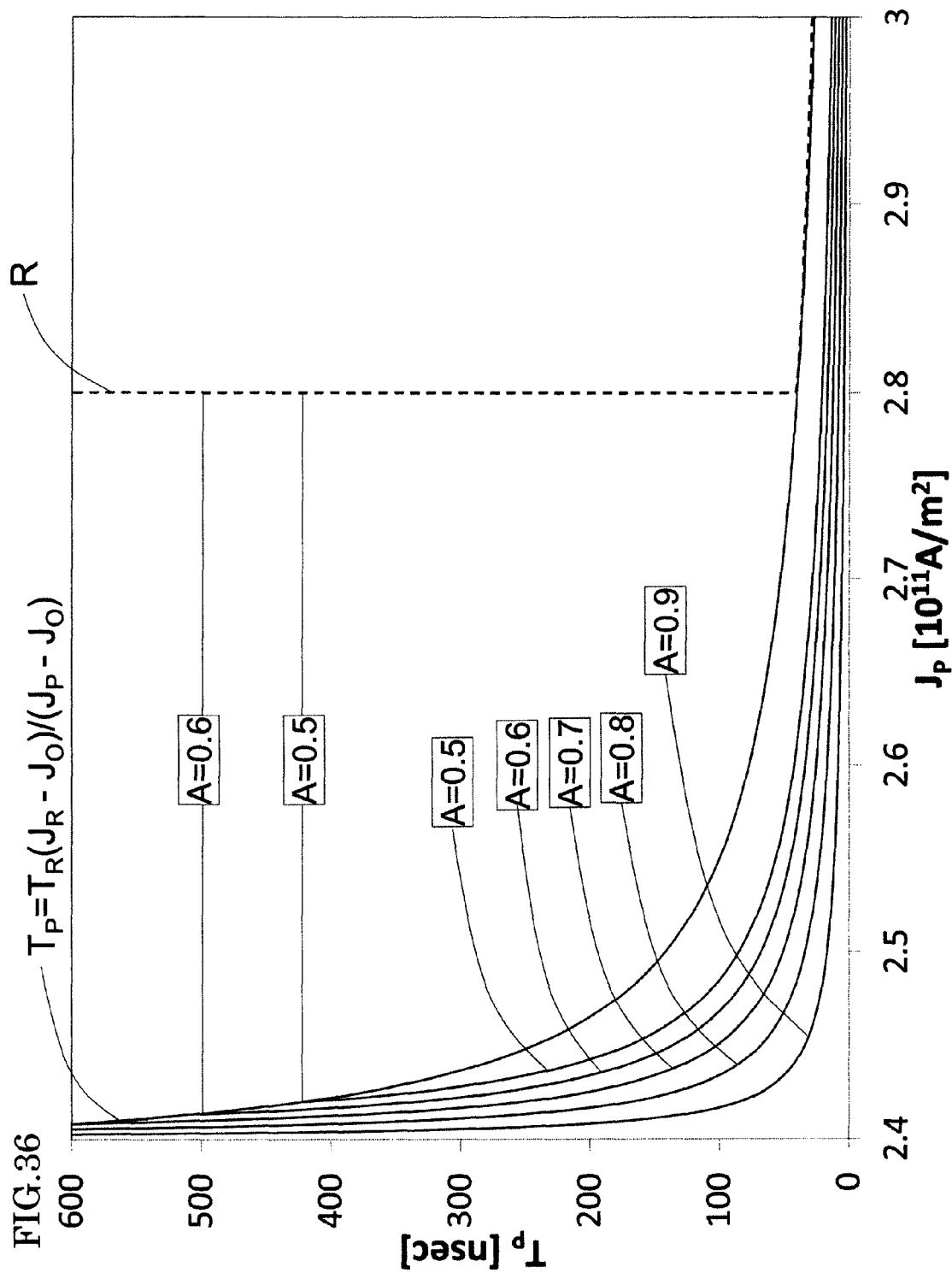
FIG. 36 is a graph representing the equations (20) and (21) with respect to the rise time of the oscillation in the magnetoresistive effect element according to Simulation Example 3.
Figure 37:
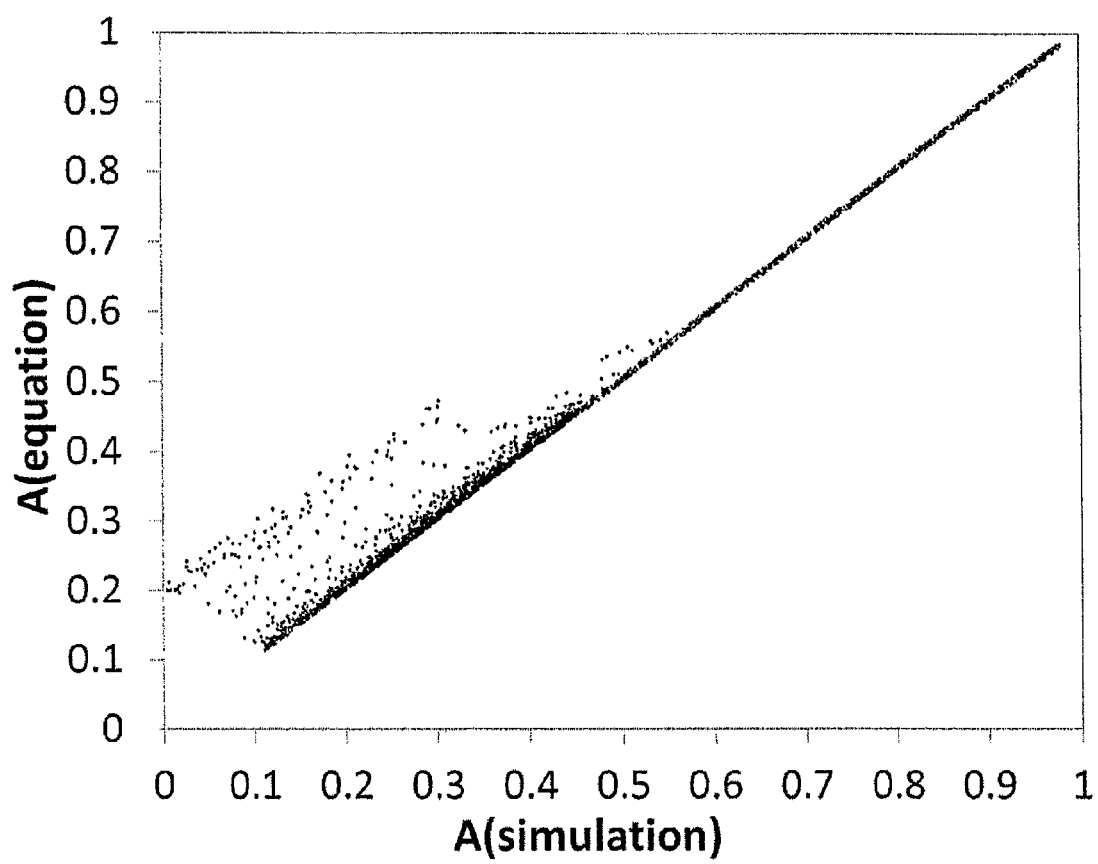
FIG. 37 is a graph depicting correlation between the simulation result and the equations (20) and (21) with respect to the rise time of the oscillation in the magnetoresistive effect element according to Simulation Example 3.

A simulation was further performed on the ratio A while the conditions of the pulse current ($J_P$, $T_P$) applied to the magnetoresistive effect element 112 were changed. FIG. 35 depicts a graph plotting a relation between $J_P$ and $T_P$, at which A is kept constant, for each of five different values of A (A=0.5 to 0.9). A region on the right side of a dotted line R is a region where the magnetoresistive effect element 112 causes the magnetization reversal with the pulse current. FIG. 36 is a graph representing the equations (20) and (21). Comparing FIGS. 35 and 36, both the graphs are substantially identical. FIG. 37 is a graph depicting correlation between A determined with the simulation and A determined from the equations (20) and (21). As seen from FIG. 37, a correlation factor is substantially 1.

Figure 38:
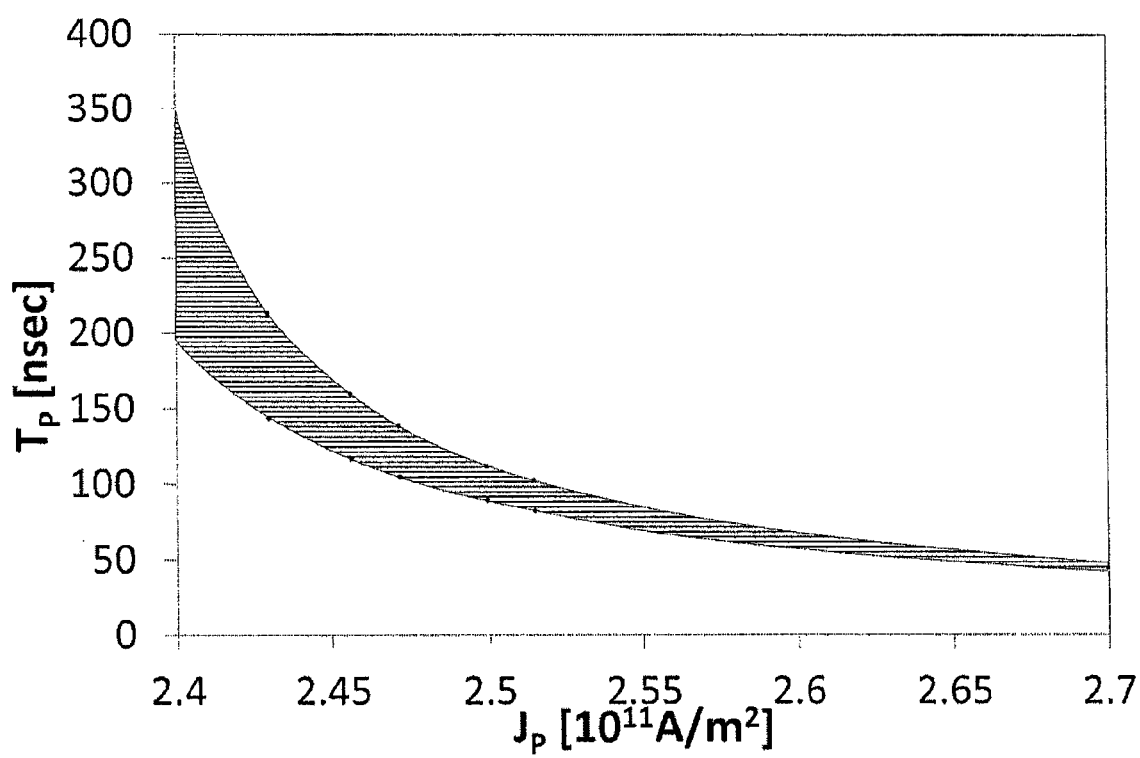
FIG. 38 is a graph depicting a range of a pulse current applied to the magnetoresistive effect element according to Simulation Example 3, the range being expressed by the formula (8).

In addition, as a result of studying in detail a region in FIG. 35 between a curve obtained by putting A=0.5 in the equation (20) and the region where the magnetoresistive effect element 112 causes the magnetization reversal, it was found that there exists, in Simulation Example 3 as well, a region where the shortening rate of the rise time of the oscillation is larger than a value estimated from the equation (20). A plurality of points plotted on the upper side of a linear line given by A (equation)=A (simulation) in FIG. 37 correspond to the above-mentioned region. As a result of determining a $T_P$ range where the ratio A is significantly reduced, and making fitting to the resulted range, it was found as in Simulation Example 1 that, also in Simulation Example 3, a conditional formula for $T_P$ at which the ratio A is significantly reduced is expressed by the formula (8). FIG. 38 is a graph representing the ranges of $T_P$ and $J_P$ given by the formula (8) together with plotting of the simulation results for upper and lower limits of the $T_P$ range where the ratio A is significantly reduced.

Simulation Example 4

In Simulation Example 4, the second magnetic layer 102 had a circular shape with a diameter of 100 nm and a thickness of 2.0 nm. The materials of the first magnetic layer 101 and the second magnetic layer 102 were each CoFeB. The magnetization in the first magnetic layer 101 was fixed in the negative z-axis direction. The material of the spacer layer 103 was MgO as one of nonmagnetic insulators. The second magnetic layer 102 had magnetic shape anisotropy in the z-axis direction, and an anisotropic magnetic field $H_K$ in the z-axis direction was set to 1.2×10$^6$ A/m.

In the initial state before the application of the current to the magnetoresistive effect element 112, the magnetization direction of the second magnetic layer 102 was set to the positive z-axis direction (i.e., a direction antiparallel to the magnetization direction of the first magnetic layer 101). Moreover, a current flowing in the positive direction and having the current density $J_S=6.2\times10^9$ [A/m$^2$] was applied in the second step. A simulation was performed under the same conditions as those in Simulation Example 1 except for the above-described points.

Table 4 lists parameters used in this Simulation Example 4.

TABLE 4

| Symbol | Value | Unit |
| --- | --- | --- |
| γ | 2.2176 × 10$^5$ | m/(A · sec) |
| α | 0.02 | — |
| $H_K$ | 1.2 × 10$^6$ | A/m |
| $M_S$ | 1 × 10$^6$ | A/m |
| P | 0.6 | — |

The critical current density $J_O$ for oscillation, the critical current density $J_R$ for magnetization reversal, and the magnetization reversal time $T_R$ of the magnetoresistive effect element 112 according to Simulation Example 4, as well as the rise time $T_{NORM}$ a of the oscillation in the magnetoresistive effect element 112 according to Simulation Example 4 when only the second step was executed with omission of the first step were determined in the same manners as those in Simulation Example 1. Table 5 lists the simulation results.

TABLE 5

| Symbol | Value | Unit |
| --- | --- | --- |
| $J_O$ | 6.1 × 10$^9$ | A/m$^2$ |
| $J_R$ | 7.0 × 10$^9$ | A/m$^2$ |
| $T_R$ | 50 | nsec |
| $T_{NORM}$ | 447 | nsec |

Figure 39:
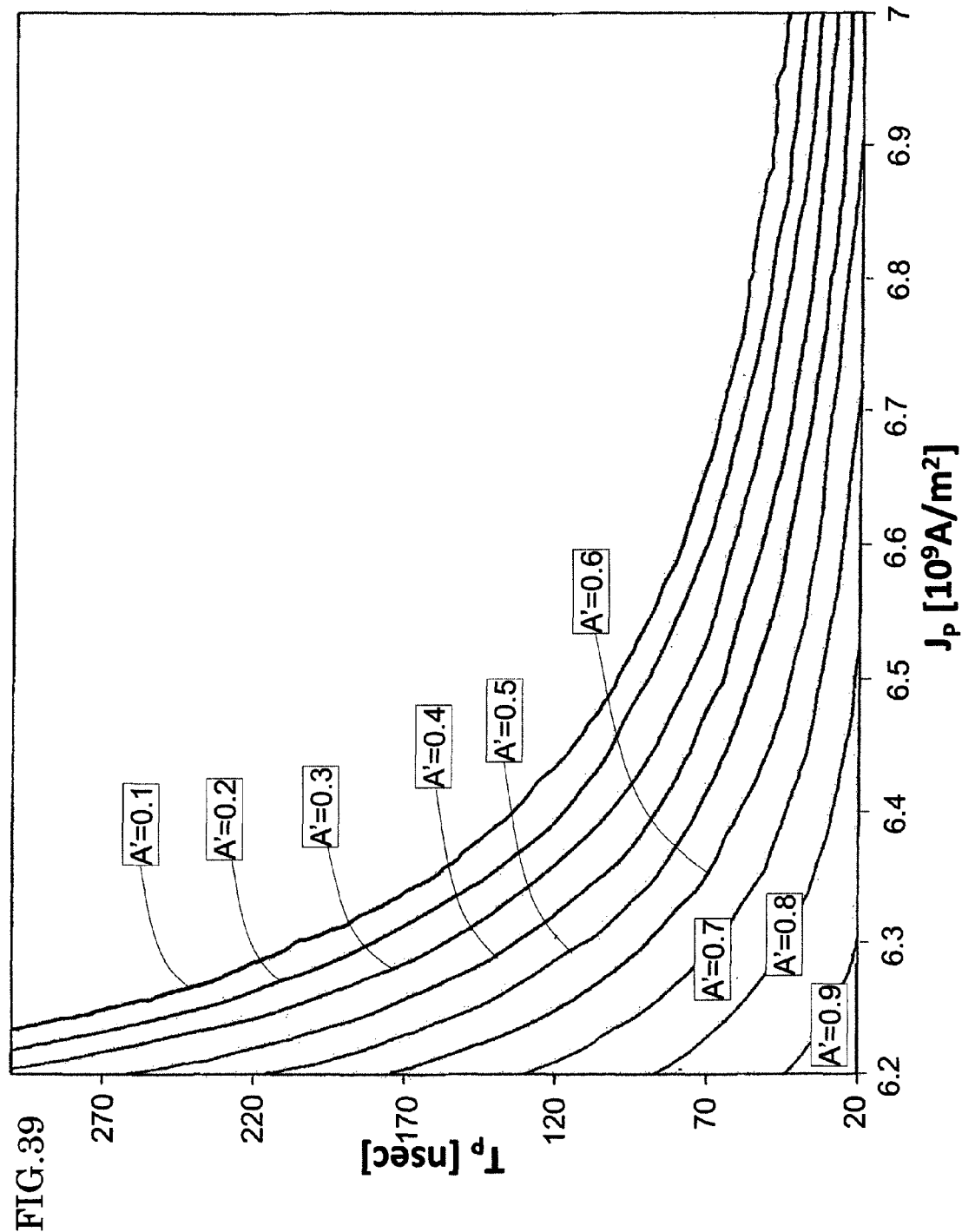
FIG. 39 is a graph depicting a simulation result with respect to a rise time of oscillation in a magnetoresistive effect element according to Simulation Example 4.

The ratio A' of the rise time $T'_{RISE}$ counting from the start time of the second step to $T_{NORM}$ was determined by calculating the rise time of the oscillation while $J_P$ and $T_P$ were changed. FIG. 39 depicts a graph plotting a relation between $J_P$ and $T_P$, at which A' is kept constant, for each of nine different values of A' (A'=0.1 to 0.9). As a result of fitting to the graph of FIG. 39, it was found that the equation (16) is held in Simulation Example 4 as well.

Figure 40:
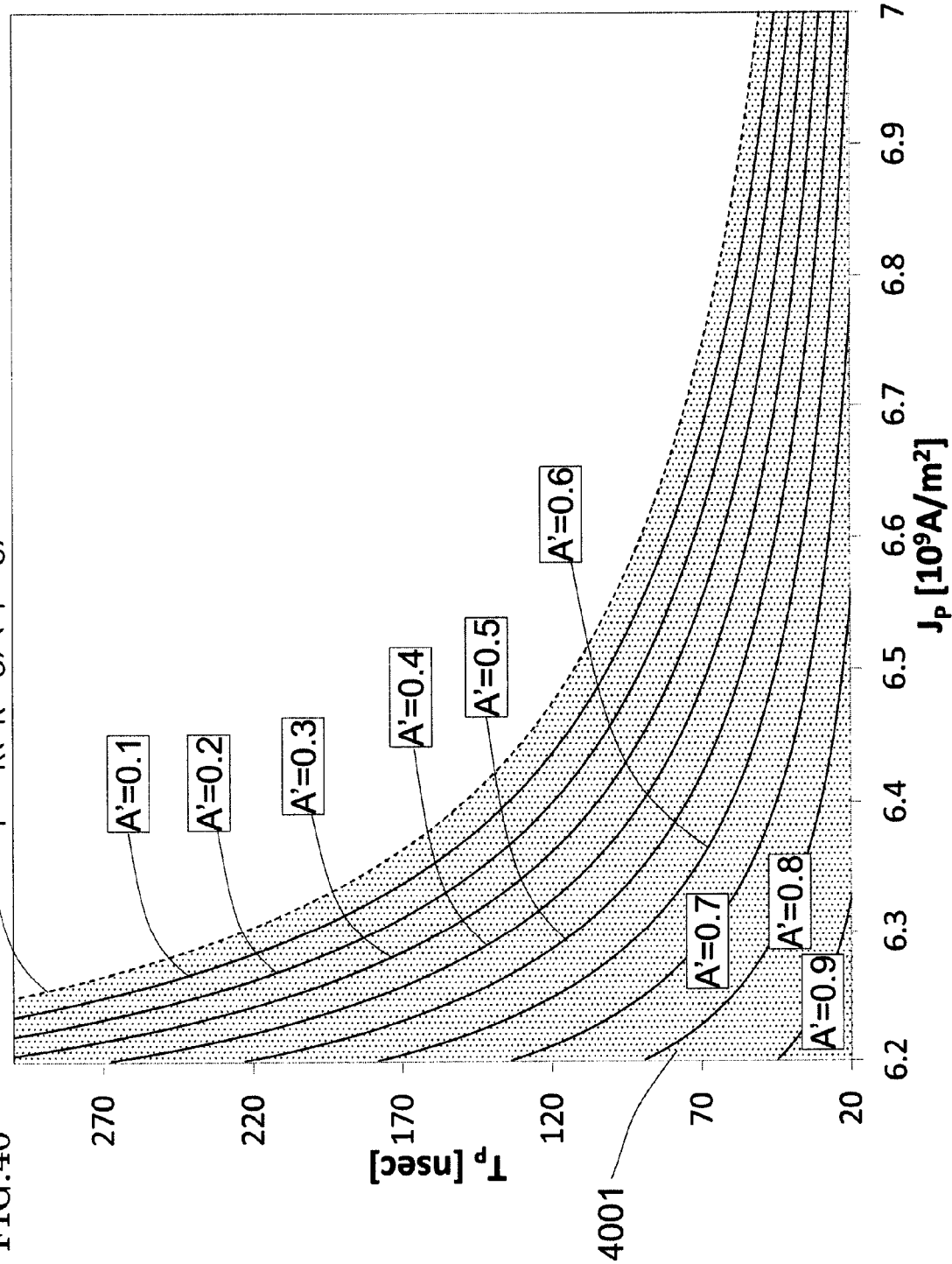
FIG. 40 is a graph representing the equation (16) with respect to the rise time of the oscillation in the magnetoresistive effect element according to Simulation Example 4.
Figure 41:
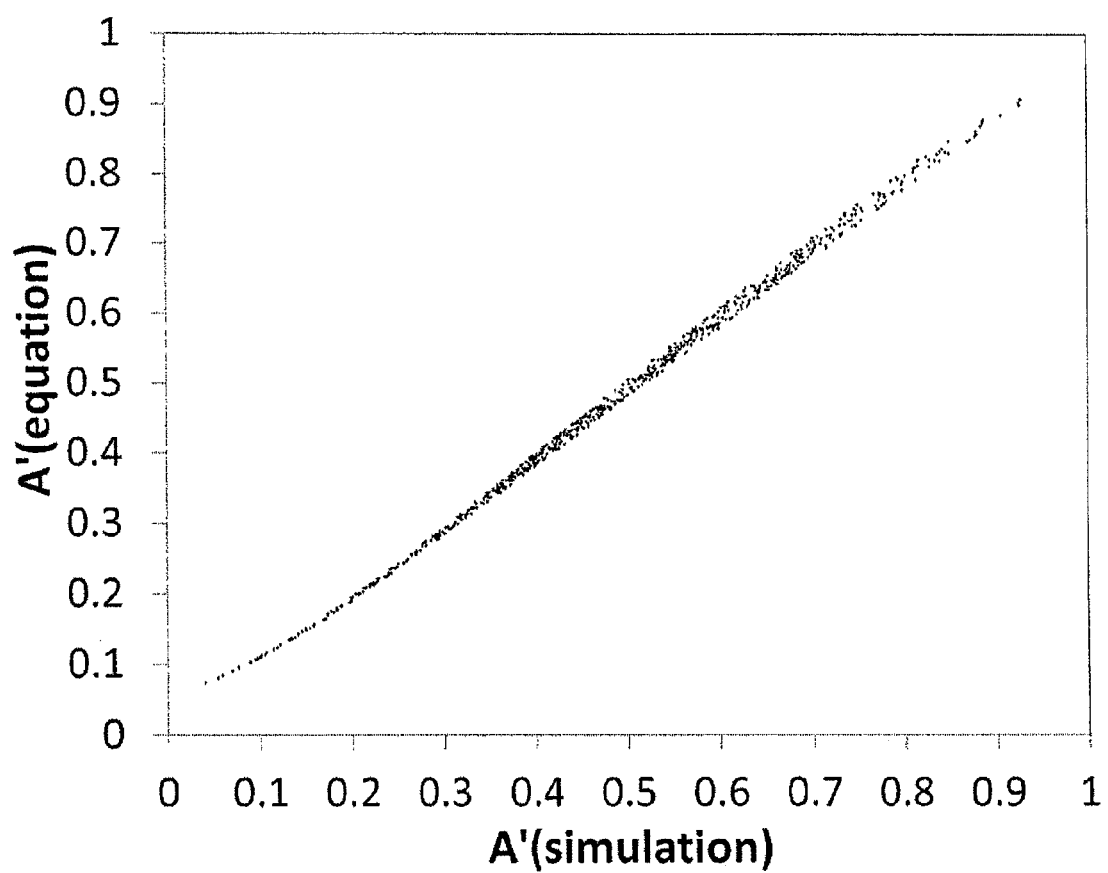
FIG. 41 is a graph depicting correlation between the simulation result and the equation (16) with respect to the rise time of the oscillation in the magnetoresistive effect element according to Simulation Example 4.

FIG. 40 is a graph representing the equation (16). FIGS. 39 and 40 are substantially identical in a region 4001 on the left side of a dotted line $T_P=T_R(J_R-J_O)/(J_P-J_O)$ where the formula (2) is satisfied. FIG. 41 is a graph depicting correlation between A' determined with the simulation and A' determined from the equation (16). As seen from FIG. 41, a correlation factor is substantially 1.

Figure 42:
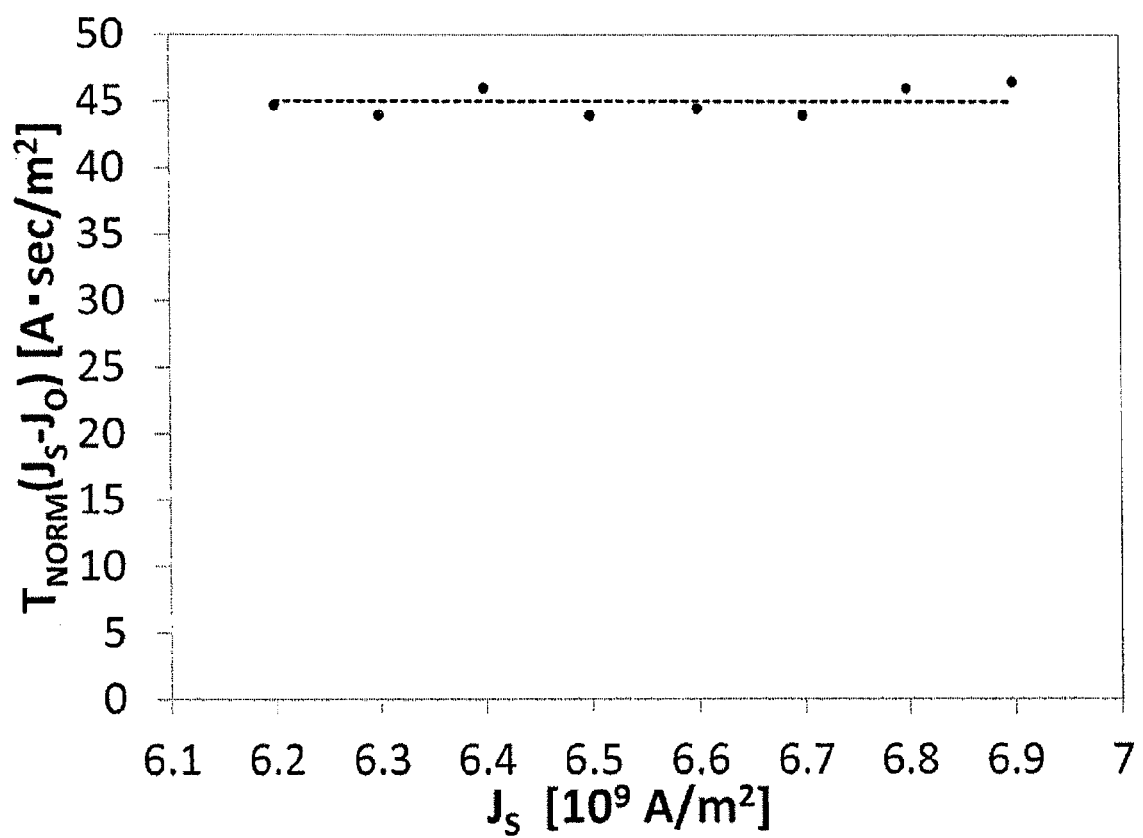
FIG. 42 is a graph depicting a quantity corresponding to energy with respect to the oscillation in the magnetoresistive effect element according to Simulation Example 4.

Furthermore, a simulation was performed on condition of omitting the first step and changing the current density $J_S$. FIG. 42 plots a quantity $T_{NORM}(J_S-J_O)$ corresponding to energy that is necessary to oscillate the magnetoresistive effect element 112 with the application of the current density $J_S$ to the magnetoresistive effect element 112. As a result of fitting to the graph of FIG. 42, it was found that the equation (17) is held in Simulation Example 4 as well. A dotted line in FIG. 42 represents $T_R(J_R-J_O)$.

Figure 43:
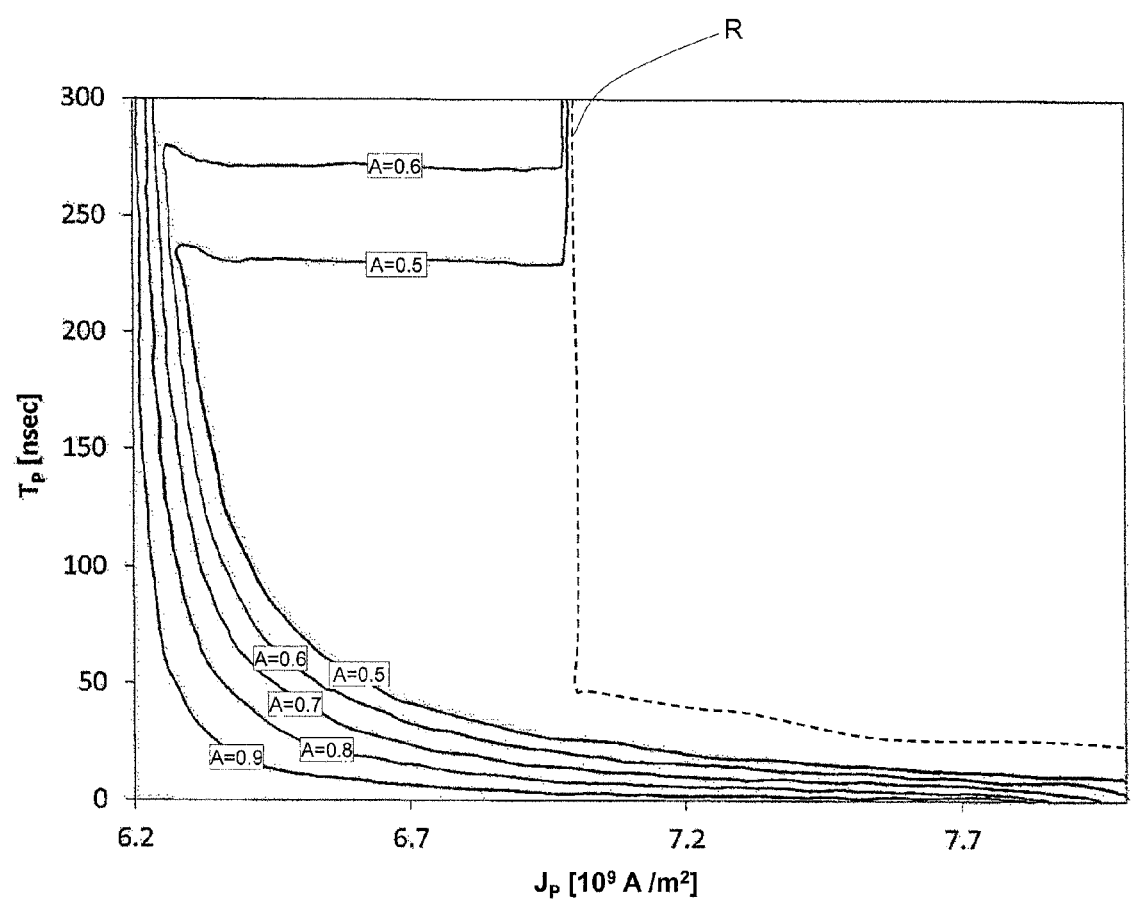
FIG. 43 is a graph depicting a simulation result with respect to the rise time of the oscillation in the magnetoresistive effect element according to Simulation Example 4.
Figure 44:
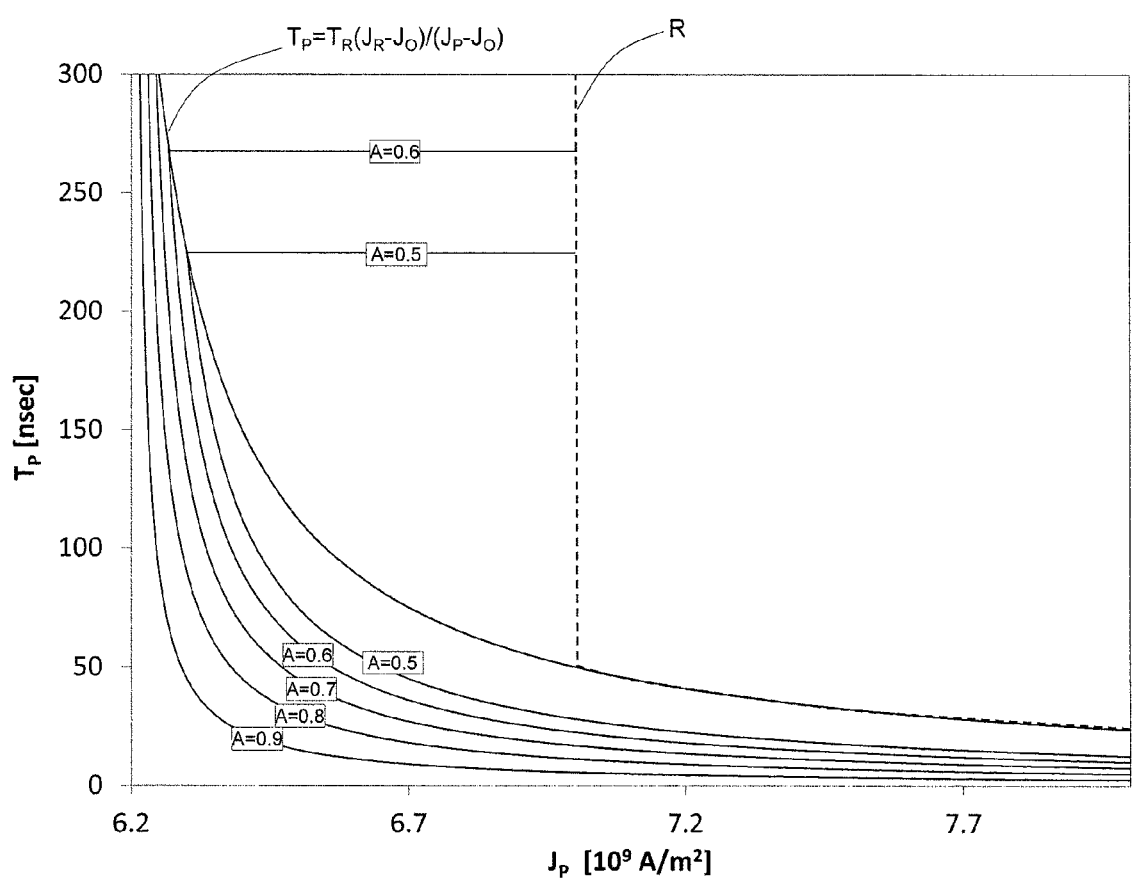
FIG. 44 is a graph representing the equations (20) and (21) with respect to the rise time of the oscillation in the magnetoresistive effect element according to Simulation Example 4.
Figure 45:
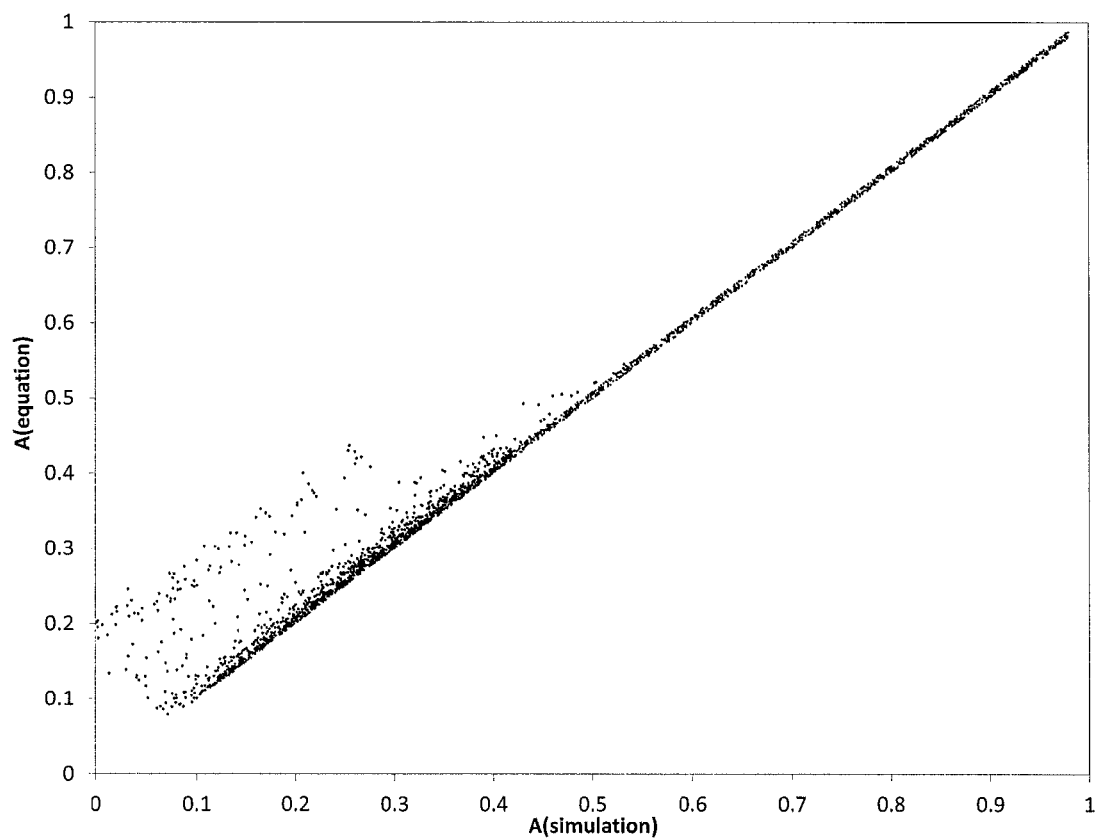
FIG. 45 is a graph depicting correlation between the simulation result and the equations (20) and (21) with respect to the rise time of the oscillation in the magnetoresistive effect element according to Simulation Example 4.

A simulation was further performed on the ratio A while the conditions of the pulse current ($J_P$, $T_P$) applied to the magnetoresistive effect element 112 were changed. FIG. 43 depicts a graph plotting a relation between $J_P$ and $T_P$, at which A is kept constant, for each of five different values of A (A=0.5 to 0.9). A region on the right side of a dotted line R is a region where the magnetoresistive effect element 112 causes the magnetization reversal with the pulse current. FIG. 44 is a graph representing the equations (20) and (21). Comparing FIGS. 43 and 44, both the graphs are substantially identical. FIG. 45 is a graph depicting correlation between A determined with the simulation and A determined from the equations (20) and (21). As seen from FIG. 45, a correlation factor is substantially 1.

Figure 46:
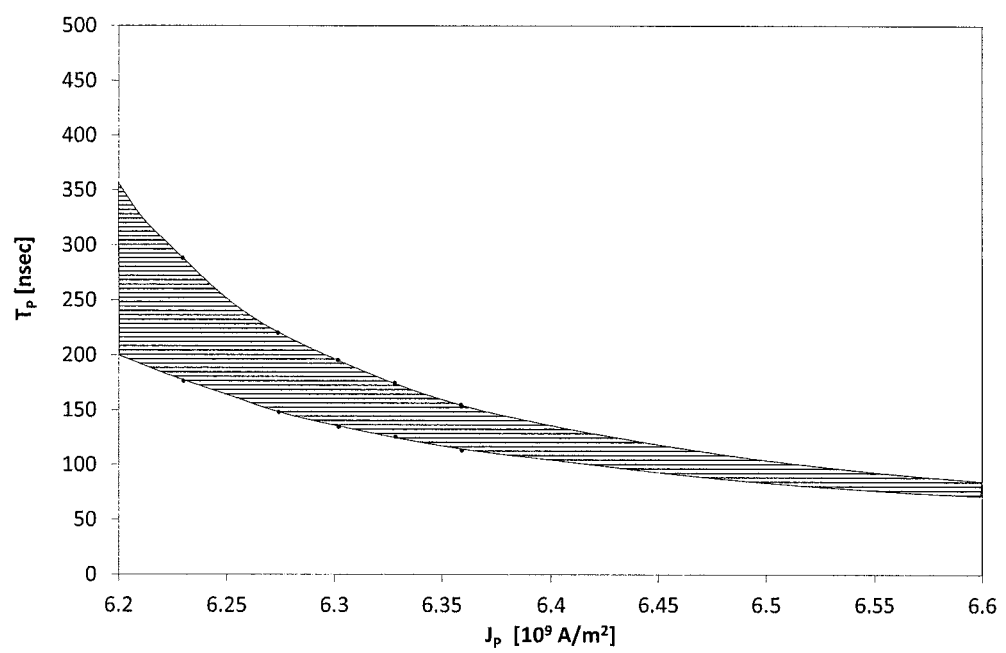
FIG. 46 is a graph depicting a range of a pulse current applied to the magnetoresistive effect element according to Simulation Example 4, the range being expressed by the formula (8).

In addition, as a result of studying in detail a region in FIG. 43 between a curve obtained by putting A=0.5 in the equation (20) and the region where the magnetoresistive effect element 112 causes the magnetization reversal, it was found that there exists, in Simulation Example 4 as well, a region where the shortening rate of the rise time of the oscillation is larger than a value estimated from the equation (20). A plurality of points plotted on the upper side of a linear line given by A (equation)=A (simulation) in FIG. 45 correspond to the above-mentioned region. As a result of determining a $T_P$ range where the ratio A is significantly reduced, and making fitting to the resulted range, it was found as in Simulation Example 1 that, also in Simulation Example 4, a conditional formula for $T_P$ at which the ratio A is significantly reduced is expressed by the formula (8). FIG. 46 is a graph representing the ranges of $T_P$ and $J_P$ given by the formula (8) together with plotting of the simulation results for upper and lower limits of the $T_P$ range where the ratio A is significantly reduced.

EXAMPLES

The magnetoresistive effect element 112 illustrated in FIG. 2 was fabricated as follows. First, the following films were successively formed on a Si substrate by sputtering.

Electrode 110: Cu [100 nm]
Underlying layer (not illustrated): Ta [5 nm]/Ru [2 nm]
Antiferromagnetic layer (not illustrated)] IrMn [10 nm]
First magnetic layer 101: FeCo [3 nm]
Spacer layer 103: Cu [3 nm]
Second magnetic layer 102: $Ni_{80}Fe_{20}$ [2.5 nm]
Cap layer (not illustrated): Ta [5 nm]
Electrode 111: Cu [100 nm]

The substrate after forming the above-mentioned films was subjected to heat treatment at 300 degrees for 2 hours in a state under application of a magnetic field of 10 KOe, thus making the magnetization direction of the first magnetic layer 101 fixed. The substrate was then maicrofabricated into an element having an elliptic shape with a major axis of 140×a minor axis of 70 $nm^2$ by photolithography.

Thereafter, the current source 113, controlled by the control unit 115, was connected to the electrodes 110 and 111 of the fabricated magnetoresistive effect element 112.

The critical current density $J_O$ for oscillation was measured as follows for the magnetoresistive effect oscillator 100 fabricated as described above. An oscillation output $P_{out}$ of the magnetoresistive effect element 112 was measured with a spectrum analyzer while the current density applied to the magnetoresistive effect element 112 was changed by controlling the current source 113. The measured result was plotted on a graph with the horizontal axis denoting the current density applied to the magnetoresistive effect element 112 and the vertical axis denoting $1/P_{out}$, i.e., the reciprocal of the oscillation output measured at that time. As a result of estimating the current density, at which $1/P_{out}$ was 0, through extrapolation, the critical current density $J_O$ for oscillation was $9.8×10^{10}$ $A/m^2$.

The critical current density $J_R$ for magnetization reversal was determined as follows. First, a resistance value of the magnetoresistive effect element 112 in a state where no current was applied to the magnetoresistive effect element 112 was measured. The measured result was 10.5 S. Then, from the state where no current was applied to the magnetoresistive effect element 112, a current having the current density J1 was continuously applied to the magnetoresistive effect element 112 for 1 msec by controlling the current source 113. Thereafter, the current applied to the magnetoresistive effect element 112 was stopped, and a resistance value of the magnetoresistive effect element 112 after the stop of the current was measured. At the current density $J1=1.24×10^{11}$ $[A/m^2]$, the resistance value of the magnetoresistive effect element 112 was not greatly changed from 10.5 S. At the current density $J1=1.25×10^{11}$ $[A/m^2]$, however, the resistance value of the magnetoresistive effect element 112 was greatly changed to 9.3Ω, and the magnetoresistive effect element 112 caused the magnetization reversal. Accordingly, the critical current density $J_R$ for magnetization reversal was $1.25×10^{11}$ $A/m^2$.

The magnetization reversal time $T_R$ was measured as follows. A current having the critical current density $J_R$ for magnetization reversal was applied to the magnetoresistive effect element 112 for a time $T_1$ by controlling the current source 113. Thereafter, the application of the current was stopped, and a resistance value of the magnetoresistive effect element 112 after 1 msec from the stop of the current was measured. At $T_1=20$ [nsec], the resistance value was 10.5Ω.

On the other hand, tt $T_1$=21 [nsec], the resistance value was 9.3Ω, and the magnetoresistive effect element 112 caused the magnetization reversal. Accordingly, the magnetization reversal time $T_R$ was 21 nsec.

In the first step, a current having the constant first current density (=$J_P$) was applied to the magnetoresistive effect element 112 for a time $T_P$ by controlling the current source 113. Thereafter, a current flowing in the positive direction and having the current density $J_S$=1.00×10$^{11}$ [A/m$^2$] was applied in the second step.

The rise time $T_{NORM}$ of the oscillation in the magnetoresistive effect element 112 when only the second step was executed with omission of the first step was measured. As a result of applying a current flowing in the positive direction and having the current density of 1.00×10$^{11}$ A/m$^2$ to the magnetoresistive effect element 112 and measuring the rise time of the oscillation with an oscilloscope, $T_{NORM}$ was 285 nsec.

The rise time of the oscillation in the magnetoresistive effect element 112 was actually measured under several conditions of the first current density and the time $T_P$. Table 6 lists the first current density and the time $T_P$ at and during which the current was applied to the magnetoresistive effect element 112, the experimental results of the rise time of the oscillation in the magnetoresistive effect element 112 and the ratio A for each of the conditions, and the ratio A calculated from the equations (20) and (21). In EXAMPLES 1 to 6, the measured results of the ratio A are well matched with the values of A calculated from the equations (20) and (21).

TABLE 6

|  | First Current Density [A/m$^2$] | Time $T_p$ [nsec] | Rise Time [nsec] | Ratio A (measured value) | Ratio A (calculated value) |
|---|---|---|---|---|---|
| EXAMPLE 1 | 1.50 × 10$^{11}$ | 2.0 | 223.6 | 0.785 | 0.824 |
| EXAMPLE 2 | 2.00 × 10$^{11}$ | 2.0 | 177.1 | 0.621 | 0.647 |
| EXAMPLE 3 | 2.00 × 10$^{11}$ | 3.0 | 128.4 | 0.451 | 0.471 |
| EXAMPLE 4 | 2.50 × 10$^{11}$ | 3.0 | 54.2 | 0.190 | 0.206 |
| EXAMPLE 5 | 1.10 × 10$^{11}$ | 20.0 | 176.4 | 0.619 | 0.647 |
| EXAMPLE 6 | 1.10 × 10$^{11}$ | 60.0 | 60.2 | 0.211 | 0.212 |
| EXAMPLE 7 | 1.50 × 10$^{11}$ | 10.2 | 10.4 | 0.036 | 0.101 |

In EXAMPLE 7, the measured result of the ratio A is smaller than the value of the ratio A calculated from the equation (20). In EXAMPLE 7, the lower limit value of the formula (8) is 10.1 nsec, and the upper limit value of the formula (8) is 10.7 nsec. The time $T_P$ in EXAMPLE 7 is 10.2 nsec, and it satisfies the formula (8). It is thus understood that the rise time of the oscillation in the magnetoresistive effect element 112 can be significantly shortened by applying the pulse current ($J_P$, $T_P$), which satisfies the formula (8), to the magnetoresistive effect element 112.

As described above, since the magnetoresistive effect oscillator according to the present invention enables oscillation to rise in the magnetoresistive effect element at a higher speed, the magnetoresistive effect oscillator can be utilized in high-speed wireless communications and Microwave Assisted Magnetic Recording, for example.

What is claimed is:

1. A magnetoresistive effect oscillator comprising:
    a magnetoresistive effect element including a first magnetic layer, a second magnetic layer, and a spacer layer sandwiched between the first magnetic layer and the second magnetic layer; and
    a current applying unit that applies a current to the magnetoresistive effect element,
    wherein the current applying unit executes a first step of applying a current, which has a first current density larger than a critical current density $J_O$ for oscillation of the magnetoresistive effect element, to the magnetoresistive effect element for a time $T_P$,
    the current applying unit executes, after the first step, a second step of applying a current, which has a second current density $J_S$ smaller than the first current density and not smaller than the critical current density $J_O$ for oscillation, to the magnetoresistive effect element such that the magnetoresistive effect element oscillates at a predetermined frequency, and
    the following formulae (1), (2) and (3), or the following formulae (1) and (4) are satisfied on an assumption that an average value of the first current density during the time $T_P$ in the first step is $J_P$, a critical current density for magnetization reversal of the magnetoresistive effect element is $J_R$, and a magnetization reversal time of the magnetoresistive effect element is $T_R$:

$$\frac{0.1 \times T_R (J_R - J_O)}{J_P - J_S} < T_P < 0.9 \times T_R \frac{J_R - J_O}{J_S - J_O} \quad (1)$$

$$T_P < \frac{T_R (J_R - J_O)}{J_P - J_O} \quad (2)$$

$$J_R \leq J_P \quad (3)$$

$$J_P < J_R. \quad (4)$$

2. The magnetoresistive effect oscillator according to claim 1, wherein the following formula (5) is satisfied:

$$\frac{0.25 \times T_R (J_R - J_O)}{J_P - J_S} < T_P < 0.75 \times T_R \frac{J_R - J_O}{J_S - J_O}. \quad (5)$$

3. The magnetoresistive effect oscillator according to claim 2, wherein the following formula (6) is satisfied:

$$\frac{0.5 \times T_R (J_R - J_O)}{J_P - J_S} < T_P < 0.5 \times T_R \frac{J_R - J_O}{J_S - J_O}. \quad (6)$$

4. The magnetoresistive effect oscillator according to claim 3, wherein the following formula (7) is satisfied:

$$\frac{0.75 \times T_R(J_R - J_O)}{J_P - J_S} < T_P < 0.25 \times T_R \frac{J_R - J_O}{J_S - J_O}. \quad (7)$$

5. The magnetoresistive effect oscillator according to claim 1, wherein the following formula (8) is satisfied:

$$\frac{0.96 \times T_R(J_R - J_O)}{(J_P - 0.96 J_S)} \leq T_P \leq \frac{0.98 \times T_R(J_R - J_O)}{(J_P - 0.98 J_S)}. \quad (8)$$

\* \* \* \* \*